United States Patent [19]

Kawashima

[11] Patent Number: 5,684,320

[45] Date of Patent: Nov. 4, 1997

[54] SEMICONDUCTOR DEVICE HAVING TRANSISTOR PAIR

[75] Inventor: Shoichiro Kawashima, Kawasaki, Japan

[73] Assignee: Fujitsu Limited, Kawasaki, Japan

[21] Appl. No.: 497,843

[22] Filed: Jul. 3, 1995

Related U.S. Application Data

[63] Continuation of Ser. No. 73,439, Jun. 8, 1993, abandoned, which is a continuation-in-part of Ser. No. 817,801, Jan. 9, 1992, Pat. No. 5,541,431.

[30] Foreign Application Priority Data

| | | | |
|---|---|---|---|
| Jan. 9, 1991 | [JP] | Japan | 3-000987 |
| Jan. 9, 1991 | [JP] | Japan | 3-000988 |
| Jun. 8, 1992 | [JP] | Japan | 4-147483 |
| Mar. 18, 1993 | [JP] | Japan | 5-058909 |

[51] Int. Cl.$^6$ .......... H01L 27/01; H01L 27/12; H01L 31/0392; H01L 29/76
[52] U.S. Cl. .......... 257/351; 257/369; 257/57
[58] Field of Search .......... 257/66, 351, 369, 257/57, 288, 364

[56] References Cited

U.S. PATENT DOCUMENTS

| | | | |
|---|---|---|---|
| 3,479,571 | 11/1969 | Haneta | 257/67 |
| 4,272,880 | 6/1981 | Pashley | 257/369 |
| 4,481,524 | 11/1984 | Tsujide | 257/903 |
| 4,698,659 | 10/1987 | Mizutani | 257/369 |
| 4,745,079 | 5/1988 | Pfiester | 257/288 |
| 4,768,076 | 8/1988 | Aoki et al. | 257/369 |
| 5,095,347 | 3/1992 | Kirsch | 257/57 |

FOREIGN PATENT DOCUMENTS

| | | | |
|---|---|---|---|
| 4-68565 | 3/1992 | Japan | 257/369 |
| 4-71267 | 3/1992 | Japan . | |
| 9107780 | 5/1991 | WIPO | 257/369 |

OTHER PUBLICATIONS

Garnache, R.R., "Complementary FET Memory Cell" IBM Tech Disc. Bull. vol. 18 No. 12 May 1976, pp. 3947–48.

*Primary Examiner*—Stephen Meier
*Attorney, Agent, or Firm*—Staas & Halsey

[57] ABSTRACT

A semiconductor device has a plurality of transistor pairs. Each transistor pair includes a p-channel current path having a pair of p-type current terminal regions arranged by sandwiching a high resistivity first channel region and an n-channel current path having a pair of n-type current terminal regions arranged by sandwiching a high resistivity second channel region. The first channel region and the second channel region exert electric fields on each other by their intrinsic charges and are adjacently arranged so as to serve as a gate. A semiconductor memory device includes a memory element formed by first and second thin film semiconductor layers each including a semiconductor region of the first conductivity type and a semiconductor region of the second conductivity type sandwiching a channel region. A backgate is disposed in a faced relation to the channel region of one of the first and second thin film semiconductor layers which are laminated one atop the other. Alternatively, the memory element is formed by a lamination of four such thin film semiconductor layers and includes a gate for writing disposed opposite the channel region of one of the thin film semiconductor layers which forms one end of the lamination, and an element for reading disposed opposite the channel region of one of the thin film semiconductor layers which forms the other end of the lamination.

10 Claims, 29 Drawing Sheets

BL 341(361)

ONE CELL 202A
206
202B
ONE CELL 202A
202B
ONE CELL
366

SEMICONDUCTOR DEVICE HAVING TRANSISTOR PAIR

CROSS REFERENCE TO RELATED APPLICATION

This application is a continuation of application Ser. No. 08/073,439, filed Jun. 8, 1993, abandoned, which is a continuation-in-part of application Ser. No. 07/817,801 filed on Jan. 9, 1992 now U.S. Pat. No. 5,541,431.

BACKGROUND OF THE INVENTION

1. Field of the Invention

The present invention relates to a new type of a semiconductor device, more particularly, to a semiconductor device having at least one transistor pair which, based upon a new operational principle, has a simplified constitution suitable for higher integration.

The present invention further relates to a semiconductor memory device, more particularly, to a semiconductor memory device which is comprised of a memory element formed by thin film semiconductor layers and in which a dc current is not initiated at device turn-off.

Hereinafter, the term "polycrystal" includes "amorphous".

2. Description of the Related Art

In general, a bipolar transistor and a field effect transistor (FET) are mainly used as transistors in the prior art. In a highly integrated semiconductor device, an insulation gate type FET particularly is widely used.

Conventional technologies will be described with reference to FIGS. 1(A), 1(B) and 1(C).

FIG. 1(A) is a schematic view showing a structure of an insulation gate type FET in conventional technologies. In FIG. 1(A) a pair of n-type domains 62, 63 are formed on the surface of a p-type substrate 61, with a sandwiched channel region 64, to create a source/drain region. A gate electrode 67 is formed on the substrate 61 through an insulation film 66. Based on a voltage applied on the gate electrode 67, a channel region 64 is controlled to adjust a current path between source/drain regions 62 and 63.

FIG. 1(B) is a schematic view showing the operation of an FET shown in FIG. 1(A). A source region 62 is grounded and a positive potential is applied to a drain region 63. As the case may be, since a pn junction around the drain region 63 is adversely biased a depletion layer 65 is formed around the drain region 63.

When a positive potential is applied on the gate electrode 67, a hole in the channel region 64 is excluded by the positive potential to attract electrons. Thus, an n-channel is formed in the channel region 64. If the n-channel makes a source region 62 and a drain region 63 connect therewith, current flows between the source and the drain.

The n-channel FET is disclosed in FIG. 1(A) and FIG. 1(B) and when the conductivity type in each region is inverted, a p-channel FET is obtained. In the case of a p-channel FET, the polarity of applied voltage is inverted.

A flip-flop is constituted by means of cruciform wiring of four transistors. A memory element of an SRAM has a form such that transfer gates are connected to an interconnecting point of a flip-flop.

Fundamentally, four transistors are employed in the flip-flop and six transistors are employed in the static RAM (SRAM). From the stand point of high integration, it is required that these logic elements can be formed in as narrow an area as possible.

FIG. 1(C) illustrates an example of an SRAM configuration for which a high integration is intended. A transistor T11 and a transistor T12 are series-connected at a connection node N1, and a transistor T13 and a transistor T14 are series-connected at a connection node N2. These connection modes N1 and N2 are led outward via transfer gates T15 and T16, respectively. The node N1 is connected to each gate of a transistor T13 and a transistor T14, while the node N2 is connected to each gate of a transistor T11 and a transistor T12.

With respect to the structure of the device, transistors T11 and T13 are produced by a thin film transistor using polycrystalline silicon, in order to enhance integration.

That is, transistors T12, T14 and transistors T15, T16 are formed in a semiconductor substrate and load transistors T11 and T13 are formed in a polycrystalline silicon thin film formed on the semiconductor substrate. An adoption of such solid structure enables an enhancement of integration.

According to the prior art, it is necessary for one FET to be provided with three electrode regions, that is, a source, a drain and a gate. Accordingly, it is necessary to provide 3n electrode regions to produce n transistors.

SUMMARY OF THE INVENTION

An object of the present invention is to provide a semiconductor device having a simplified structure.

Another object of the present invention is to provide a semiconductor device having a simplified transistor pair structure in which one region can be utilized to fulfil a double function or more than two functions.

In accordance with a feature of the present invention, there is provided a semiconductor device having a plurality of transistor pairs, said transistor pairs comprising:

- a p-channel current path having a pair of p-type current terminal regions arranged by sandwiching a high resistivity first channel region;
- an n-channel current path having a pair of n-type current terminal regions arranged by sandwiching a high resistivity second channel region; where the first channel region and the second channel region each exert an electric field on the other by their intrinsic charges and are adjacently arranged so as to serve as a gate.

In accordance with another feature of the present invention, there is provided a semiconductor device comprising:

- a first current path formed at a first potential level, for providing a pair of current terminal regions arranged by sandwiching a first channel region;
- a second current path formed at the first potential level, for providing a pair of current terminal regions arranged by sandwiching a second channel region;
- a third current path formed at a second potential level close to the first level, for providing a pair of current terminal regions arranged by sandwiching a third channel region; and
- a fourth current path formed at the second potential level for providing a pair of current terminal regions arranged by sandwiching a fourth channel region; wherein both the first channel region and third channel region and both the second channel region and fourth channel region exert an electric field on the other by intrinsic charge and are adjacently arranged to serve as a gate.

In accordance with still another feature of the present invention, there is provided a semiconductor device comprising:

a first current path arranged at a first potential level, for providing a first channel region formed by a high resistivity semiconductor and first pair of low resistivity of current terminal regions arranged on both sides of the first channel region;

a second current path arranged at a second potential level adjacent to the first level, for providing a second channel region formed by a high resistivity semiconductor and a second pair of low resistivity current terminal regions arranged on both sides of the second channel region; and a separation means for separating the first current path and the second current path electrically; wherein the first channel region and one of the second pair of current terminal regions are adjacently arranged and the second channel region and one of said first pair of current terminals are adjacently arranged, and said first current path and said second current path form a transistor pair that interact with each other via an electric field.

In a flip-flop (FF) circuit two pairs of transistor are used. A first semiconductor layer, an insulator layer and a second semiconductor layer are laminated on an insulator substrate to form transistors Tr1 and Tr2 in the first semiconductor layer and to form a third transistor Tr3 and a fourth transistor Tr4 in the second semiconductor layer.

Suppose that a first transistor Tr1 and a second transistor Tr2 are n-channel transistors, and a third transistor Tr3 and a fourth transistor Tr4 are p-channel transistors. The first transistor Tr1 and the third transistor Tr3 are arranged opposite each other and each channel region is arranged in the same vicinity. The second transistor Tr2 and the fourth transistor Tr4 are arranged opposite each other and in the same vicinity.

Thus, the first and third transistors Tr1 and Tr3 constitute a transistor pair and the second transistor Tr2 and the fourth transistor Tr4 also constitute a transistor pair.

One side electrode terminal region of the first transistor Tr1 is interconnected with one side electrode terminal region of the fourth transistor Tr4 and one side electrode terminal region of the second transistor Tr2 is interconnected with one side electrode terminal region of the third transistor Tr3.

A ground level Voltage $V_{ss}$ is applied to electrode terminals of the first transistor Tr1 and the second transistor Tr2 that are not interconnected therewith, while a positive dc rail voltage $V_{cc}$ is applied to electrode terminals of the third transistor Tr3 and the fourth transistors Tr4 not interconnected therewith. Thus, the first transistor Tr1 and the fourth transistor Tr4 form a series-connected transistor and the second transistor Tr2 and the third transistor Tr3 also form a series-connected transistor. Among these transistors, the first and the third transistors Tr1 and Tr3 exert influence on each other, and the second and the fourth transistors Tr2 and Tr4 also exert influence on each other.

Thus, one state is such that the first transistor Tr1 and the third transistor Tr3 turn ON and the second transistor Tr2 and the fourth transistor Tr4 turn OFF and the other state is such that Tr1 and Tr3 turn OFF and Tr2 and Tr4 turn ON, to form a flip-flop circuit by four transistors Tr1, Tr2, Tr3 and Tr4.

In the configuration of another form of a flip-flop circuit, an n-channel transistor Tr1 and a p-channel transistor are formed in a first polycrystalline semiconductor layer, while a p-channel transistor Tr3 and an n-channel transistor Tr4 are formed in a second polycrystalline semiconductor layer. A second form of flip-flop circuit is provided in which an n-channel transistor and a p-channel transistor are formed in one layer and transistors Tr3 and Tr4 of the upper layer and transistors Tr1 and Tr2 of the lower layer are matched therewith and arranged thereby.

In the case of this second configuration, transistors Tr1 and Tr2 of the lower layer are interconnected therewith and transistors Tr3 and Tr4 of the upper layer also are interconnected therewith. Such a connection can form the same circuit as mentioned above.

As shown above, two layers of a polycrystalline semiconductor layers formed on an insulating substrate and a transistor by means of a polycrystalline semiconductor is formed thereupon to constitute a flip-flop circuit. Nevertheless, a transistor can be formed not only on a semiconductor layer, but also in a semiconductor substrate.

Further, a transistor pair is constituted by a first transistor formed in a semiconductor substrate and a second transistor formed within a semiconductor layer formed on the first semiconductor.

Transistors Tr1 and Tr2 formed in the lower layer are formed in the surface layer of the semiconductor substrate. A polycrystalline semiconductor layer is formed on the surface of the semiconductor substrate via an insulator film to produce transistors Tr3 and Tr4.

In this way, each transistors are formed in the first level and the second levels, respectively, and each transistor is associated therewith mutually to make a transistor pair and then two transistor pairs are interconnected to constitute a flip-flop circuit. It is not necessary to form a gate electrode especially in these transistor structures, and a channel region of each transistor of a transistor pair functions as a gate of the other transistor of the transistor pair.

BRIEF DESCRIPTION OF DRAWINGS

FIG. 1(A) is a schematic view showing a structure of an insulation gate type FET;

FIG. 1(B) is a schematic view showing the operation of an FET shown in FIG. 1(A);

FIG. 1(C) illustrates an example of an SRAM configuration for which a high integration is intended;

FIGS. 3(A), 3(B), 3(C) and 3(D) are views explaining pairs of transistors of the first embodiment of the first aspect in accordance with the present invention, in which FIG. 3(A) is a view showing the configuration of a new type of transistor pair;

FIG. 3(B) is a view showing the configuration of a semiconductor device according to another embodiment of the present invention;

FIGS. 3(C) and 3(D) are plan views of the arrangement of a transistor pair;

FIGS. 5(A), 5(B), 5(C) and 5(D) are views showing the configuration of a static RAM according to a fourth embodiment of the first aspect of the present invention, in which FIG. 5(A) shows an equivalent circuit of an SRAM;

FIG. 5(B) is a plan view showing one pattern embodying a circuit shown in FIG. 5(A);

FIGS. 5(C) and 5(D) are plan views showing a pattern within a substrate and a pattern of a polycrystalline semiconductor film thereon, both of which are divided into from the pattern of FIG. 5(B);

FIGS. 8(A), 8(B) and 8(C) are views showing a first configuration of an SRAM of a third embodiment of the second aspect of the present invention, in which FIG. 8(A) is a view showing a first layer, FIG. 8(B) a second layer, and FIG. 8(C) a laminated layer of an SRAM, respectively;

DESCRIPTION OF THE PREFERRED EMBODIMENTS OF THE INVENTION

An embodiment of the present invention will be described with reference to the drawings.

Figure 1A:
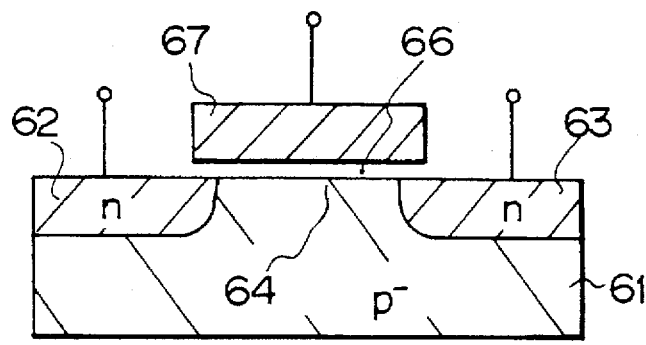
FIGS. 1(A) to 1(C) are related to conventional technologies.
Figure 1B:
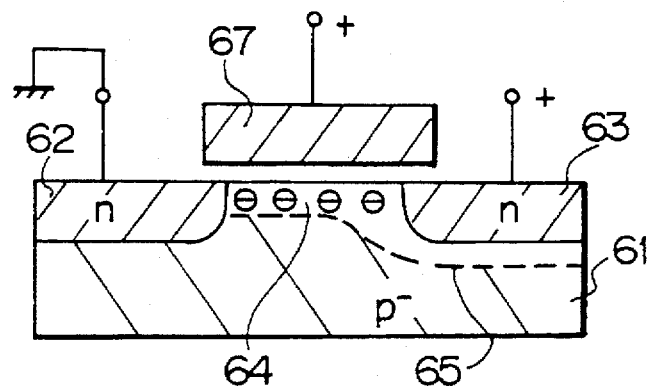
Figure 1C:
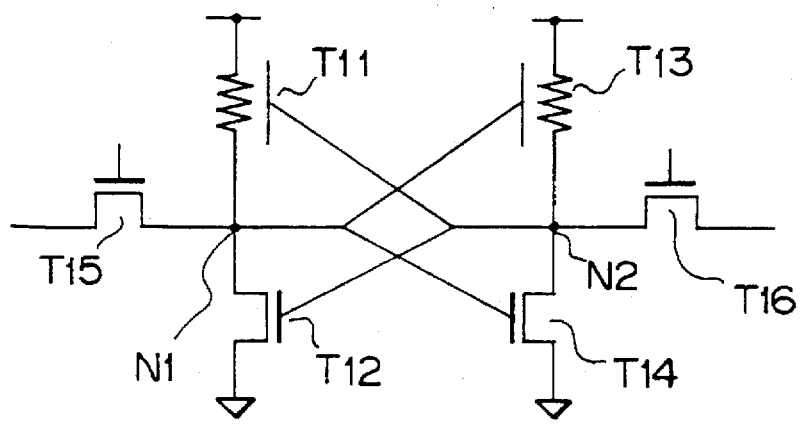
Figure 2A:
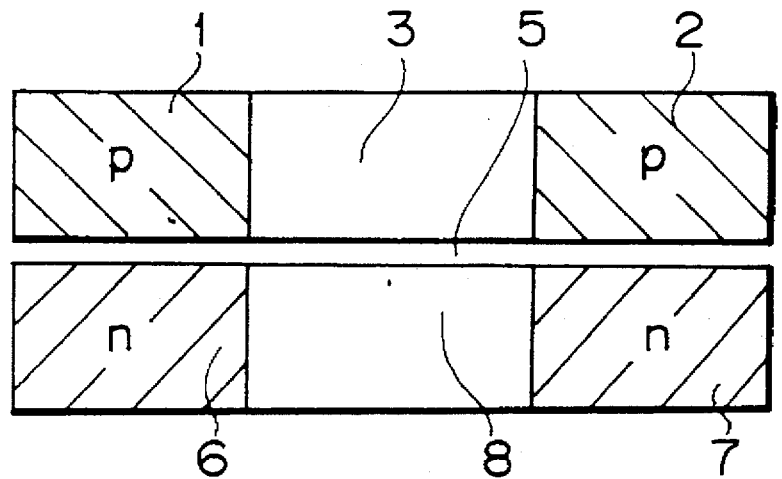
FIG. 2(A) is a schematic view explaining the outline of a structure of a semiconductor device in accordance with a first embodiment of a first aspect of the present invention.
Figure 2B:
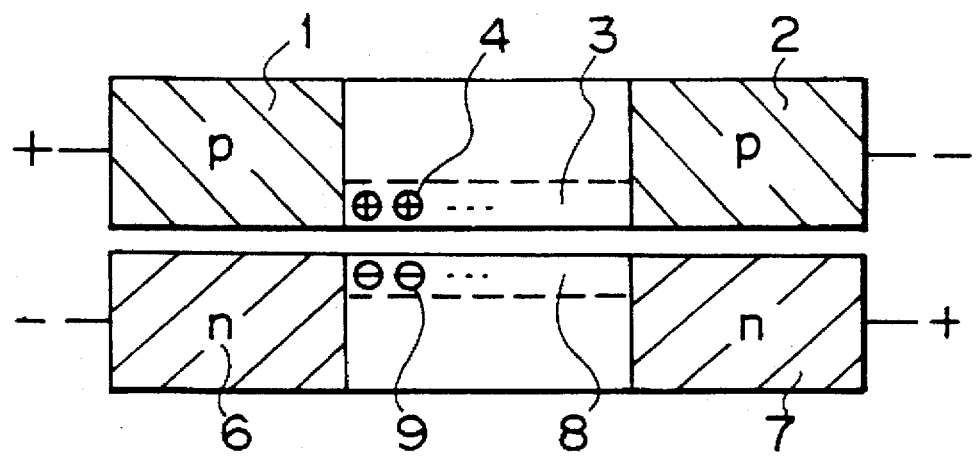
FIG. 2(B) is a schematic view showing an outline of the operation of a semiconductor device based on the structure shown in FIG. 2(A)

FIGS. 2(A) and 2(B) are views for explaining a principle of a first aspect of the present invention. FIG. 2(A) is a schematic view explaining the outline of a structure of a semiconductor device of a first embodiment of the first aspect in accordance with the present invention. P-type regions 1 and 2 sandwich a high resistivity of channel region 3 therebetween and are arranged opposite each other. Also, n-type regions 6 and 7 sandwich a high resistivity of channel region 8 and are arranged opposite each other. Both channel regions 3 and 8 are arranged adjacently opposite each other to easily apply an electric field to each other.

FIG. 2(B) is a schematic view showing an outline of the operation of a semiconductor device based on the structure shown in FIG. 2(A). A positive potential is applied to a p-type region 1 and a negative potential is applied to a p-type region 2. On the other hand, a negative potential is applied to an n-type region 6 and a positive potential is applied to another n-type region 7. Under the condition of such applied voltages, for example, the influence of a positive potential applied to the p-type region 1 extends to an adjacent channel region 3 and a closely disposed channel region 8. A negative charge 9 is induced in the closely disposed channel region 8 by these influences. A positive charge 4 is induced in the channel region 3 in the vicinity of the n-type region 6 applied by a negative voltage. These charges 4 and 9 induce charges of opposite polarity in the channel region closely disposed thereto.

As is the case with the above, a positive charge is induced in the channel region 3 to form a p-channel and a negative charge 9 is induced in the channel region 8 to form an n-channel.

Therefore, the channel regions 3 and 8 function as a channel region, respectively, and moreover, set up the operation of a gate electrode with respect to the other channels 8 and 3.

With such a transistor-pair structure, since each channel region functions as a gate of the other side, each transistor can operate without providing a gate electrode.

As a result, a flip-flop circuit, a static random access memory (abbreviated by SRAM) or the like can be designed by utilizing this pair of transistors.

First and second embodiments of the first aspect of the present invention will be described with reference to FIGS. 3(A) to (D) and a third embodiment of the first aspect thereof will be explained with reference to FIG. 4.

Figure 3A:
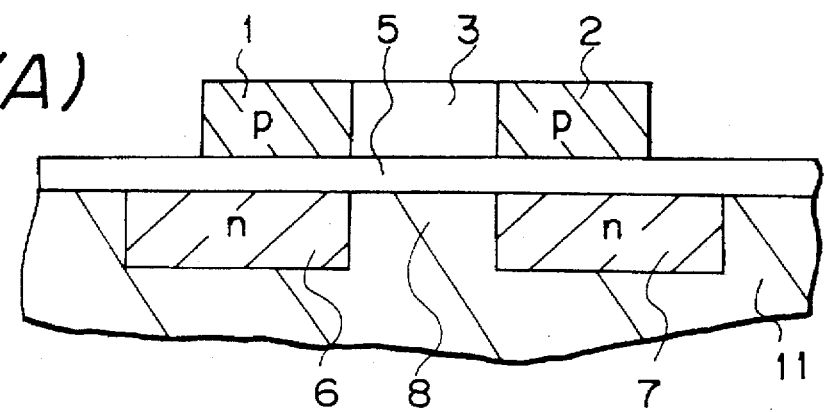

FIGS. 3(A) to 3(D) are views explaining pairs of transistors of the first and second embodiments of the first aspect in accordance with the present invention. In FIG. 3(A), a pair of n-type regions 6 and 7 are formed in a surface region of a p-type semiconductor substrate 11. A channel region 8 is sandwiched between a pair of n-type regions 6 and 7. A polycrystalline semiconductor layer is formed on the surface of the semiconductor substrate 11 via an insulator film 5. The polycrystalline semiconductor may be substituted for by an amorphous semiconductor. A pair of p-type regions 1 and 2 are formed in the polycrystalline semiconductor layer. A high resistivity channel region 3 is sandwiched and arranged between this pair of p-type regions 1 and 2. The channel region 3 is opposite the channel region 8 in the semiconductor substrate 11 and arranged therein. The thickness of an insulator film is so thin that, when a negative charge is induced on the surface of channel region 8 of the semiconductor substrate 11, a positive charge is induced in the opposite channel region 3 by the negative charge.

The semiconductor substrate 11 is formed, for example, by a single crystal silicon semiconductor substrate, an insulator film 5 is formed, for example, by oxide silicon, and a semiconductor layer thereon is formed by, e.g., polycrystalline silicon. The semiconductor substrate 11 also may be formed on the side (perpendicular to a wafer) of a trench structure or a groove structure.

Figure 3B:
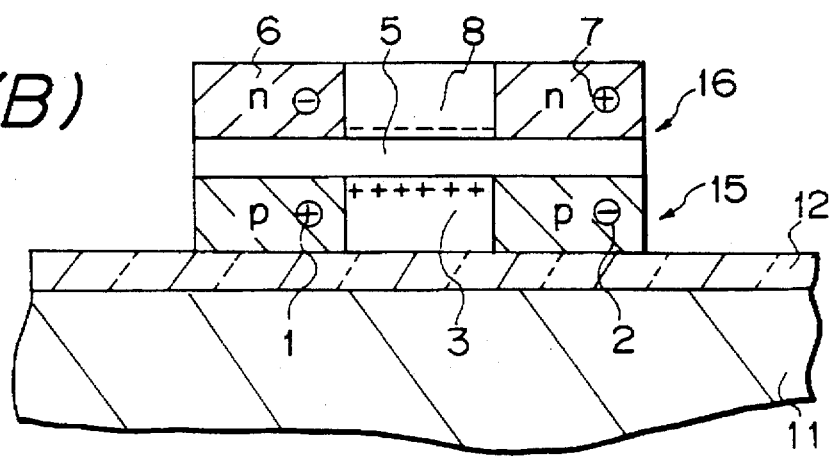

FIG. 3(B) illustrates a semiconductor device according to a second embodiment of the first aspect of the present invention. Two layers of polycrystalline silicon layer 15 and 16 are formed via an oxide film 12 on the semiconductor substrate 11. A pair of p-type regions 1 and 2 are formed by sandwiching a high resistivity channel region 3 within a lower layer of polycrystalline silicon layer 15. A pair of n-type regions 6 and 7 are formed, sandwiching a high resistivity channel region 8, within an upper layer of polycrystalline silicon layer 16. An insulator film 5 such as an oxide film is disposed between the lower layer of polycrystalline silicon layer 15 and the upper layer of polycrystalline silicon layer 16. The channel region 8 is arranged, matching with the lower layer of channel region 3.

For example, if a positive potential is applied to a p-type region 1, a negative charge is induced in the neighboring-disposed channel region 8. Similarly, if a negative potential is applied to an n-type region 6, a positive charge is induced on the surface of the channel region 3. These charges induce an opposed-polarity of charge to each other to form an n-channel in the channel region 8 and a p-channel in the channel region 3. Also, the polycrystalline silicon layers 15 and 16 and an oxide film therebetween may be formed in the direction perpendicular to a wafer.

In a semiconductor substrate or a semiconductor layer arranged in a superposed manner, a pair of current paths are formed and channel regions are arranged opposite and they exert opposing fields on each other, thereby a pair of transistors exert influence on one another.

In the structure of such pair of transistors a respective channel region of one transistor operates as the gate of another transistor.

In the above, the example that two transistors of a p-channel transistor and an n-channel transistor are superposed is described and more than three transistors may be laminated. For example, a three-level structure such as a combination of n-channel-p-channel-n-channel or p-channel-n-channel-p-channel or a multi-level transistor structure that inverts a conductive type alternately can be easily designed.

Figure 3C:
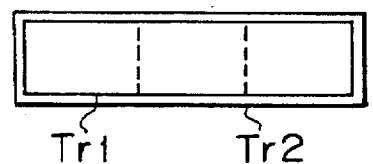
Figure 3D:
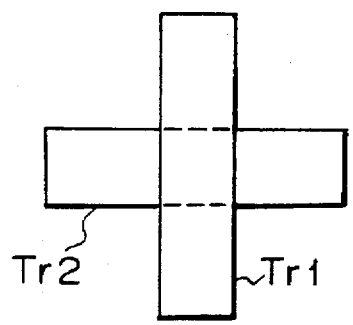

FIG. 3(C) and FIG. 3(D) illustrate plan views of the arrangement of a pair of transistors.

FIG. 3(C) is a plan view showing a constitution in which a transistor Tr1 and a transistor Tr2 are superposed as a whole. A respective source/drain region is superposed with a respective channel region.

FIG. 3(D) is a plan view showing a constitution in which a transistor Tr1 of the upper layer intersects with a transistor Tr2 of the lower layer to be arranged thereon. As is the case with such a constitution, the channel regions are superposed to exert influence on each other, thereby two transistors operate in connection therewith each other.

When one transistor of such transistor pair turns ON, the other transistor also turns ON. When one transistor of the transistor pair turns OFF, the other transistor also turns OFF.

Some examples of circuitry that is constituted by using such transistor pair are described hereinafter.

Figure 4A:
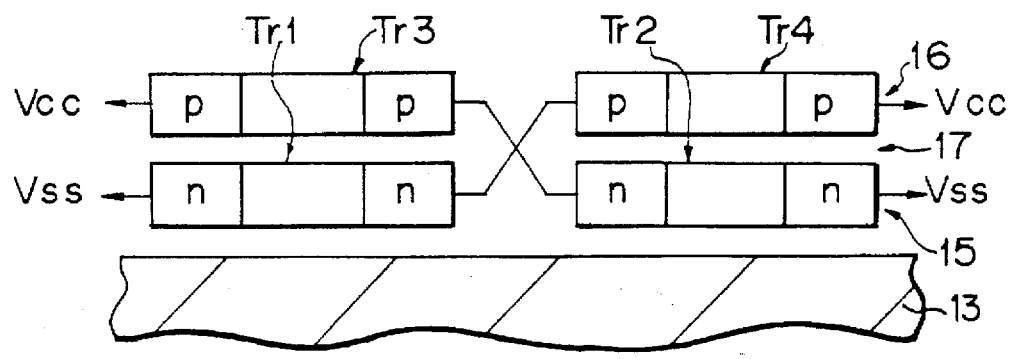
FIGS. 4(A), 4(B) and 4(C) are third embodiments of the first aspect of the present invention in that, two pairs of transistor pairs are used to constitute a flip-flop circuit.
Figure 4B:
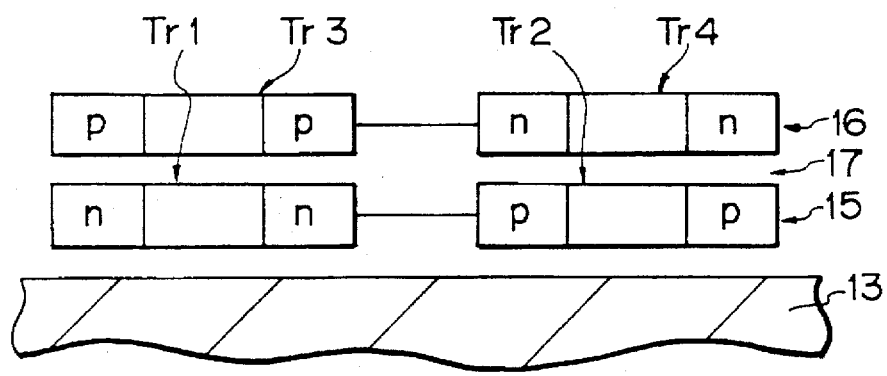
Figure 4C:
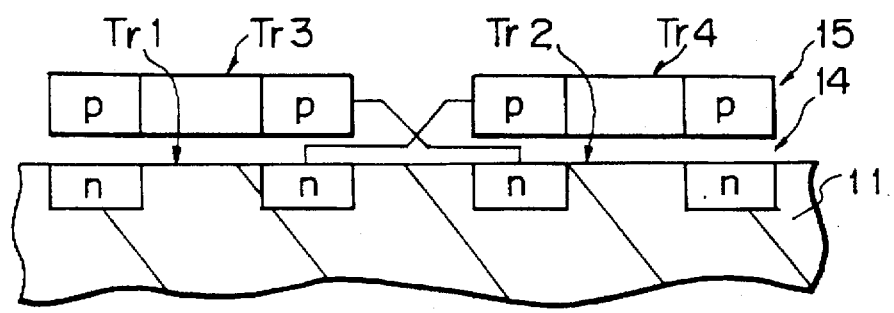

FIGS. 4(A) to 4(C) show a third embodiment of the first aspect of the present invention in that two pairs of the above-described transistor pairs are used to constitute a flip-flop (FF) circuit.

In FIG. 4(A), a first semiconductor layer 15, an insulator layer 17 and a second semiconductor layer 16 are laminated on an insulator substrate 13 to form transistors Tr1 and Tr2 in the first semiconductor layer 15 and to form a third transistor Tr3 and a fourth transistor Tr4 in the second semiconductor layer 16.

In FIG. 4(A), a first transistor Tr1 and a second transistor Tr2 are n-channel transistors, and a third transistor Tr3 and a fourth transistor Tr4 are p-channel transistors.

The first transistor Tr1 and the third transistor Tr3 are arranged opposite each other and each channel region is arranged in the same vicinity. The second transistor Tr2 and the fourth transistor Tr4 are arranged opposite each other and in the same vicinity.

Thus, the first and third transistors Tr1 and Tr3 constitute the above described transistor pair and the second transistor Tr2 and the fourth transistor Tr4 also constitute a transistor pair.

One side electrode terminal region of the first transistor Tr1 is interconnected with one side electrode terminal region of the fourth transistor Tr4 and one side electrode terminal region of the second transistor Tr2 is interconnected with one side electrode terminal region of the third transistor Tr3.

A voltage $V_{ss}$ (ground level voltage) is applied to electrode terminals of the first transistor Tr1 and the second transistor Tr2 that are not interconnected therewith, while a voltage $V_{cc}$ (the positive dc rail voltage) is applied to electrode terminals of the third transistor Tr3 and the fourth transistors Tr4 not interconnected therewith. Thus, the first transistor Tr1 and the fourth transistor Tr4 form series-connected transistors and the second transistor Tr2 and the third transistor Tr3 also form series-connected transistors. Among these transistors, the first and the third transistors Tr1 and Tr3 exert influence on each other and are operated or switched together, and the second and the fourth transistors Tr2 and Tr4 also exert influence on each other and are operated.

Thus there exist two states, viz., one state is such that the first transistor Tr1 and the third transistor Tr3 turn ON and the second transistor Tr2 and the fourth transistor Tr4 turn OFF and the other state is such that Tr1 and Tr3 turn OFF and Tr2 and Tr4 turn ON, to form a flip-flop circuit using four transistors Tr1, Tr2, Tr3 and Tr4.

FIG. 4(B) illustrates a configuration of another form of a flip-flop circuit of this embodiment. In this configuration, an n-channel transistor Tr1 and a p-channel transistor Tr2 are formed in a first polycrystalline semiconductor layer 15, while a p-channel transistor Tr3 and an n-channel transistor Tr4 are formed in a second polycrystalline semiconductor layer 16. As above, a specified form of flip-flop circuit is provided in which an n-channel transistor and a p-channel transistor are formed in one layer and transistors Tr3 and Tr4 of the upper layer and transistors Tr1 and Tr2 of the lower layer are matched therewith and arranged thereby.

In the case of this configuration, transistors Tr1 and Tr2 of the lower layer are interconnected therewith and transistors Tr3 and Tr4 of the upper layer also are interconnected therewith. Such a connection can form the same circuit as in FIG. 4(A).

As shown above in FIG. 4(A) and FIG. 4(B), two layers of a polycrystalline semiconductor layers formed on an insulating substrate 13 and a transistor by means of a polycrystalline semiconductor is formed thereupon to constitute a flip-flop circuit. Nevertheless, a transistor can be formed not only on a semiconductor layer, but also in a semiconductor substrate.

FIG. 4(C) is a view showing a transistor pair as described above constituted by a first transistor formed in a semiconductor substrate and a second transistor formed within a semiconductor layer formed on the first semiconductor and FIG. 4(C) illustrates a configuration which forms a flip-flop circuit on the whole.

In FIG. 4(C), transistors Tr1 and Tr2 formed in the lower layer 15 as shown in FIG. 4(A), are formed in the surface layer of semiconductor substrate 11. A polycrystalline semiconductor layer 15 is formed on the surface of the semiconductor substrate 11 on top of an insulator film 14 to produce transistors Tr3 and Tr4.

In this way, each transistor is formed in the first level and the second level, respectively, and each transistor is associated therewith mutually to make a transistor pair and then two transistor pairs are interconnected to constitute a flip-flop circuit. It is not necessary to form a gate electrode especially in these transistor structures, and a channel region of each transistor of a transistor pair functions as a gate of the other transistor of the transistor pair.

FIGS. 5(A) to 5(D) are views showing the configuration of a static RAM (abbreviated by SRAM) according to a fourth embodiment of the first aspect of the present invention.

Figure 5A:
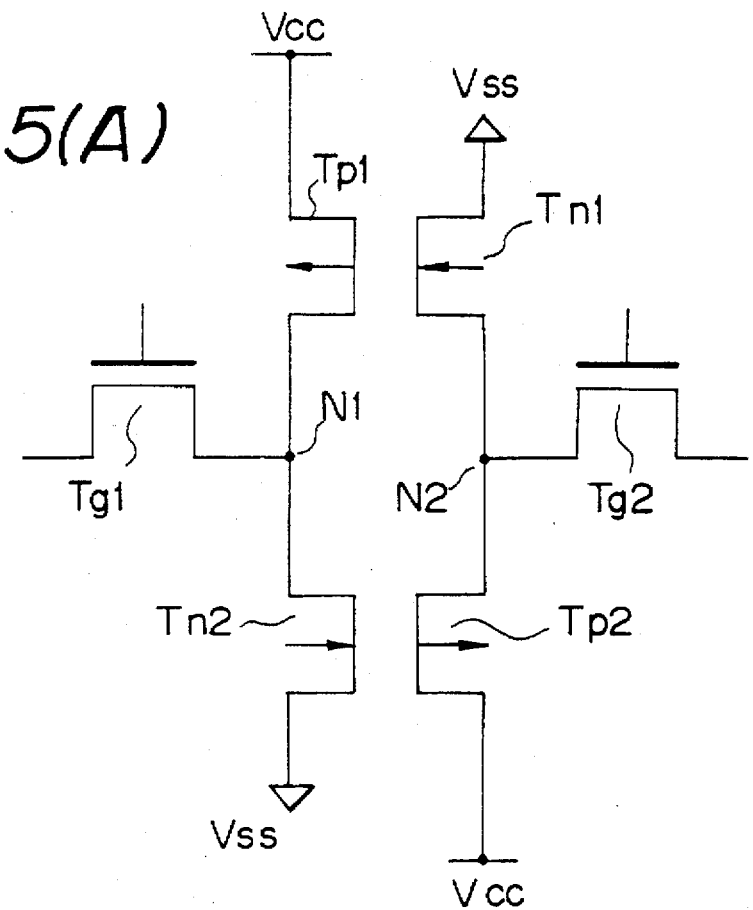

FIG. 5(A) shows an equivalent circuit of an SRAM. Transistors $T_{p1}$ and $T_{n2}$ are connected in series and these transistors are connected between a voltage $V_{cc}$ and a voltage $V_{ss}$. Also, transistors $T_{n1}$ and $T_{p2}$ are connected in series and the transistors are connected between a voltage $V_{ss}$ and a voltage $V_{cc}$.

Transistors $T_{g1}$ and $T_{g2}$, that are operated as transfer gates, are connected with connection nodes $N_1$ and $N_2$ of these transistors.

Four transistors $T_{p1}$, $T_{n2}$, $T_{n1}$, $T_{p2}$ function as a flip-flop circuit and two transfer gates $T_{g1}$ and $T_{g2}$ play a role in outputting/inputting a signal to nodes $N_1$ and $N_2$.

Figure 5B:
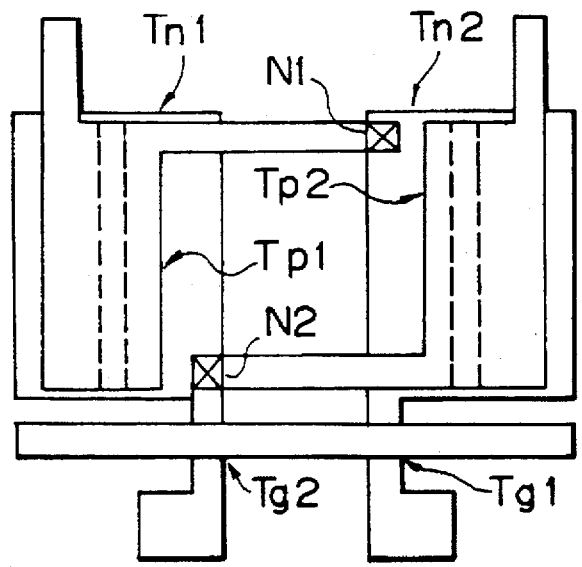

FIG. 5(B) is a plan view showing one pattern embodying a circuit shown in FIG. 5(A). Transistors $T_{n1}$, $T_{n2}$ and transfer gates $T_{g1}$, $T_{g2}$ are formed in a semiconductor substrate and in a polycrystalline silicon layer formed via an insulator film such as an oxide film thereupon, two p-channel transistors $T_{p1}$ and $T_{p2}$ are formed. The p-channel transistor $T_{p1}$ and an n-channel transistor $T_{n2}$ of the substrate are interconnected therewith at a location of a node $N_1$ and the p-channel transistor $T_{p2}$ and the n-channel transistor $T_{n1}$ are interconnected therewith at the location of a node $N_2$.

Figure 5C:
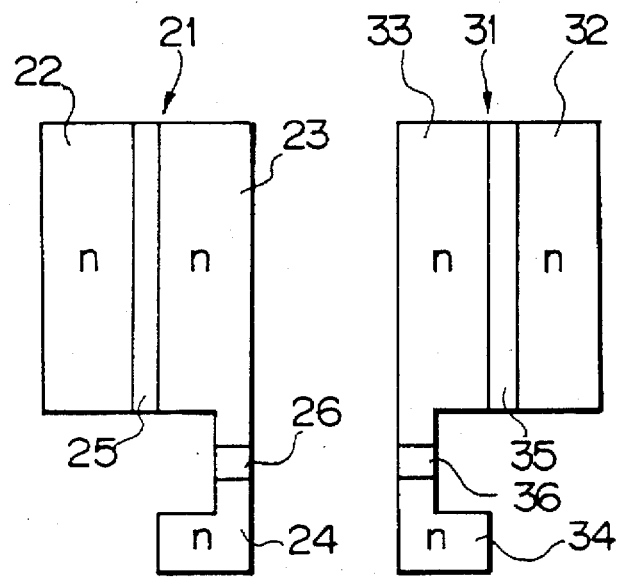
Figure 5D:
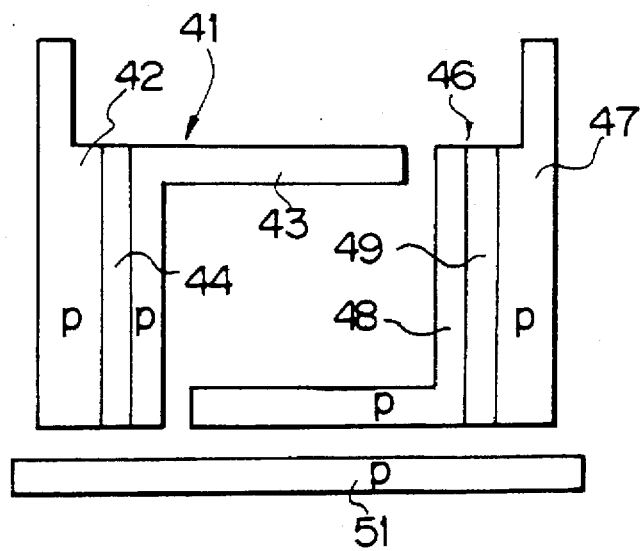

FIGS. 5(C) and 5(D) are plan views showing a pattern within a substrate and a pattern of a polycrystalline semiconductor film thereon, both patterns of which are divided thereinto from a pattern of FIG. 5(B).

As shown in FIG. 5(C), two blocks 21 and 31 are formed in a semiconductor substrate and three n-type semiconductor regions 22, 23 and 24 that sandwich channel regions 25 and 26, are formed in the block 21. Two transistors are formed by this configuration. As the same, three n-type regions 32, 33 and 34, that sandwich channel region 35 and 36, are formed in the block 31 to constitute two transistors. The other channel regions made of a polycrystalline semiconductor layer are arranged on each high resistivity region, the channel region plays a role as a gate.

If a thin film pattern in FIG. 5(D) is disposed on the substrate pattern in FIG. 5(C) to match each high resistivity region therewith, the configuration of FIG. 5(B) is realized. Thus, the circuit shown in FIG. 5(A) is constituted.

If two transfer gates $T_{g1}$ and $T_{g2}$ are removed from the configuration of the SRAM, a configuration of a flip-flop circuit can be attained.

Hereinunder, a series of the manufacturing steps that form a SRAM or a flip-flop circuit will be described.

First of all, a silicon oxide film of a thickness of about 500 nm is grown selectively on a silicon substrate in a wet atmosphere at a temperature of 900° C. by means of a thermal oxidation method to produce a field oxidation film around the element region.

Next, a width of about 20 nm of silicon oxidation film is grown on the element region by means of a thermal oxidation method.

A photo resist layer is formed on the silicon oxidation film to effect lithography selectively and a region for forming an n-type region is opened. A silicon oxidation film remains under an opening of the resist.

Arsenium ions $As^+$ are ion-implanted with an acceleration energy of about 70 KeV and a dose of about $1 \times 10^{15}$ cm$^{-2}$ into an opening for dosing. An n-type region is formed under the opening portion by the ion-implantation method.

Thereafter, a photoresist used as a mask is removed.

Next, a new photoresist layer is formed and an opening is formed in the region in which an electrode contact is formed. Using this photoresist mask, an oxide film is etched to expose the surface of a semiconductor member.

Thereafter, the photoresist used as a mask is removed.

A polycrystalline silicon is deposited on the surface of a semiconductor substrate by a chemical vapor deposition method at a width of about 40 nm.

A photoresist layer is formed on the polycrystalline silicon layer and an opening is formed in the region in which a p-type region is formed.

The photoresist layer serves as a mask and $BF_2^+$ ion is ion-implanted with an acceleration energy of about 5 KeV and a dose of $1 \times 10^{14}$ $cm^{-2}$. A p-type region is formed in the polycrystalline silicon layer by the ion-implantation.

The photoresist layer used as the mask is removed.

A new photoresist layer is formed on the polycrystalline silicon layer to form a mask for etching. Utilizing the mask, the lower portion of the polycrystalline silicon layer is etched to form a pattern.

Thereafter, the photoresist used as the mask is removed. Then annealing is effected for activating ion-implanted impurities.

An oxide film of a thickness of about 100 nm is deposited by chemical vapor deposition and the oxide film plays a role for preventing phosphor from diffusing from phosphosilicate glass (PSG) film formed on the oxide film.

Thereafter, a passivation film such as PSG is grown to a thickness of about 350 nm. A contact window is opened by penetrating a passivation film or on oxide film. Further, aluminum is sputtered on the contact window.

A photoresist layer is formed on the Al layer to form an etching mask for patterning. By using the etching mask, the aluminum layer is etched selectively to form an electrode and a wiring layer.

From the above-described steps, a semiconductor device can be formed as shown in FIG. 5.

In combination with the same photoresist step, ion-implantation step, etching step, and deposit step, it is well known that the other configuration of semiconductor devices can be manufactured.

The present invention was described in line with the above embodiments, but the feature of the present invention is not limited to these examples. In the above, a description is such that one or two polycrystalline semiconductor layers are formed mainly on a semiconductor substrate, and more than three polycrystalline semiconductor layers including an amorphous semiconductor, layer are formed and the same semiconductor device can be formed. In the above, an insulator film of oxide silicon is described, but an insulator film of nitride or the like can be utilized.

Further, the transistor pair according to the present invention can be formed by two layers of polycrystalline semiconductor thin film formed on a silicon-on-insulator (SOI) substrate.

Still further, suppose that a holding substrate side is denoted by reference numeral 11 and an element substrate side by reference numeral 3 as shown in FIG. 3(A), and if a silicon-on-insulator substrate is used, one side of the channel current path may serve as a gate of the other side of the channel current path, whereas a respective source/drain region is superposed with a respective channel region and one side of the source and drain may serve as a gate of the other side.

Next, another feature of the present invention will be described hereinafter.

Figure 6A:
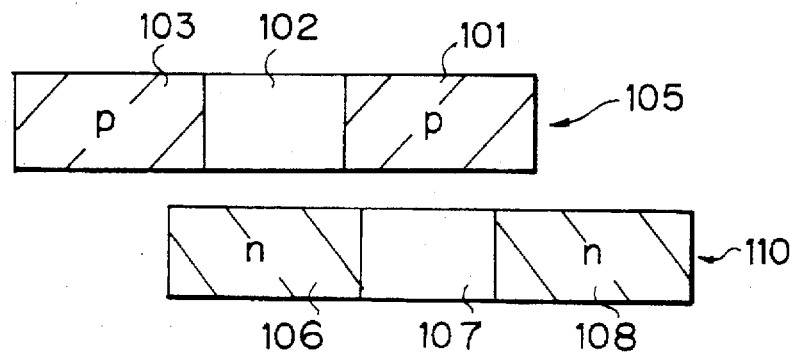
FIG. 6(A) is a schematic view showing the configuration of a transistor pair of a first embodiment of a second aspect of the present invention.

FIG. 6(A) is a schematic view showing a transistor pair of a first embodiment of a second aspect of the present invention.

In a first layer, a first channel region 102 formed by a high resistivity semiconductor and low resistivity p-type current terminal regions 101 and 103 arranged on both sides of the first channel region 102 are arranged. And a second channel region 107 formed by a high resistivity semiconductor and a low resistivity n-type current terminal regions 106 and 108 arranged on both sides of the second channel region 107, are formed at a second layer close to the first layer.

The first channel region 102 is arranged adjacently in the n-type current terminal region 106 by the voltage of the electric field that is controlled. The second channel region 107 is adjacently arranged in the p-type current terminal region 101 by the voltage of the electric field that is controlled.

One configuration of a transistor is formed by the first channel region 102, the p-type current terminal regions 101 and 103 on both sides of the first channel region 102, and one side of the current terminal regions 106 of the second current path.

Another configuration of a transistor is formed by the second channel region 107, the n-type current terminal regions 106, 108 on both sides thereof, and one side of the current terminal region 101 of the first current path.

Thus, two current paths that include a high resistivity channel region and a pair of current terminal regions on both sides thereof are formed, and thereby, two configurations of a transistor can be formed. The two layers of current path are shown by 105 and 110.

Figure 6B:
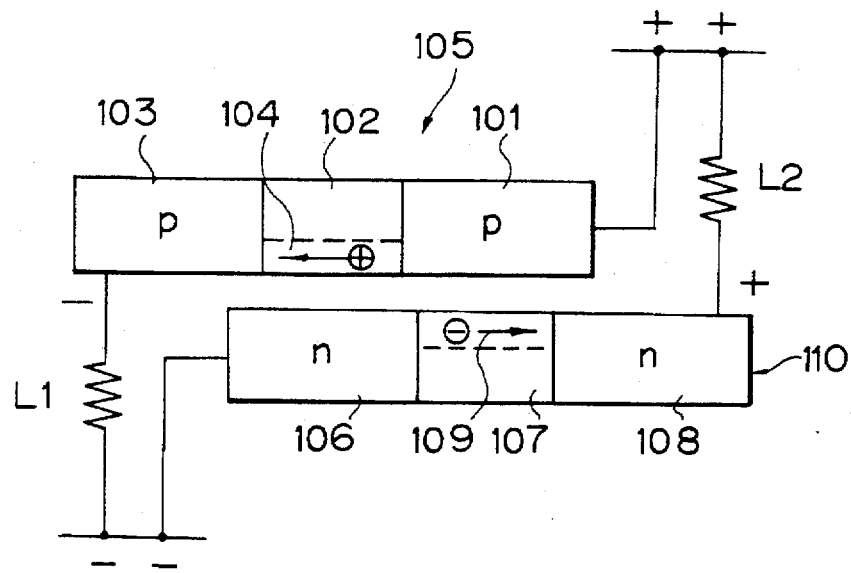
FIG. 6(B) is a view explaining the operation of a transistor pair shown in FIG. 6(A)

FIG. 6(B) is a view explaining the operation of a transistor pair shown in FIG. 6(A).

A p-type current terminal region 101 is connected to a positive potential and another p-type current terminal region 103 is connected to a negative potential via a load L1. An n-type current terminal region 106 is connected to a negative potential and another n-type current terminal region 108 is connected to a positive potential via a load L2. In such configuration the n-type current terminal region 106 presents a negative voltage to the channel region 102. For this reason, based on the action of an electric field extended from the n-type current terminal region 106 to the channel region 102, a p-channel 104 is induced on the surface of the channel region 102.

In the same way, the p-type current terminal region 101 presents a positive potential to the channel region 107. For this reason, based on the action of the electric field from the p-type current terminal region 101, an n-channel 109 is induced on the surface of the channel region 107.

Such being the case, current flows through both current path 105 and 110 in the configuration as shown in the figure. In this case, a load is illustrated by a resistor, but other forms of load such as a transistor may be utilized.

Such a transistor pair can be realized by many sorts of configurations.

Figure 6C:
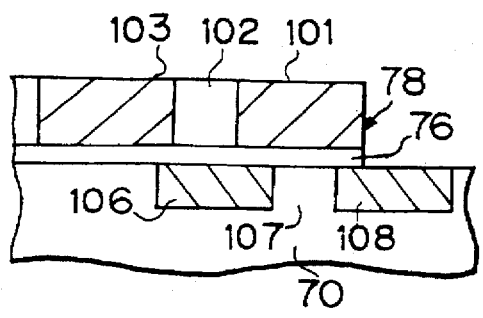
FIGS. 6(C) and 6(D) denote each application of the configuration to a transistor pair.

FIG. 6(C) denotes an application of the configuration of a transistor pair.

A pair of current terminal regions 106 and 108, both of which sandwich a channel region 107, is formed on the surface area of a semiconductor substrate 70. An insulation film 76 is formed on the surface of the semiconductor substrate 70 and a polycrystalline semiconductor film 78 is formed thereupon. A channel region 102 and current terminal regions 101 and 103 on both sides thereof are formed in the polycrystalline semiconductor film 78. As shown in FIG. 6(A), the configuration of each region is such that one side of the current terminal regions of another current path is arranged in adjacent relation with the channel region.

Figure 6D:
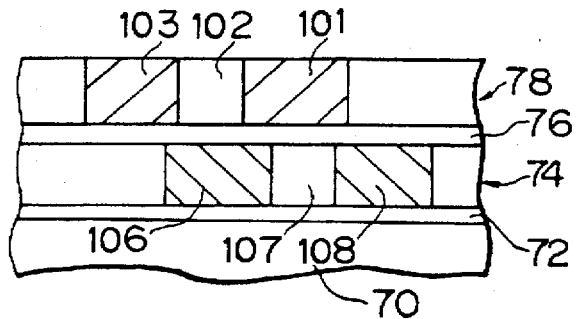

FIG. 6(D) denotes another application of the configuration of a transistor pair. A first polycrystalline semiconductor film 74 is formed on a semiconductor substrate or an insulator substrate 70 via an insulation film 72. Further, a second polycrystalline semiconductor film 78 is formed via an insulation film 76. Each current path is formed in these two polycrystalline semiconductor films 74 and 78. That is, a channel region 107 and current terminal regions 106 and 108 on both sides thereof are formed in the first polycrystalline semiconductor film 74 and a channel region 102 and current terminal regions 101 and 103 on both side thereof are formed in the second polycrystalline semiconductor film 78. The matching relationship of each region is the same as in FIGS. 6(A) and 6(C).

The above-described transistor pair operates in association with each other.

Figure 7A:
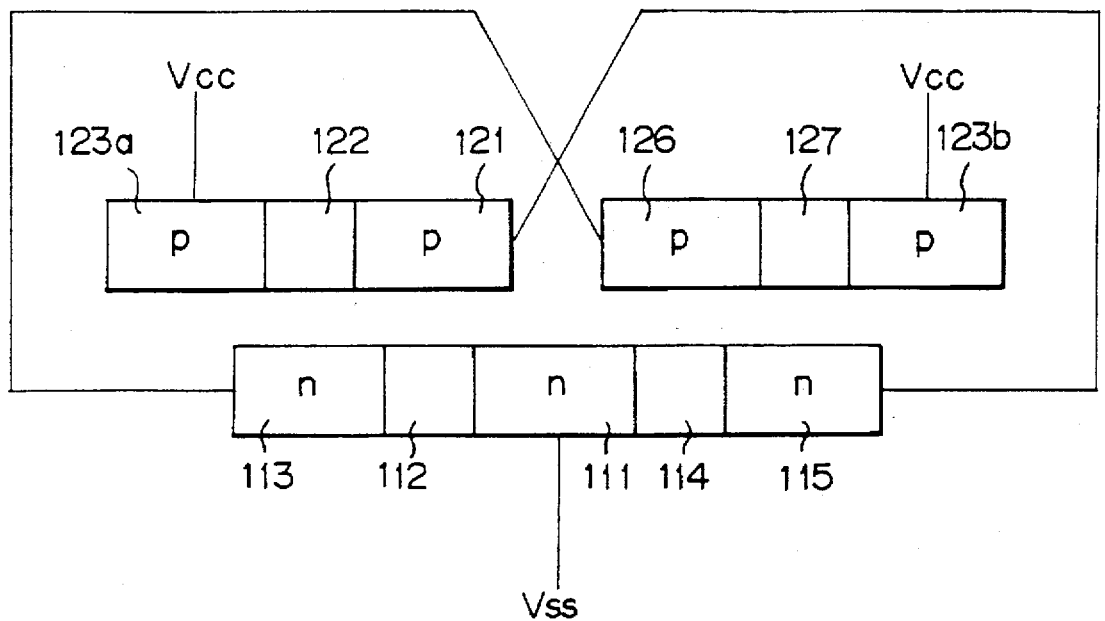
FIG. 7(A) illustrates the configuration of a flip-flop circuit, i.e., a second embodiment of the second aspect of the present invention and FIG. 7(B) an equivalent circuit thereof.
Figure 7B:
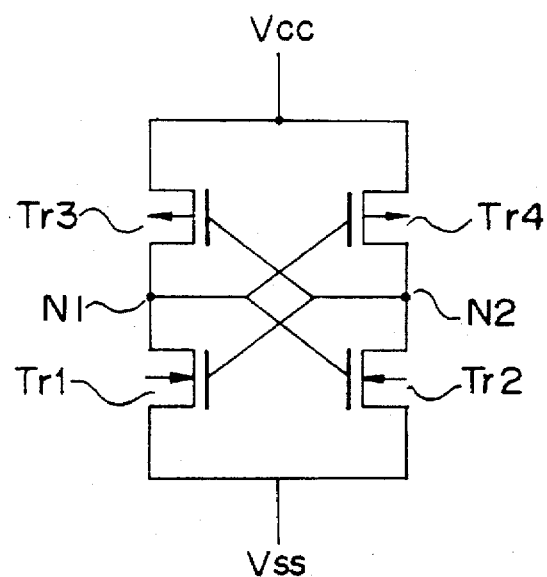

An example of a circuit formed by utilization of such transistor pair is illustrated in FIGS. 7(A) and 7(B), which shows a flip-flop circuit of an embodiment in accordance with the present invention.

FIG. 7(A) illustrates the configuration of a flip-flop circuit indicating a second embodiment of the second aspect of the present invention, and FIG. 7(B) an equivalent circuit thereof.

N-type regions 111, 113 and 115 are formed in a semiconductor region arranged in a first layer so as to sandwich high resistivity channel regions 112 and 114. In the configuration as shown in the figure, two current paths that face from a central n-type region 111 toward both sides are formed. Another semiconductor layer is arranged at a second layer close to the first layer and one current path, which includes a channel region 122 and p-type regions 121 and 123a on both sides thereof and another current path which includes a channel region 127 and p-type regions 126 and 123b on both sides thereof, are formed. The p-type region 121 is arranged adjacent to the channel region 112 and an adjacent channel region 122 is arranged so as to be arranged adjacently to the n-type region 113. The channel region 127 is arranged adjacently to an n-type region 115 and a channel region 114 is arranged so as to be arranged adjacently to a p-type region 126. Further, n-type regions 113 and 115 on both sides of the first layer are connected to the current terminal regions 126 and 121 of the second layer, respectively. When such a connection is formed, it follows that the configuration shown in FIG. 7(A) is like a circuit shown in the equivalent circuit of FIG. 7(B). That is, two n-channel current paths at the first layer form n-channel transistors Tr1 and Tr2, and two p-channel current paths at the second layer form p-channel transistors Tr3 and Tr4. These four transistors are wired to each other with cruciform like wiring with sleeves tucked up to constitute a flip-flop circuit. Common current terminals of n-channel transistors Tr1 and Tr2 are connected with a voltage $V_{ss}$ and remaining current terminals of p-channel transistors Tr3 and Tr4 are connected with a voltage $V_{cc}$.

An n-channel transistor Tr1 and a p-channel transistor are superposed and operated in mutual association. Also, an n-channel transistor Tr2 and a p-channel transistor Tr3 are superposed on each other and are operated in an associative relation, where N1 and N2 denote a connection node.

If a transfer gate is connected with a connection node of a flip-flop circuit, an SRAM cell can be formed.

Figure 8A:
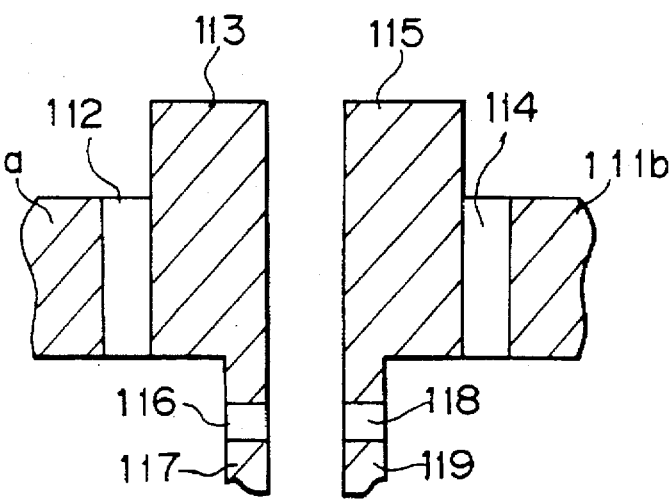
Figure 8B:
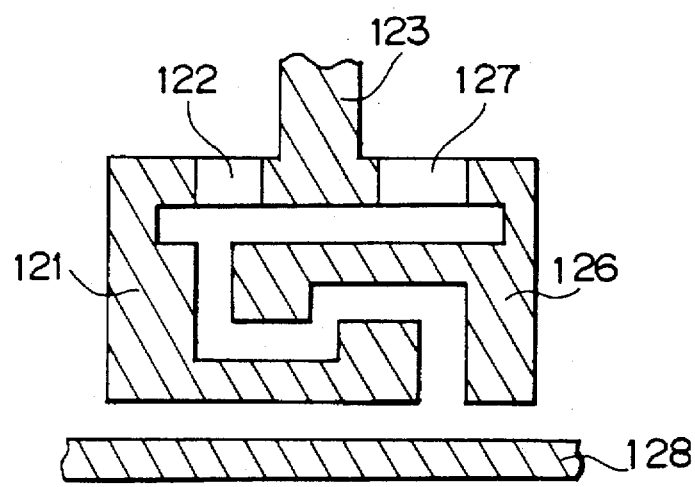
Figure 8C:
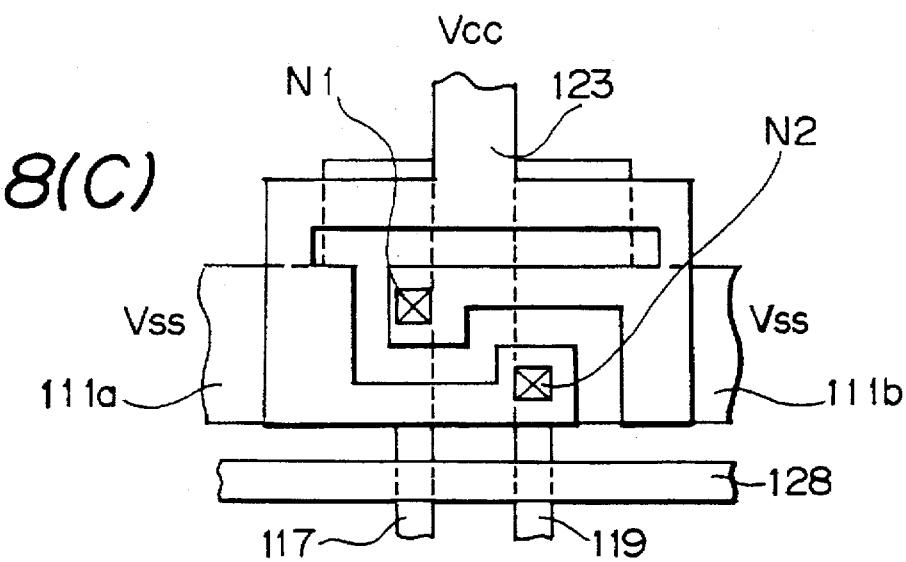

FIGS. 8(A) to 8(C) denote a first configuration of an SRAM of a third embodiment of the second aspect in accordance with the present invention.

On a first layer formed by the surface of a semiconductor substrate or a semiconductor layer on the substrate an n-type region and a channel region as shown in FIG. 8(A). In the figure, hatched portions 111a, 113, and 117 are n-type regions and channel regions 112 and 116 are disposed therebetween. Also, channel regions 114 and 118 are arranged between n-type regions 111b, 115, and 119. In FIG. 8(A), two current switches are formed on each of the right and left sides of the configurations.

A second layer of semiconductor is formed via an insulation layer on the first layer. The pattern of the second layer is illustrated in FIG. 8(B).

A p-type region 123 is connected to p-type regions 121 and 126 via high resistivity of channel regions 122 and 127. On the lower portion, a p-type region 128 is formed as a word line gate.

In the configuration of FIG. 8(B), two current switches are formed. The first layer shown in FIG. 8(A) and the second layer shown in FIG. 8(B) are arranged in a laminated form as shown in FIG. 8(C) by sandwiching or having therebetween an insulation layer. P-type regions 121 and 126 of the second layer are arranged on the channel regions 112 and 114 of the first layer to serve as a gate. Also, n-type regions 113 and 115 are arranged beneath the channel regions 122 and 127 of the second layer to serve as a gate.

Similarly, a p-type region 128 of the second layer is arranged on the channel regions 116 and 118 of the first layer to serve as a gate. As such, the configuration of an SRAM cell, including six transistors by means of the two layer configuration sandwiching an insulation layer, can be formed. The first layer and the second layer are interconnected therewith at each position of node N1 and node N2 as shown in FIG. 8(C).

The circuit realized by the configuration of FIG. 8(C) is a circuitry such that a transfer gate is connected to nodes N1 and N2 of the equivalent circuit shown in FIG. 7(B).

Figure 9A:
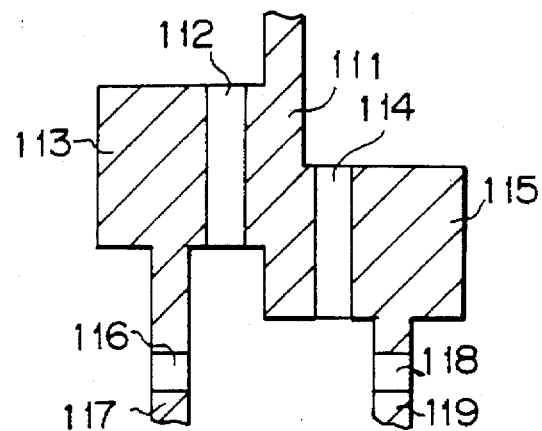
FIGS. 9(A), 9(B) and 9(C) are views showing a second configuration of an SRAM of a fourth embodiment of the second aspect of the present invention.
Figure 9B:
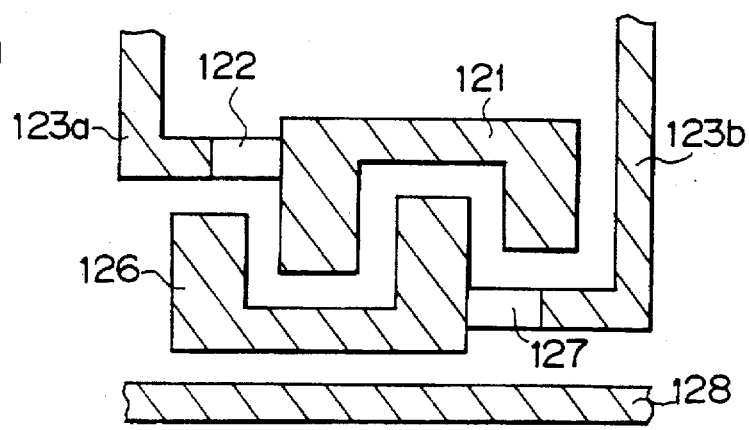
Figure 9C:
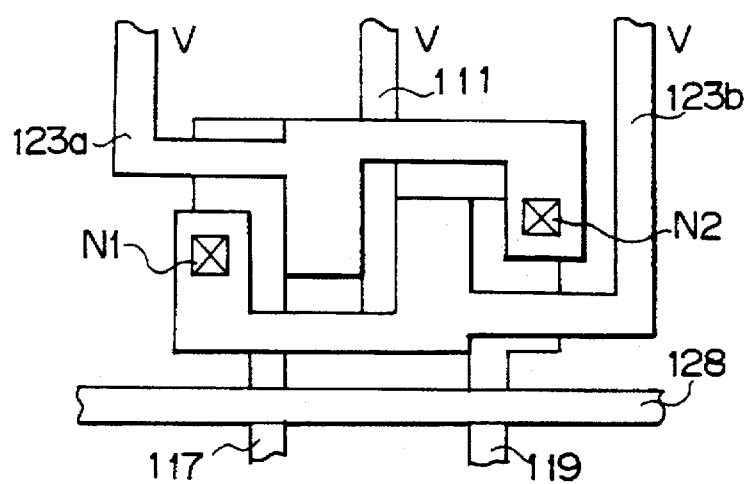

FIGS. 9(A) to 9(C) are views showing examples of the second configuration of an SRAM according to a fourth embodiment of the second aspect of the present invention.

FIG. 9(A) shows a pattern of the first layer. An n-type region 111 is arranged adjacent to n-type regions 113 and 115 via channel regions 112 and 114. Also these n-type regions 113 and 115 are arranged adjacent to n-type regions 117 and 119 via channel regions 116 and 118.

Four current switches are formed by such a configuration of the first layer.

FIG. 9(B) is a view showing a pattern of the second layer.

P-type regions 121 and 123a are arranged on both sides of a high resistivity channel region 122 and p-type regions 126 and 123b are arranged on both sides of another high resistivity channel region 127. A p-type region 128 is arranged below these regions.

The first layer shown in FIG. 9(A) and the second layer shown in FIG. 9(B) are laminated such as shown in FIG. 9(C). Then, p-type regions 121 and 126 of the second layer are arranged on the channel regions 112 and 114 of the first layer to serve as a gate. Also, a p-type region 128 of the second layer is arranged on the channel regions 116 and 118 to serve as a gate.

N-type regions 113 and 115 of the first layer are arranged below the channel regions 122 and 127 of the second layer to serve as a gate.

As such, the lamination structure shown in FIG. 9(C) forms a configuration of six transistors. In the figure, N1 and N2 denote, connection nodes that connect the first layer and the second layer therewith.

In the configuration of FIG. 8(C), a voltage $V_{cc}$ is applied to the p-type region 123 in the center and a voltage $V_{ss}$ is applied to n-type regions 111a and 111b on both ends.

In the configuration of FIG. 9(C), a voltage $V_{ss}$ is applied to an n-type region 111 in the center and a voltage $V_{cc}$ is applied to p-type regions 123a and 123b on both ends. The configuration of either FIG. 8 or FIG. 9 can be selected using any wiring pattern.

In the above description, the case in which the layer of p-channel current path and n-channel current path are superposed is explained, but the present invention is not limited to this case.

Figure 10A:
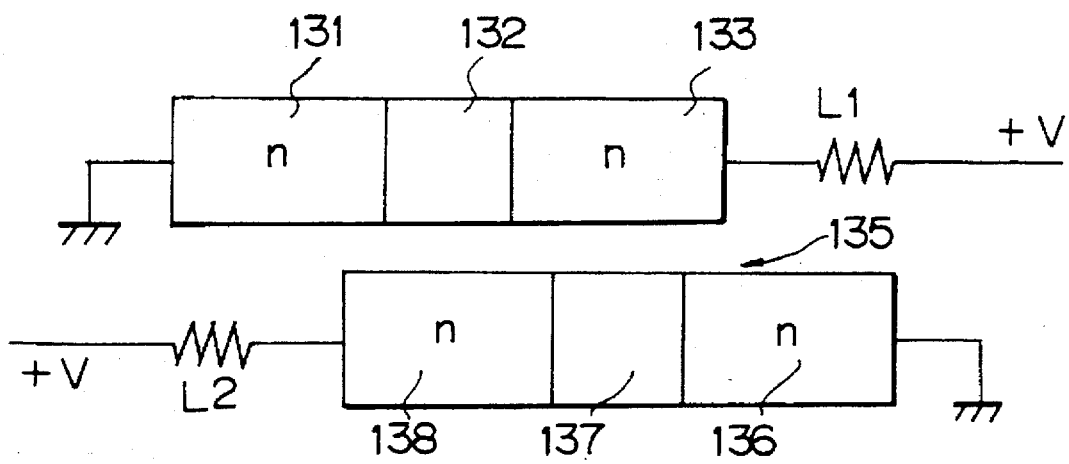
FIGS. 10(A) and 10(B) are views showing the configuration of a transistor pair or flip-flop according to a fifth embodiment of the second aspect of the present invention.
Figure 10B:
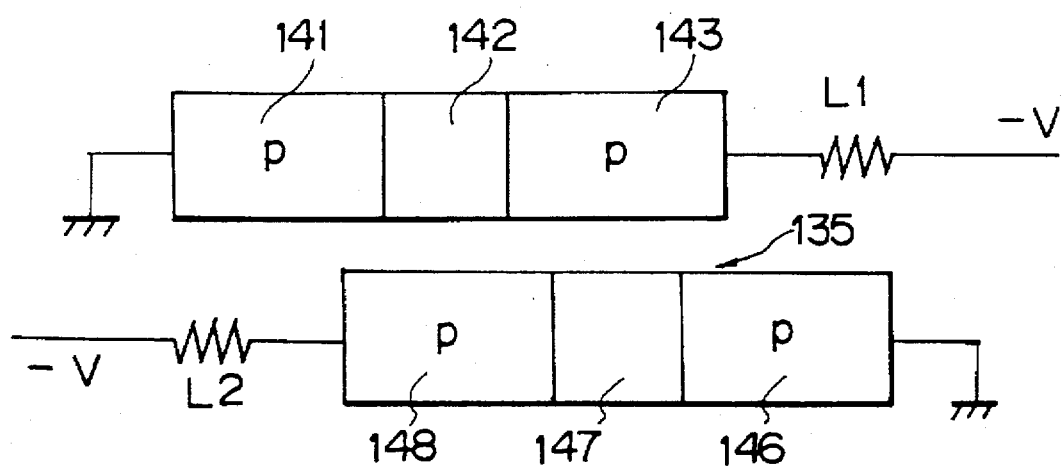

FIGS. 10(A) and 10(B) are views showing the configuration of a transistor pair or a flip-flop circuit according to a fifth embodiment of the second aspect of the present invention.

FIG. 10(A) is a view showing the configuration of n-channel transistor pair.

In FIG. 10(A), two n-type regions 131 and 133 are arranged in one layer by sandwiching a high resistivity channel region 132 and two n-type regions 136 and 138 are arranged in another layer close to the first layer by sandwiching a high resistivity channel region 137. The channel region 137 is arranged adjacent to the n-type region 133 and the channel region 132 is arranged adjacent to the n-type region 138.

When a transistor pair is produced, an n-type region 133 of the upper side current path is connected to a positive potential via a load L1 and an n-type region 138 of the lower side current path is connected to a positive potential via a load L2. The other n-type regions 131 and 136 are connected to, for example, the ground potential.

When such a connection is made, an n-channel is induced in the channel region 137 by a positive voltage of the n-type region 133, the voltage of n-type region 138 reduces and the channel region 132 is turned off by the voltage at the earth potential level.

Thus, a transistor including the channel region 137 is turned on and a transistor including the channel region 132 is turned off. There exists a stable state such that the channel region 137 is turned off and the channel region 132 is turned on, thereby a flip-flop is constituted.

FIG. 10(B) is a view showing the configuration of a p-channel transistor pair.

Similarly to FIG. 10(A), two p-type regions 141 and 143 are arranged in one layer by sandwiching a high resistivity channel region 142 and two p-type regions 146 and 148 are arranged in another layer by sandwiching a high resistivity channel region 147. A channel region 142 is arranged adjacent to a p-type region 148 and a channel region 147 is arranged adjacent to a p-type region 143. As is the same with FIG. 10(A), one side of the current terminal of the first current path and the second current path is grounded and the other side of current terminal is connected to a negative power source -V via loads L1 and L2. A p-channel is induced in the channel region 147 by a negative voltage applied to the p-type region 143. If the p-type region 148 is a negative voltage, the channel 142 is turned on to constitute a flip-flop circuit as in the case of the n-type.

In the above, a transistor is described in a state where a voltage is not applied thereto, and is in a state of "turn OFF" and when a voltage is applied to a gate, a channel is induced to turn on. Nevertheless, the present invention is not limited to such type of transistor.

Figure 11A:
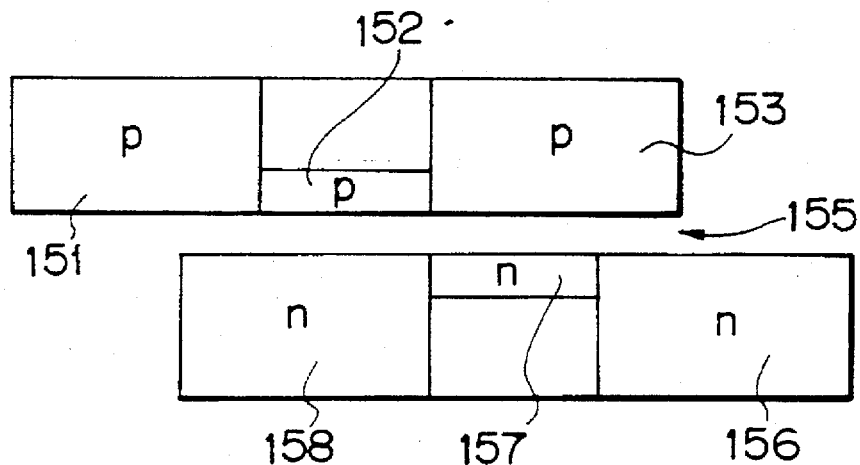
FIGS. 11(A) and 11(B) are views showing a transistor pair according to a sixth embodiment of the second aspect of the present invention.
Figure 11B:
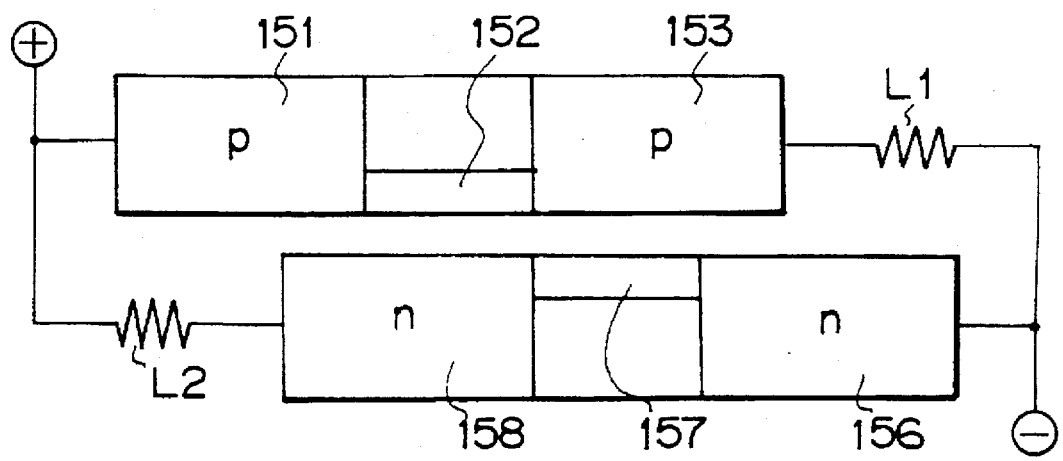

FIGS. 11(A) and (B) are views showing a transistor pair according to a sixth embodiment of the second aspect of the present invention. FIG. 11(A) shows a configuration and FIG. 11(B) an operation thereof.

In the configuration of FIG. 11(A), p-type regions 151 and 153 are connected therewith via a p-channel 152. The current path is arranged on another current path via an insulation film 155. In another current path, n-type regions 156 and 158 are connected therewith via an n-channel 157. A p-channel 152 is arranged on an n-type region 158 and an n-channel 157 is arranged below a p-type region 153.

Such a configuration is connected to the power sources. That is, a p-type region 153 is connected to a negative voltage via a load L1 and another p-type region 151 is connected to a positive voltage. An n-type region 156 is directly connected to a negative voltage and another n-type region 158 is connected to a positive voltage via a load L2.

The potential at the p-type region 153 is higher than that at the n-type region 158, thus operating to deplete the n-channel 157.

Thus, in the configuration shown in the figure, both current paths are turned ON. If the transistor pair as shown in FIGS. 10 and 11 is utilized, it is apparent that a multifarious circuit can be designed by those skilled in the art.

According to the present invention, two current terminal regions can be easily designed and constitute a transistor pair by providing a pair of configurations sandwiching the channel region.

The memory element described above is comprised, for example, of a predetermined substrate, a first thin film semiconductor layer and a second thin film semiconductor layer, in each of which a semiconductor region of a first conductivity type and a semiconductor region of a second conductivity type are disposed with a channel region sandwiched therebetween. The first thin film semiconductor layer and the second thin film semiconductor layer are superimposed one atop the other in such a manner that semiconductor regions of the first conductivity type thereof face each other and semiconductor regions of the second conductivity type thereof face each other. The memory element having such a construction will be hereinafter termed a channel-capacitor type memory element.

On the other hand, the other memory element described above is comprised, for example, of a predetermined substrate, a third thin film semiconductor layer, in which semiconductor regions of the first conductivity type are disposed on both sides of a channel region, and a fourth thin film semiconductor layer, which includes semiconductor regions of the second conductivity type disposed on both sides of a channel region. The third and the fourth thin film semiconductor layers are superimposed one atop the other. The memory element having such a construction will be hereinafter termed a channel-gate transistor type memory element.

Figure 21:
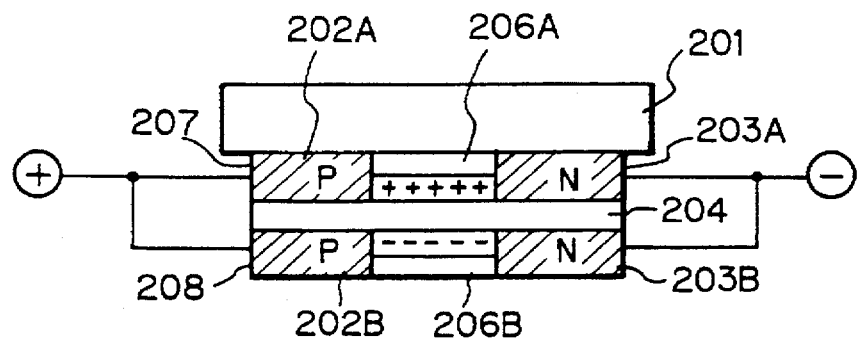
FIG. 21 is a view explaining the construction of a conventional channel-capacitor type memory element.

The new type of memory element, that is, the channel-capacitor type memory element has a basic structure such as that shown in FIG. 21, for example, illustrating an insulator holding substrate 201 made of glass such as PSG (phosphosilicate glass), $SiO_2$, etc. On the bottom surface of the holding substrate 201, a first thin film semiconductor layer 207 is formed, in which a semiconductor region of a first conductivity type, e.g., a p-type region 202A and a semiconductor region of a second conductivity type, e.g., an n-type region 203A are disposed adjacent each other, sandwiching a channel region 206A. On the bottom surface of the first thin film semiconductor layer 207 and through an insulator layer 204, a second thin film semiconductor layer 208 is formed in which a semiconductor region of the first conductivity type, e.g., a p-type region 202B and a semiconductor region of the second conductivity type, e.g., an n-type region 203B are disposed adjacent each other sandwiching a channel region 206B. The two thin film semiconductor layers 207 and 208 are disposed with the p-type semiconductor regions 202A and 202B in an opposing relation to each other and the n-type semiconductor regions 203A and 203B in an opposing relation to each other.

In the memory element structured as described above, when a positive potential is applied to the p-type semiconductor regions 202A and 202B of the thin film semiconductor layers 207 and 208, and a negative potential is applied to the n-type semiconductor regions 203A and 203B of the thin film semiconductor layers 207 and 208, charges of opposing polarities are induced in the channel regions of the thin film semiconductor layers 207 and 208 on the sides at which the thin film semiconductor layers 207 and 208 are facing each other.

That is, as shown in FIG. 21, since a positive charge is induced in a surface of the channel region of one thin film semiconductor layer while a negative charge is induced in a surface of the channel region of the other thin film semiconductor layer similar to a capacitor, the charges are accumulated and held in the channel regions similar to a capacitor, it is possible to execute writing and storing by controlling and reading the charges which are accumulated in the channel regions.

Figure 22:
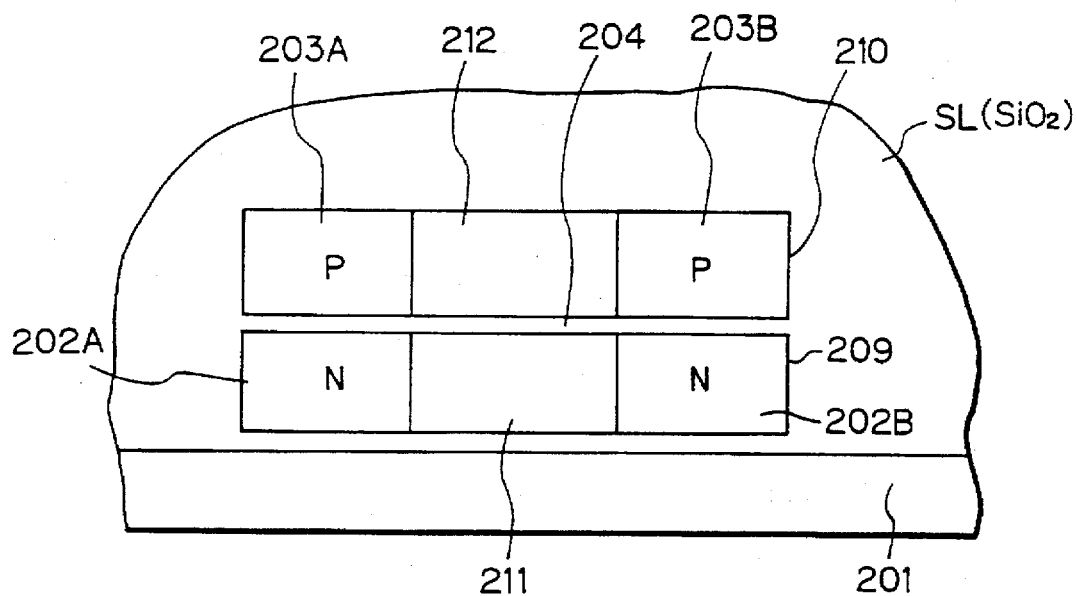
FIG. 22 is a view explaining the construction of a conventional channel-gate transistor type memory element.

On the other hand, the channel-gate transistor type memory element has a basic structure such as that shown in FIG. 22, for example, illustrating an insulator holding substrate 201 which is similar to the holding substrate 201 of FIG. 21. On the top surface of the holding substrate 201, a third thin film semiconductor layer 209, in which semiconductor regions of a first conductivity type, e.g., n-type semiconductor regions 202A and 202B are disposed sandwiching a channel region 211, and a fourth thin film semiconductor layer 210, in which semiconductor regions of a second conductivity type, e.g., p-type semiconductor regions 203A and 203B are disposed sandwiching a channel region 212, are superposed one atop the other.

Indicated as SL in FIG. 22 is a layer formed by an insulator (dielectric material) made of SiO2 or the like which surrounds the thin film semiconductor layers 209 and 210 and which is disposed between the thin film semiconductor layers 209 and 210 and also between the holding substrate 201 and the thin film semiconductor layer 209.

Figure 23:
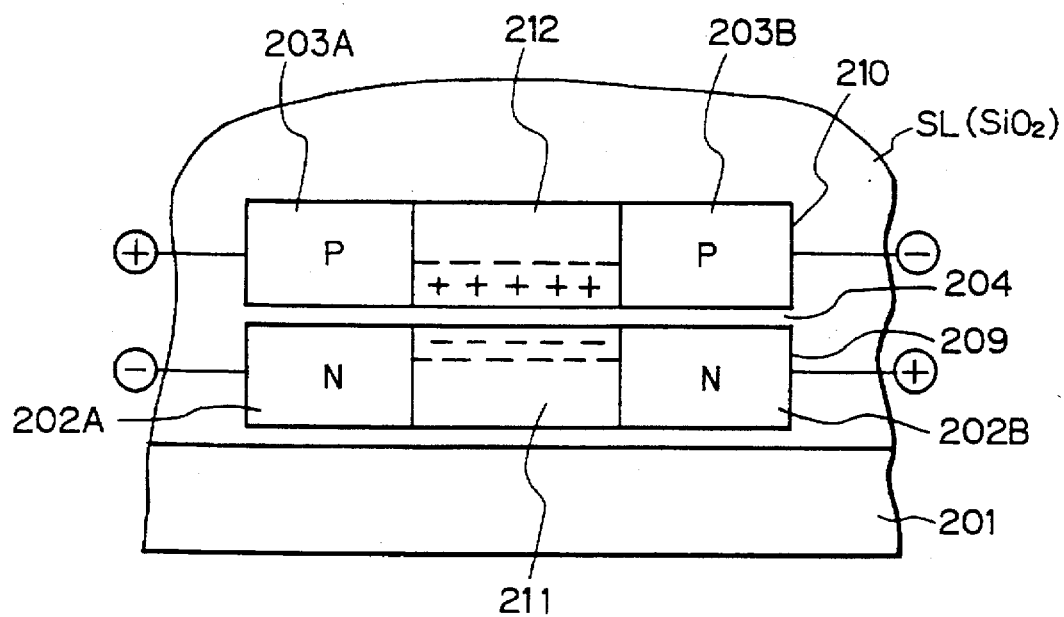
FIG. 23 is a view explaining the operation of the conventional channel-gate transistor type memory element.

In the memory element having such a construction, for instance, as shown in FIG. 23, when a positive potential is applied to the p-type semiconductor region 203A, a negative potential is applied to the p-type semiconductor region 203B, a negative potential is applied to the n-type semiconductor region 202A, and a positive potential is applied to the n-type semiconductor region 202B, a positive charge is induced in the surface of the channel region 212 of the thin film semiconductor layer 210 opposite the channel region 211 of the thin film semiconductor layer 209, thereby creating a p-channel thereat, concurrently with which a negative charge is induced in the surface of the channel region 211 of the thin film semiconductor layer 209 opposite the channel region 212 of the thin film semiconductor layer 210, whereby an n-channel is created thereat. Hence, as disclosed in Japanese Unexamined Patent Publication (Kokai) No. H3-000987, this element, when used in a pair, is capable of carrying out writing and storing like the channel-capacitor type memory element described above, and therefore, can be used as a memory element.

As in FIG. 22, indicated at SL in FIG. 23 is a layer formed by an insulator (dielectric material) made of SiO2 or the like which surrounds the thin film semiconductor layers 209 and 210 and which is disposed between the thin film semiconductor layers 209 and 210 and also between the holding substrate 201 and the thin film semiconductor layer 209.

However, the channel-capacitor type memory element and the channel-gate transistor type memory element, although having characteristics which cover the disadvantages of the conventional memory element mentioned above and which would meet current needs, have a problem. That is, since the thin film semiconductor layers which form the respective memory elements cannot be manufactured exactly the same during fabrication therefor, the thin film semiconductor layers have different current characteristics, different drive characteristics, different ON/OFF characteristics, different threshold voltages $V_{th}$ and other different characteristics. In reality, it is impossible to manufacture the thin film semiconductor layers exactly the same during manufacturing.

Hence, although a semiconductor memory device, if structured using the channel-capacitor type memory element or the channel-gate transistor type memory element, is smaller, faster and denser, thus possessing various effects, it has a problem that a dc current is generated when the memory element changes from a conductive state to a non-conductive state. This not only directly goes against efforts for a low power consumption device but also develops heat in an LSI or a VLSI device which is formed by densely arranging such memory elements. Thus, with the memory element as described above, it is difficult to fabricate an LSI or a VLSI device.

Further, a flip-flop constituted by the channel-gate transistor type memory elements, particularly if the two memory element pairs have different driving characteristics, would not be able to turn on and off correctly. Rather, the flip-flop would generate an error output signal and malfunction.

The present invention therefore aims at, according to other embodiments, improving the defects of the above-mentioned memory elements and offering a semiconductor memory device which is formed by the channel-capacitor type memory element or the channel-gate transistor type memory element and which still achieves low power consumption, precise writing and storing of information. Hence, the semiconductor memory device according to the other embodiments of the present invention is malfunction-free, small and highly dense.

To attain the above objects, embodiments of the present invention adopt the follow structures. According to a first aspect, there is provided a semiconductor memory device which is characterized by comprising a memory element which is formed by laminating a first thin film semiconductor layer and a second thin film semiconductor layer, in each of which a semiconductor region of a first conductivity type and a semiconductor region of a second conductivity type are disposed with a channel region sandwiched therebetween, one atop the other in such a manner that the semiconductor regions having the first conductivity type of the two thin film semiconductor layers are opposed to each other and the semiconductor regions having the second conductivity type of the two thin film semiconductor layers are opposed to each other, and that the channel region of at least one of the two thin film semiconductor layers is disposed in an opposing relation to a back-gate. According to a second aspect, there is provided a semiconductor memory device which is characterized by comprising a memory element which is comprised of a third thin film semiconductor layer in which semiconductor regions of a first conductivity type are disposed with a channel region sandwiched therebetween and a fourth thin film semiconductor layer in which semiconductor regions of a second conductivity type are disposed with a channel region sandwiched therebetween. The third and the fourth thin film semiconductor layers are laminated one atop the other in such a manner that the channel region of at least one of the two thin film semiconductor layers is disposed in an opposing relation to a back-gate.

Having such structures, the semiconductor memory devices in accordance with the embodiment above allow the back-gates to be disposed opposite the channel regions of the thin film semiconductor layers control channel formation conditions for forming the channel regions of the thin film semiconductor layers. For example, a threshold value $V_{th}$ is controlled to a proper value. Hence, by adjusting a voltage to be applied to the back-gate to an appropriate level, for instance, it is possible to shift the threshold value at the channel region of the thin film semiconductor layer and therefore to set the channel formation conditions for forming the channel region to an enhance mode. This enables complete prevention of an OFF-current generation, and moreover, makes operation conditions for the memory element identical and stabilizes the operations of the memory element, obviating device failure.

In the following, semiconductor memory devices of the embodiment above, that is, a third aspect of the present invention, will be described in detail with reference to the drawings.

Figure 12:
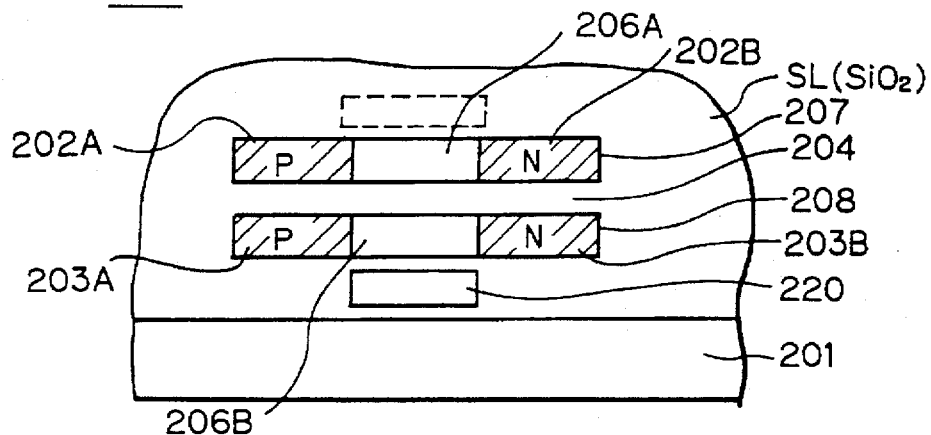
FIG. 12 is a view showing the construction of a memory element which is used in a semiconductor memory device of an embodiment of a third aspect of the present invention.
Figure 13:
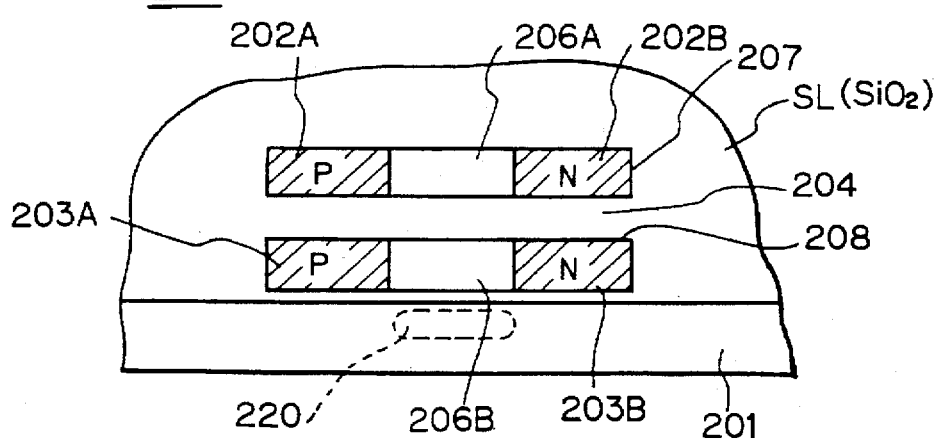
FIG. 13 is a view showing another embodiment of the third aspect of the present invention.
Figure 14:
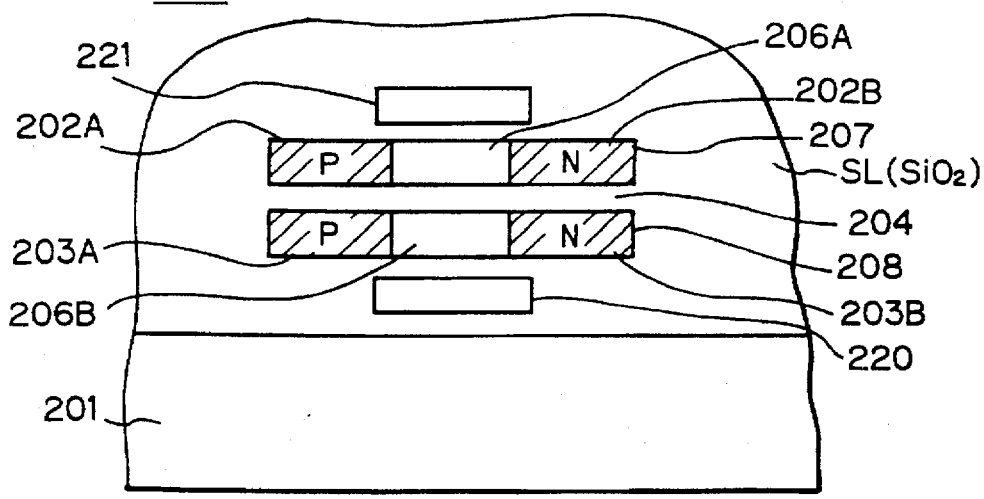
FIG. 14 is a view showing still another embodiment of the third aspect of the present invention.

FIGS. 12 to 14 are views showing a construction of a semiconductor memory device in accordance with a first embodiment of the third aspect of the present invention. In the drawing, there is illustrated a semiconductor memory device including a memory element which is comprised of a first thin film semiconductor layer 207, in which a semiconductor region of a first conductivity type, i.e., a p-type semiconductor region 202A and a semiconductor region of a second conductivity type, i.e., an n-type semiconductor region 202B are disposed with a channel region 206A sandwiched therebetween; and a second thin film semiconductor layer 208. The first thin film semiconductor layer 207 and the second thin film semiconductor layer 208 are superimposed one atop the other in such a manner the semiconductor regions 202A and 203A having the first conductivity type of the two thin film semiconductor layers are opposed to each other and the semiconductor regions 202B and 203B having the second conductivity type of the two thin film semiconductor layers are opposed to each other and also in such a manner that the channel region 206A or 206B of at least one of the two thin film semiconductor layers 207 and 208 is disposed in an opposing relation to a back-gate 220.

In the embodiment above, the channel region 206A is made of non-doped polysilicon (Poly Si) or is a p-type or an n-type region which has a concentration equal to or less than one-tenth that of the p-type and the n-type diffusion regions indicated at 202A and 202B, respectively.

In FIG. 13, in the embodiment above, a holding substrate 201 is a lightly doped p-type or an n-type diffusion region. The back-gate 220 disposed within the holding substrate 201 forms a heavily doped p-type or an n-type diffusion region which has a conductivity opposite to that of the holding substrate 201.

Indicated by a reference character SL is a layer formed by an insulator (dielectric material) made of $SiO_2$ or the like which surrounds the thin film semiconductor layers 207 and 208 and which is disposed between the thin film semiconductor layers 207 and 208, i.e., in a region 204, and between the holding substrate 201 and the thin film semiconductor layer 208.

Figure 15:
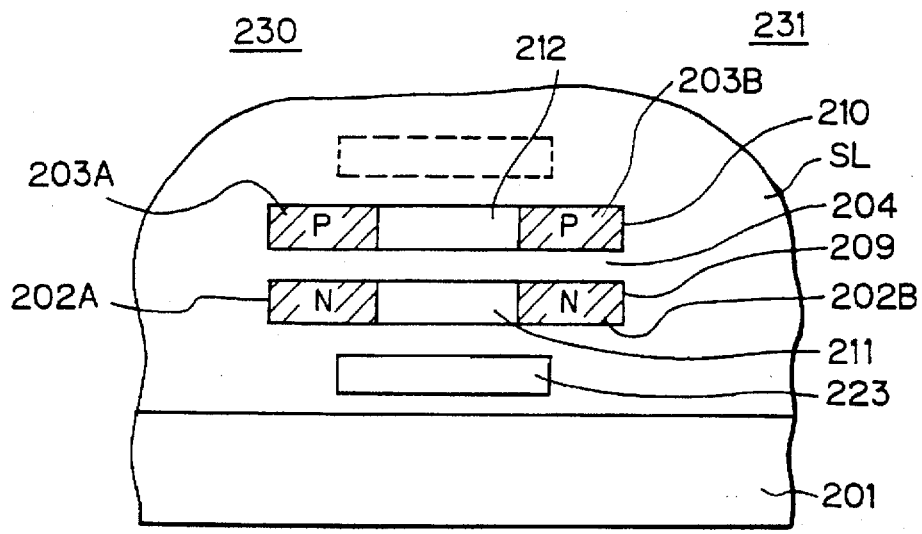
FIG. 15 is a view showing an embodiment of a fourth aspect of the present invention.
Figure 16:
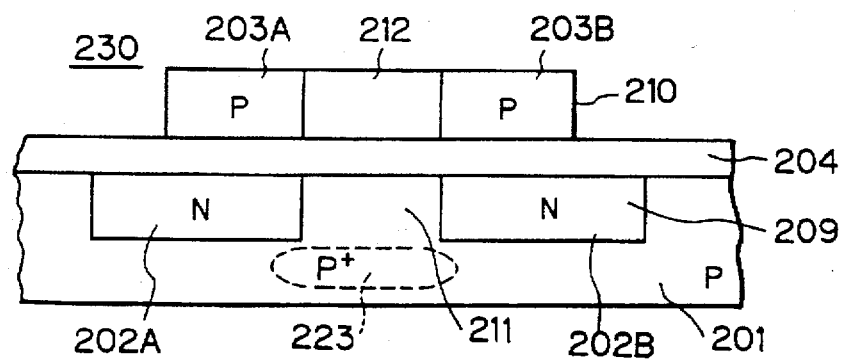
FIG. 16 is a view showing another embodiment of the fourth aspect of the present invention.
Figure 17:
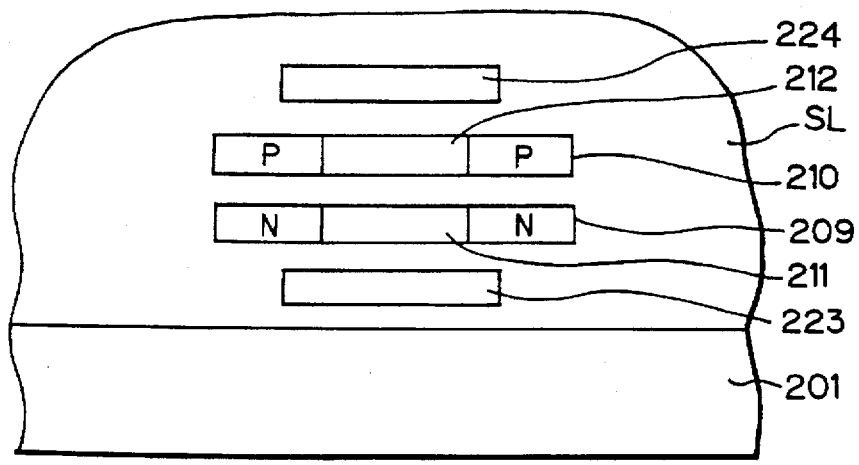
FIG. 17 is a view showing still another embodiment of the fourth aspect of the present invention.

FIGS. 15 to 17 are views showing a construction of a semiconductor memory device in accordance with an embodiment of a fourth aspect of the present invention. In the drawing, there is illustrated a semiconductor memory device including a memory element 231 which is formed by laminating a third thin film semiconductor layer 209, in which semiconductor regions of a first conductivity type, i.e., n-type semiconductor regions 202A and 202B are disposed with a channel region 211 sandwiched therebetween; and a fourth thin film semiconductor layer 210, in which semiconductor regions of a second conductivity type, i.e., p-type semiconductor regions 203A and 203B are disposed with a channel region 212 sandwiched therebetween, one atop the other in such a manner that the channel region 211 or 212 of at least one of the two thin film semiconductor layers 209 and 210 is disposed in an opposing relation to a back-gate 223.

In the drawing, indicated as 201 is a holding substrate made of glass, silicon, aluminum or the like, indicated as SL is a layer formed by an insulator (dielectric material) made of $SiO_2$ or the like which surrounds the thin film semiconductor layers 209 and 210 and which is disposed between the thin film semiconductor layers 209 and 210, i.e., in a region 204, and also between the holding substrate 201 and the thin film semiconductor layer 209.

Figure 18:
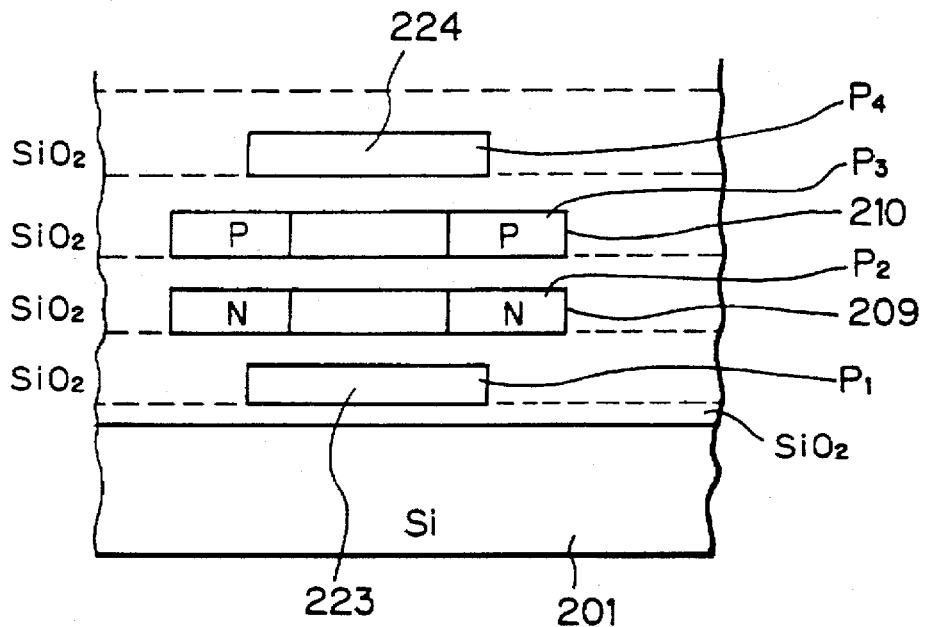
FIG. 18 is a view explaining a manufacturing method of the memory element which is used in the semiconductor memory device according to the present invention.

The semiconductor memory devices of the respective embodiments of the present invention are, as shown in FIG. 18, each formed by laminating a back-gate and a plurality of thin film semiconductor layers, with an $SiO_2$ film forming an insulator layer interposed therebetween, on a supporting substrate 201 which is made of p-type silicon or the like. The thin film semiconductor layers and the back-gate are all preferably made of polycrystalline silicon.

The two embodiments of the present invention require that the two different types of thin film semiconductor layers are separately formed and the back-gate 220 or 223 is disposed separately in an opposed relation to the channel region of at least one of the thin film semiconductor layers. However, in the present invention, one of the thin film semiconductor layers, or one side thin film semiconductor layer, namely, the second thin film semiconductor layer 208 of FIG. 12, and the first thin film semiconductor layer 209 of FIG. 15, may be formed within the supporting substrate 201 as shown in FIGS. 13 and 16. In such a case, it is not necessary to form the back-gate 220 or 223 separately, but rather, a substrate potential may be used as the back-gate potential, which simplifies the fabrication of the semiconductor memory device and stabilizes the electrical characteristics of the semiconductor memory device.

In FIG. 16, the back-gate 220 or 223 may be formed as a p-type region P+of a high impurity concentration within a p-type well or the p-type silicon substrate 201. Instead of thus forming the p-type well locally heavily doped, the p-type well may be formed so that the same potential can be applied to the p-type well.

Although the two embodiments of the present invention each require that the back-gate be disposed in a facing relation with the channel region which is disposed in one of the thin film semiconductor layers which are formed in the memory elements, the present invention is not limited to these embodiments. Rather, back-gates may be disposed so as to face both of the thin film semiconductor layers.

FIG. 14 shows the embodiment of the third aspect as modified such that in addition to the back-gate 220 which is used in FIG. 12, a back-gate 221 is disposed in an opposing relation with the channel region 206A which corresponds to the thin film semiconductor layer 207. FIG. 17 shows the embodiment of the fourth aspect as modified such that in addition to the back-gate 223 which is used in FIG. 15, a back-gate 224 is disposed in an opposing relation with the channel region 212 which corresponds to the thin film semiconductor layer 210.

In FIG. 17, indicated at 201 is a holding substrate made of glass, silicon, aluminum or the like, indicated at SL is a layer formed by an insulator (dielectric material) made of $SiO_2$ or the like which surrounds the thin film semiconductor layers 209 and 210 and which is disposed between the thin film semiconductor layers 209 and 210 and also between the holding substrate 201 and the thin film semiconductor layer 209.

The back-gates 220 and 221 of this embodiment may be made of heavily n-type or p-type doped polysilicon or metal such as aluminum Al and tungsten W. The holding substrate 201 may be made of glass, silicon, aluminum or the like.

Indicated as SL is a layer formed by an insulator (dielectric material) made of $SiO_2$ or the like which surrounds the thin film semiconductor layers 207 and 208 and which is disposed between the thin film semiconductor layers 207 and 208, i.e., in a region 204, and also between the holding substrate 201 and the thin film semiconductor layer 208.

Figure 19:
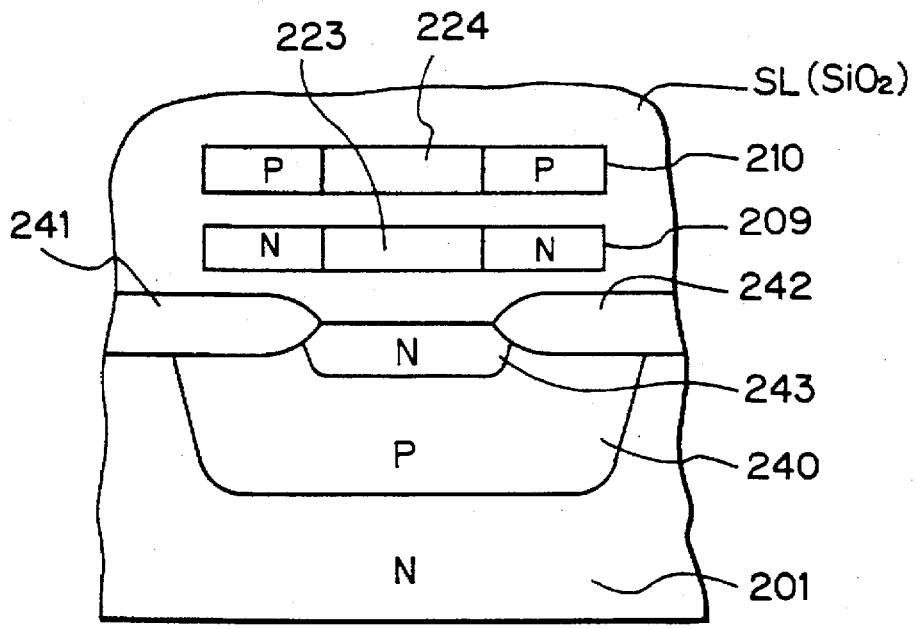
FIG. 19 is a view showing another embodiment of the fourth aspect of the present invention.
Figure 20A:
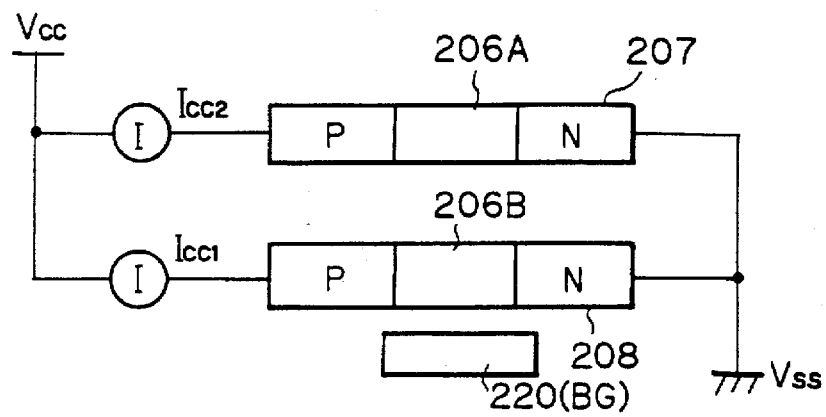
FIGS. 20(A) and 20(B) are views explaining a method and a result of measurement of the electrical characteristics of a thin film semiconductor layer of the memory element of the present invention.
Figure 20B:
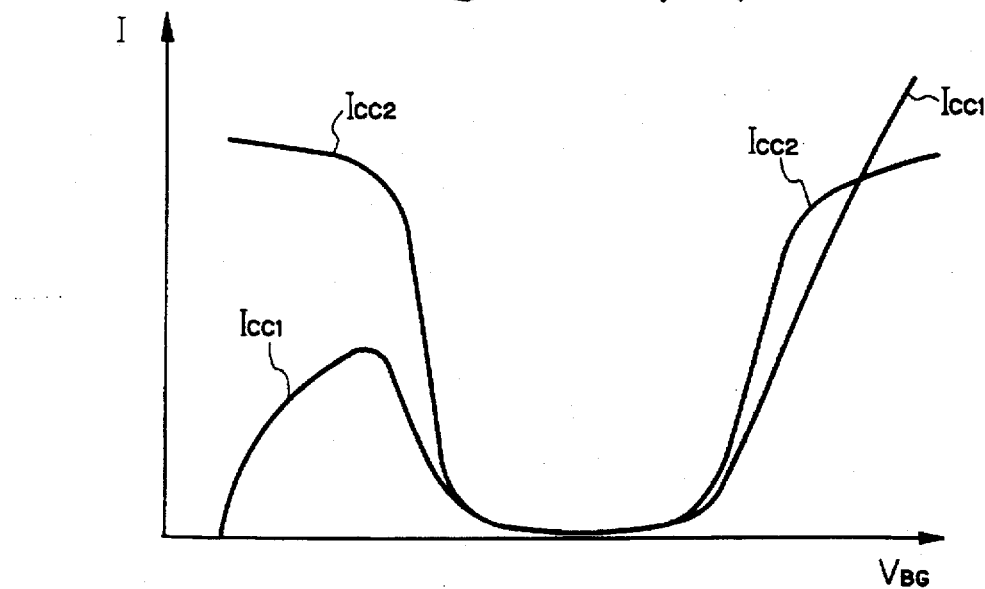

Further, as another example of a memory element in accordance with present invention, the two types of thin film semiconductor layers 207 and 208 or 209 and 210 may be formed separately and the back-gate facing the channel region of one of the thin film semiconductor layers may be formed within the substrate. FIG. 19 is a view for explaining such an embodiment.

More particularly, in FIG. 19, a well part 240 is formed by a p-type semiconductor within an n-type semiconductor substrate. In the well part 240, element isolation regions 241 and 242 are disposed which are formed by a field oxide film made of $SiO_2$ or the like, concurrently with which predetermined ions are implanted by a standard ion-implanting method into a region between the element isolation regions 241 and 242, followed by an appropriate annealing process, photo process, oxidation process and other process to thereby define an n-type gate region 243. The n-type gate region 243 may be used as a back-gate electrode in the present invention.

Indicated as SL is a layer formed by an insulator (dielectric material) made of $SiO_2$ or the like which surrounds the thin film semiconductor layers 209 and 210 and which is disposed between the thin film semiconductor layers 209 and 210 and also between the holding substrate 201 and the thin film semiconductor layer 209.

When considering an OFF-current initiated in the channel-capacitor type memory element and the channel-gate transistor type memory element as above, the inventor of the present invention has conducted a study on the current of concern and found that the memory elements have different electrical characteristics, especially driving characteristics and threshold values $V_{th}$ at device ON/OFF since the memory elements are not manufactured exactly the same. Considering the reality that it is impossible to manufacture the memory elements without such difference when managing the fabrication processes, the inventor of the present invention has considered a possibility of solving the problem by adjusting the individual devices and found that the adjustment of the characteristics of the respective thin film semiconductor layers is achievable by providing a back-gate and adjusting the potential of the same.

In other words, in the present invention, it is preferable to attain the enhance mode by shifting the threshold value $V_{th}$ for forming the channels in the thin film semiconductor layers by a predetermined amount using the back-gate potential, for example, by setting the threshold value $V_{th}$ of the thin film semiconductor layers to 0V or larger.

In addition to this, especially in the channel-gate transistor type memory element, by adjusting a ratio in transconductance between the n-type semiconductor regions and the p-type semiconductor regions which form the thin film semiconductor layers to be more balanced, the driving characteristics, in particular, are balanced between two pairs of memory elements forming the flip-flop so that the flip-flop would operate without error and without operation failure.

Next, a description will be given briefly of a method of manufacturing the memory elements in accordance with the present invention.

Figure 24:
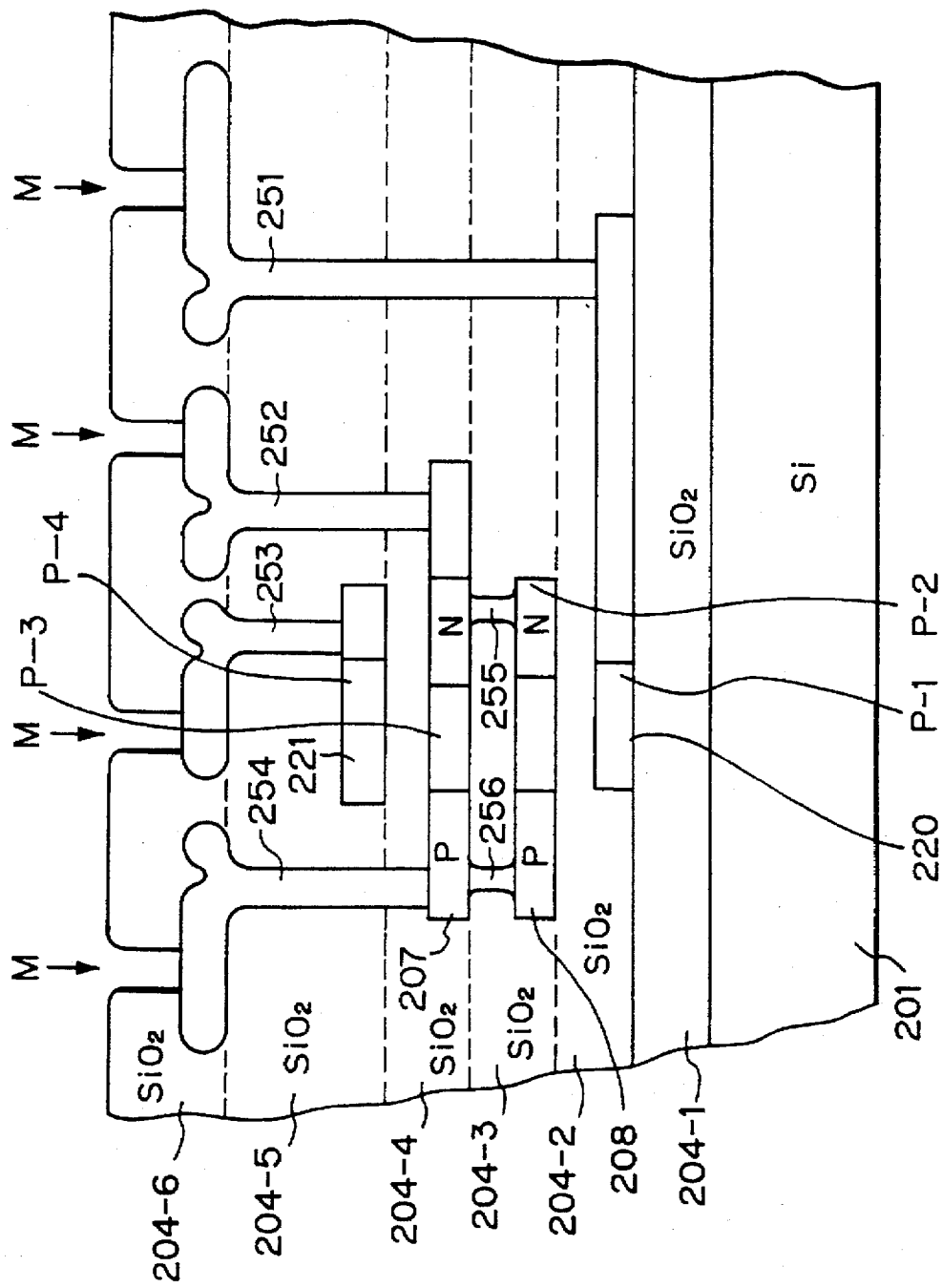
FIG. 24 is a view explaining the construction of the memory element according to the present invention.

FIG. 24 is a view for explaining a manufacturing method of the channel-gate transistor type memory element. Fabrication of the channel-gate transistor type memory element is attained in a similar manner.

In FIG. 24, first, a first layer P1 which is made of polycrystalline silicon and which is to serve as the first back-gate 220 is formed on the holding substrate 201 which is made of, for instance, silicon Si through an insulator film 204-1 which is made of $SiO_2$. The insulator film 204-1 is covered with an insulator film 204-2 which is made of $SiO_2$.

On the insulator film 204-2, a second layer P2 is formed which is made of polycrystalline silicon and which is to serve as the second thin film semiconductor layer 208. The insulator film 204-2 is covered with an insulator film 204-3 which is made of $SiO_2$.

Next, on the insulator film 204-3, a third layer P3 is formed which is made of polycrystalline silicon and which is to serve as the first thin film semiconductor layer 207. The insulator film 204-3 is covered with an insulator film 204-4 which is made of $SiO_2$.

Further, on the insulator film 204-4, a fourth layer P4 is formed which is made of polycrystalline silicon and which is to serve as the second back-gate 221. The insulator film 204-4 is covered with an insulator film 204-5 which is made of $SiO_2$.

Following this, as shown in FIG. 24, electrodes 251 to 256 of aluminum are disposed in contact with the back-gates 220 and 221 and the thin film semiconductor layers 207 and 208 to supply predetermined potentials to the back-gates 220 and 221 and the thin film semiconductor layers 207 and 208, completing the fabrication.

The polycrystalline silicon layers are each processed by a photolithography and ion-implantation (I, I) process and an annealing process to activate specific ion species to thereby locally form a p-type portion, an n-type portion and an non-doped portion.

In the embodiment, the holding substrate 201 may not be made of silicon. In addition, the conductivity of the substrate 201 may be the p-type or the n-type.

Moreover, in the drawing, openings M formed in an insulator film 204-6 which is made of $SiO_2$ provide measurement pads for insertion of measurement probes to the electrodes 251 to 254.

Next, the inventor of the present invention considered the possibility of utilizing the semiconductor memory devices hereinabove described as a memory cell which is capable of optionally writing and reading any desired information, and has studied, through various experiments, problems associated with use of one of such semiconductor memory devices as a memory cell or a plurality of such semiconductor memory devices which are arraying as a memory array.

It was found as a result of the study that in the semiconductor memory devices shown in FIGS. 12 to 17 each having the channel-capacitor type structure, for example, writing of appropriate information between the first and the second thin film semiconductor layers 207 and 208 or reading of a charge held between the first and the second thin film semiconductor layers 207 and 208 as information cannot be attained correctly when a portion of each back-gate is utilized as a gate for writing or an element for reading.

That is, in the constructions above, for example, a predetermined potential is created between the gate for writing and the back-gate, or between the back-gate and the element for reading, or between the gate for writing and the element for reading, and the intermediate potential is regarded as a holding voltage. When a potential held is higher than the holding voltage, it is decided that "H" level information is stored while if a potential held is lower than the holding voltage, it is decided that "L" level information is stored. The memory operation is carried out by using such hysteresis.

This approach, however, has the problems as described above. As a result of studying the cause of these problems, the following was found. In the semiconductor memory device structured as above, use of the back-gate merely as the gate for writing or the element for reading creates a situation where an electric field strength developed in the back-gate which is used as the gate for writing or the element for reading exceeds an electric field strength developed by a charge held between the first and the second thin film semiconductor layers 207 and 208. This makes it impossible to correctly read the information which is held between the first and the second thin film semiconductor layers 207 and 208.

That is, in the semiconductor memory device structured as above, since the electric field strength developed in the back-gate which is used as the gate for writing or the element for reading exerts influence on the channel regions of the first and the second thin film semiconductor layers 207 and 208, holding of information (hysteresis) due to interaction between the channel regions of the first and the second thin film semiconductor layers 207 and 208 cannot be sufficiently assured.

One of the approaches to solving this problem is to dispose a thick insulator layer between the back-gates 220 and 221 and the first and the second thin film semiconductor layers 207 and 208. However, adjustment by means of such an insulator layer alone would not ensure enough hysteresis. In addition, since as a potential at the back-gate which is used as the gate for writing or the element for reading, a voltage must be used which can be adjusted in order not to destroy the information which is held between the first and the second thin film semiconductor layers 207 and 208 (e.g., ½ $V_{cc}$), thus leading to complexity of the control system.

The inventor of the present invention has conducted careful research and discussion in light of this and developed a semiconductor device which is tailored as explained below and which can serve as a memory cell which is formed by the semiconductor device described above and which is capable of correctly and easily performing reading and writing of information.

Figure 25:
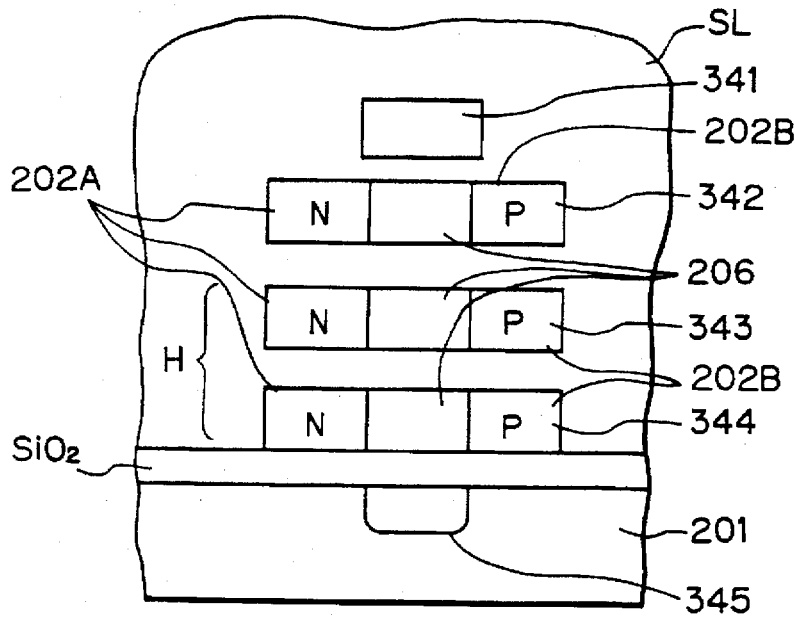
FIG. 25 is a side view showing a third aspect of the present invention regarding the configuration of a memory cell using the memory element of the present invention.

As a third aspect, in FIG. 25, there is illustrated a semiconductor memory device including a memory element 340 which is formed by laminating a first thin film semiconductor layer 343 and a second thin film semiconductor layer 344, in each of which a semiconductor region of a first conductivity type 202A and a semiconductor region of a second conductivity type 202B are disposed with a channel region 206 sandwiched therebetween, one atop the other in such a manner that semiconductor regions 202A having the first conductivity type of the two thin film semiconductor layers 343 and 344 are opposed to each other and the semiconductor regions 202B having the second conductivity type of the two thin film semiconductor layers 343 and 344 are opposed to each other. In addition, the semiconductor memory device comprises a gate for writing 341 which is disposed in a facing relation with the channel region 206 of one of the thin film semiconductor layers 343 and 344 and a fifth thin film semiconductor layer 342 which is disposed between one of the thin film semiconductor layers 343 and 344 and the gate for writing 341, the fifth thin film semiconductor layer 342 including a semiconductor region of the first conductivity type 202A and a semiconductor region of the second conductivity type 202B disposed with a channel region 206 sandwiched therebetween.

In FIG. 25, in an opposing relation to the channel region 206 of the thin film semiconductor layer 344, which is on the opposite side of the thin film semiconductor layer 343 to the gate for writing 341, a back-gate 345 is disposed.

In this embodiment, the back-gate 345 is an n-type silicon diffusion region which is formed in a p-type well or a p-type substrate 201.

In FIG. 25, indicated as SL is a layer formed by an insulator (dielectric material) made of $SiO_2$ or the like which surrounds the thin film semiconductor layers 342, 343 and 344 and which is disposed between the thin film semiconductor layers 342, 343 and 344.

Figure 26:
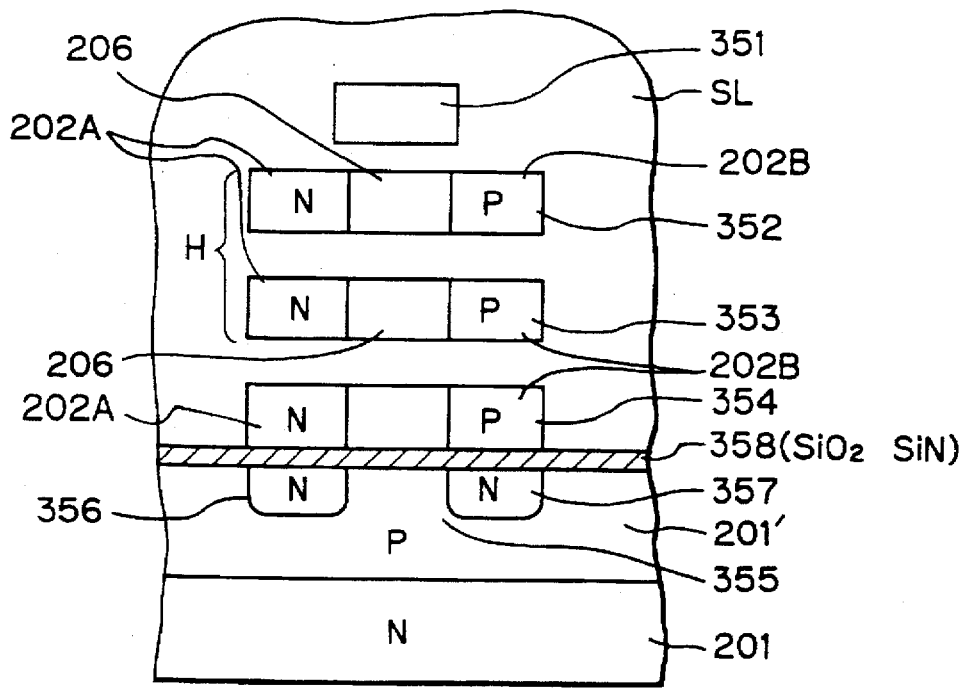
FIG. 26 is a side view showing a fourth aspect of the present invention regarding the configuration of a memory cell using the memory element of the present invention.

Further, as a fourth aspect, as shown in FIG. 26, a semiconductor memory device comprises a memory element 350 which is formed by laminating a first thin film semiconductor layer 352 and a second thin film semiconductor layer 353, in each of which a semiconductor region of a first conductivity type 202A and a semiconductor region of a second conductivity type 202B are disposed with a channel region 206 sandwiched therebetween, one atop the other in such a manner that semiconductor regions 202A having the first conductivity type of the two thin film semiconductor layers are to opposed to each other and the semiconductor regions 202B having the second conductivity type of the two thin film semiconductor layers are opposed to each other. The semiconductor memory device also comprises an element 355 for reading which is located in a facing relation to the channel region 206 of the thin film semiconductor layer 353 and a sixth thin film semiconductor layer 354 which is disposed between the thin film semiconductor layer 353 and the element for reading 355, the sixth thin film semiconductor layer 354 including a semiconductor region of the first conductivity type 202A and a semiconductor region of the second conductivity type 202B disposed with a channel region 206 sandwiched therebetween.

As the element for reading 355 of this embodiment, a transistor is used which is formed by n-type diffusion regions 356 and 357 which are formed within a p-type semiconductor layer 201' which is disposed on an n-type holding substrate 201.

Further, in the embodiment shown in FIG. 26, an insulator film 358 made of silicon $SiO_2$, silicon nitride SiN or the like is disposed between the element for reading 355 and the sixth thin film semiconductor layer 354.

In the drawing, indicated as SL is an insulator layer which forms a dielectric member made of $SiO_2$ or SiN which surrounds the thin film semiconductor layers 352, 353 and 354 and which is disposed between the thin film semiconductor layers 352, 353 and 354.

In an opposing relation to the channel region 206 of the thin film semiconductor layer 352, which is on the opposite side of the thin film semiconductor layer 353 to the element for reading 355, a back-gate 351 is disposed.

Figure 27:
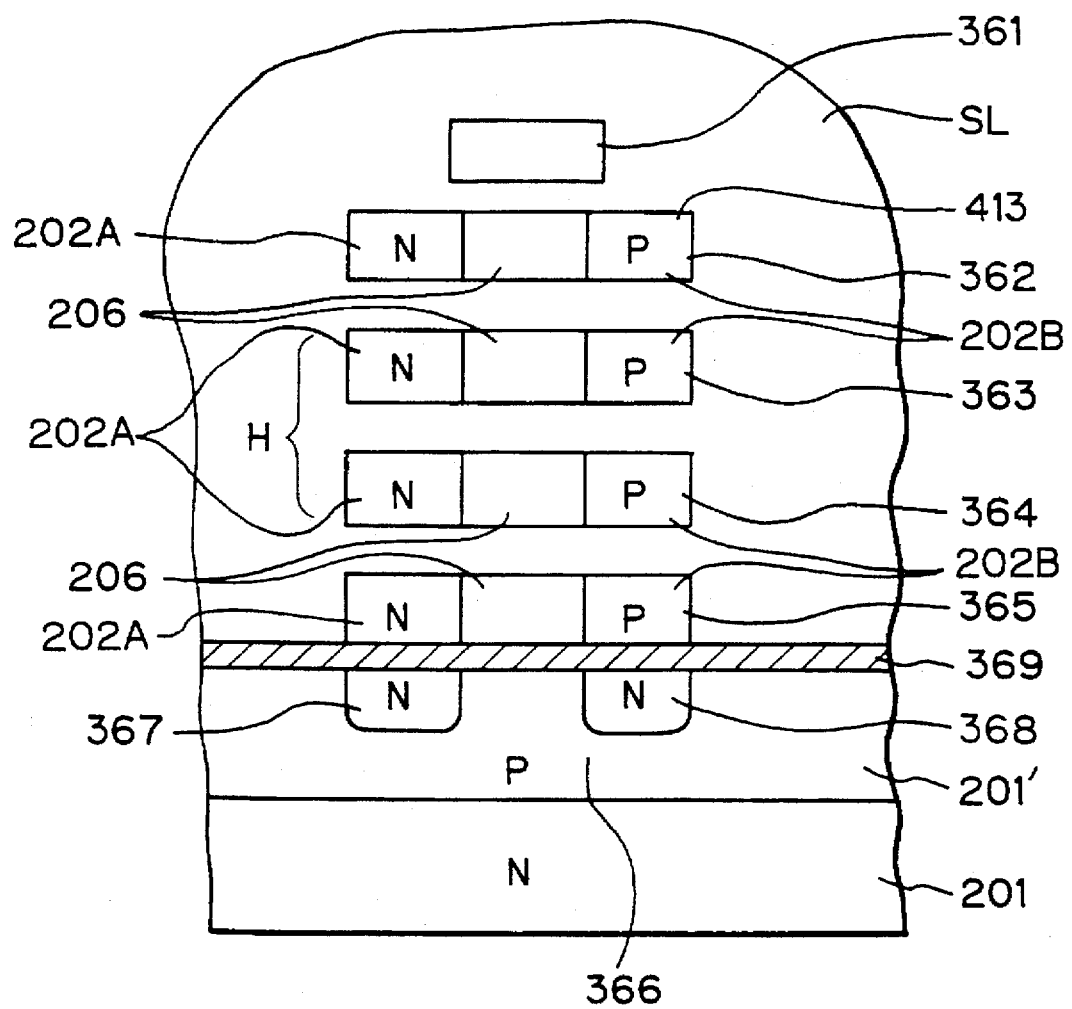
FIG. 27 is a side view showing a fifth aspect of the present invention regarding the configuration of a memory cell using the memory element of the present invention.

As still a fifth aspect, as shown in FIG. 27, a semiconductor memory device comprises a memory element 360 which is formed by laminating a first thin film semiconductor layer 363 and a second thin film semiconductor layer 364, in each of which a semiconductor region of a first conductivity type 202A and a semiconductor region of a second conductivity type 202B are disposed with a channel region 206 sandwiched therebetween, one atop the other in such a manner that semiconductor regions 202A having the first conductivity type of the two thin film semiconductor layers are opposed to each other and the semiconductor regions 202B having the second conductivity type of the two thin film semiconductor layers are opposed each other. The semiconductor memory device also comprises a gate 361 for writing which is located in a facing relation to the channel region 206 of the thin film semiconductor layer 363 and an element 366 for reading which is located in a facing relation to the channel region 206 of the other thin film semiconductor layer 364. Between the thin film semiconductor layer 363 and the gate 361 for writing and between the thin film semiconductor layer 364 and the element 366 for reading, a fifth thin film semiconductor layer 362 and a sixth thin film semiconductor layer 365 are disposed, respectively. The fifth and the sixth thin film semiconductor layers 362 and 365 each includes a semiconductor region of the first conductivity type 202A and a semiconductor region of the second conductivity type 202B disposed with a channel region 206 sandwiched therebetween.

In this embodiment, and likewise in the embodiment shown in FIG. 26, as the element 366 for reading, a transistor is used which is formed by n-type diffusion regions 367 and 368 which are formed within a p-type semiconductor layer 201' which is disposed on an n-type holding substrate 201, for example.

Further, in the embodiment shown in FIG. 27, an insulator film 369 which is made of silicon $SiO_2$, silicon nitride SiN or the like is disposed between the element 366 for reading and the sixth thin film semiconductor layer 365.

In the drawing, indicated as SL is a layer formed by an insulator layer which forms a dielectric member made of $SiO_2$ or SiN which surrounds the thin film semiconductor layers 362, 363, 364 and 365 and which is disposed between the thin film semiconductor layers 362, 363, 364 and 365.

More particularly, the third aspect above requires that at least three, preferably four, of the thin film semiconductor layers which are used in the semiconductor memory devices shown in FIGS. 12 to 17 are superimposed one atop the other, the gates for writing 341 or 361 are disposed above or below the channel capacitor which is formed by the laminated thin film semiconductor layers, and that the fifth thin film semiconductor layer 342 or 362 is disposed as a buffer layer between the gate for writing and the channel capacitor.

The first and the second thin film semiconductor layers 343 and 344 in FIG. 25, or 363 and 364 in FIG. 27 form a charge holding layer H in the memory element while the fifth thin film semiconductor layer 342 or 362 forms a buffer layer between the gate for writing 341 or 361 and the holding layer.

The semiconductor region 202A of the first conductivity type and the semiconductor region 202B of the second conductivity type which form the buffer layer, or the fifth thin film semiconductor layer, respectively face the semiconductor region 202A of the first conductivity type and the semiconductor region 202B of the second conductivity type of the first or the second thin film semiconductor layers 343, 344 or 363, and 364 forming the holding layer H.

On the other hand, the semiconductor memory device 350 in FIG. 26 in accordance with the fourth aspect is similar in structure to the device of the third aspect. At least three, preferably four, of the thin film semiconductor layers above are superimposed one atop the other. The elements for reading 355 in FIG. 26 or 366 in FIG. 27 are disposed above or below the channel capacitor which is formed by the laminated thin film semiconductor layers. The sixth thin film semiconductor layer 354 or 365 is disposed as a buffer layer between the element 355 or 366 for reading and the channel capacitor.

The semiconductor region 202A of the first conductivity type and the semiconductor region 202B of the second conductivity type which form the sixth thin film semiconductor layer 354 or 365 are disposed in a faced relation with the semiconductor region 202A of the first conductivity type and the semiconductor region 202B of the second conductivity type of the first or the second thin film semiconductor layers 352, 353 or 363, and 364 forming the holding layer H.

Still further, as shown in FIG. 27, the semiconductor memory device of the fifth embodiment comprises the gate 361 for writing and the element 366 for reading both at the same time, thereby realizing a memory cell which is capable of both writing and reading information.

The elements 355 and 366 for reading of the present invention as described above are preferably formed by transistors, and more preferably, by field effective transistors (FET).

Each field effective transistor (FET) of the present invention must be disposed in such a manner that its channel portions face the channel region 206 which forms the sixth thin film semiconductor layer 354 or 365.

In addition, the field effective transistors (FET) of the present invention which form the element for reading are preferably formed within the substrate 201.

In the semiconductor memory device composing the memory cell in accordance with the present invention, between the respective thin film semiconductor layers, between the thin film semiconductor layer and the gate for writing, and between the element for reading and the thin film semiconductor layer, predetermined gauges are formed by insulator films each formed by an oxide film or the like of a proper thickness.

As a further preferred embodiment of the present invention, the insulator film disposed between the thin film semiconductor layer 342 or 362, which forms the buffer layer, and the gate for writing 341 or 361 or the insulator film between the thin film semiconductor layer 354 or 365, which forms the buffer layer, and the element for reading 355 or 366 is preferably thicker than the insulator films between the respective thin film semiconductor layers.

For example, when the insulator film between the buffer layer 342 or 362 and the gate for writing 341 or 361 or the insulator film between the buffer layer 354 or 365 and the element for reading 355 or 366 is to be 500 angstroms, the insulator films between the respective thin film semiconductor layers including the buffer layers are each to be 200 angstroms.

Further, in the memory cell of the present invention, wirings are connected to the semiconductor regions 202A of the first conductivity type and the semiconductor regions 202B of the second conductivity type which constitute the respective thin film semiconductor layers in order to supply predetermined potentials to the semiconductor regions 202A and the semiconductor regions 202B. In one embodiment, through the wirings, the same potentials are applied to the semiconductor regions 202A of the first conductivity type of all thin film semiconductor layers which form the memory cell, while potentials equal to each other and different from the potentials which are applied to the semiconductor regions 202A are applied to the semiconductor regions 202B of the second conductivity type of all thin film semiconductor layers which form the memory cell.

In another embodiment, the same or different potentials are selectively applied to the semiconductor regions 202A of the first conductivity type and the semiconductor regions 202B of the second conductivity type of all thin film semiconductor layers which form the memory cell. To this end, a proper voltage supply control means is provided which is connected to the wirings and which is comprised of a voltage selection circuit and a wiring switching circuit.

Now, the construction and the operation of the memory cell in accordance with the present invention will be described with reference to the memory cell of the fifth aspect.

As shown in FIG. 27, according to a first embodiment of the fifth aspect of the present invention, the thin film semiconductor layers are laminated in a four-layer construction with the insulator layers interposed therebetween (first layer ... 365, second layer ... 364, third layer ... 363, fourth layer ... 362) in such a manner that semiconductor regions of the same conductivity type face each other. In an opposing relation to the channel region of the fourth thin film semiconductor layer which forms one end of the lamination of the layers, the gate for writing 361 is disposed with the interposing insulator layer. In an opposing relation to the channel region of the thin film semiconductor layer 365 which forms the other end of the lamination of the layers, the element for reading 366 is disposed with the interposing insulator layer.

The second and the third layers form the holding layer H for holding a charge while the first and the fourth layers each form the buffer layer.

In the first embodiment, a high potential equal to or larger than $V_{cc}$ or smaller than $V_{ss}$ is applied to the gate for writing 361 to forcibly control the channels of the fourth layer, whereby predetermined information is written in the holding layer H.

If the potential given to the gate for writing is maintained in the dead band ranging between $V_{cc}$ to $V_{ss}$, e.g., at a potential $(V_{cc}-V_{ss})/2$ during an operation other than writing, the state of the holding layer H would not change, preserving the information which is written therein.

On the other hand, a MOSFET 366 is disposed below the channel of the first layer, for use as an element for reading which is formed in the bulk 201.

Since the potential of the well or the substrate 201 is applied to the channel portion of the MOSFET during OFF-operation of the transistor, the buffer layers described above are necessary.

Next, the writing operation and the reading operation of the memory cell of the above embodiment will be described with reference to FIGS. 28(A1) to 28(D2).

Figure 28:
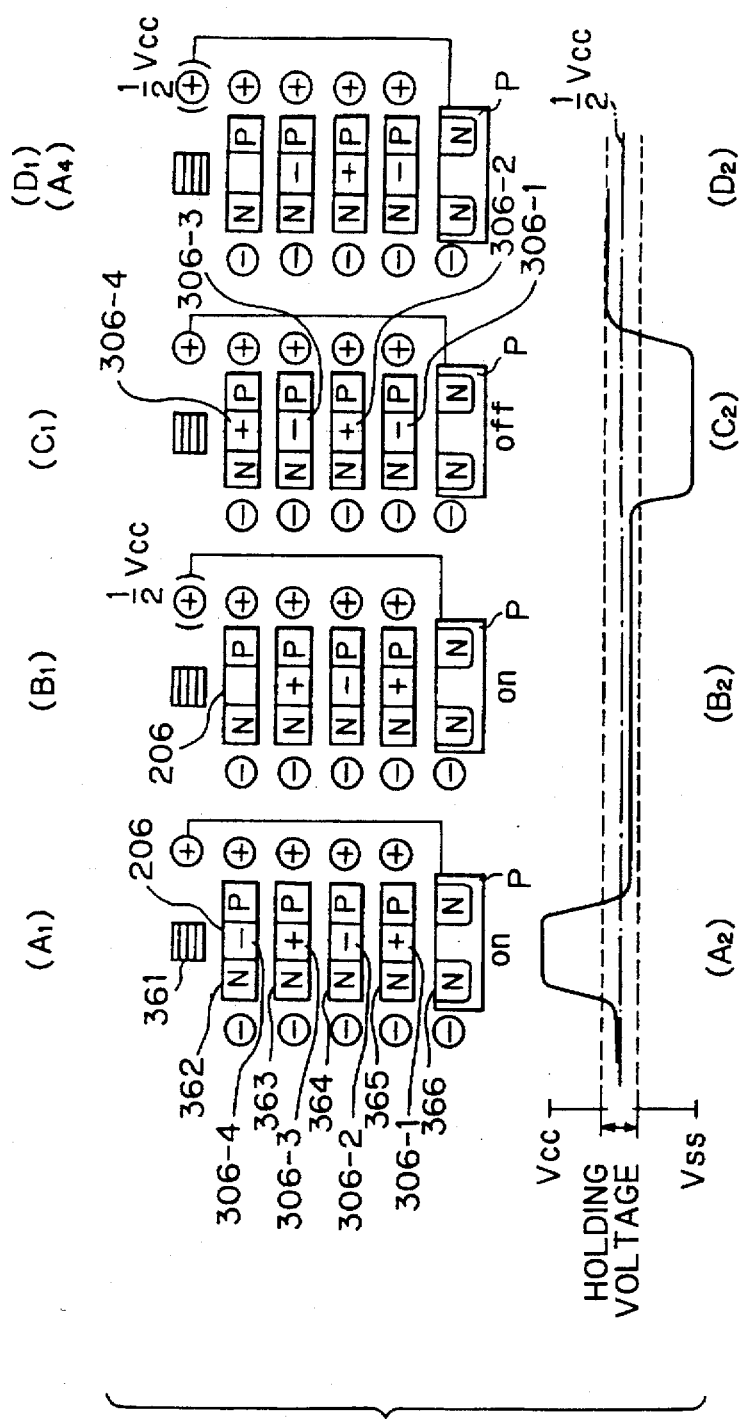
FIGS. 28(A1), 28(A2), 28(B1), 28(B2), 28(C1), 28(C2), 28(D1) and 28(D2) are views explaining memory operation with reference to the memory cell which has the construction of the fifth aspect of the present invention.

FIGS. 28(A1) to 28(D2) show an example of the operations of where the memory cell is driven alone. The same low potentials, e.g., $V_{ss}$ are applied to the semiconductor regions 202A of the first conductivity type, e.g., the n-type, of the four thin film semiconductor layers. The same high potentials, e.g., $V_{cc}$ are applied to the semiconductor regions 202B of the second conductivity type, e.g., the p-type, of the four thin film semiconductor layers.

In FIG. 28(A1), there is illustrated the operation for writing "H" level information in the memory cell. In this case, a high potential voltage is applied to the gate 361 for writing, with the result that the potential at a channel 306-4 of the fourth layer 362 changes to the "L" level, further causing the potential at a channel 306-3 of the third layer 363 to change to the "H" level. This in turn causes the potential at a channel 306-2 of the second layer 364 to change to the "L" level, thereby switching the potential at a channel 306-1 of the first layer 365 turns to the "H" level. As a result, the MOSFET 366 turns on.

In FIG. 28(A2), the voltage at a bit line surges to $V_{cc}$, which is the H-data writing voltage. When the writing is completed as shown in FIG. 28(B2), a voltage representing "H" data is held in the holding layer.

In this case, the bit line BL which reads the "H" data is held at a potential a little bit lower than $\frac{1}{2}(V_{cc}-V_{ss})$.

In FIG. 28(B1), there is illustrated the operation for reading the "H" level information which is held in the memory cell. Since the charge held in the holding layer H causes the channel of the first layer to stay at a high potential, the MOSFET 366 turns conductive, in response to which the potential at the bit line which read the "H" data, i.e., the potential a little bit lower than $\frac{1}{2}(V_{cc}-V_{ss})$, is detected.

In this case, the potential at the gate 361 for writing is set at around $\frac{1}{2}(V_{cc}-V_{ss})$.

Conversely, in FIG. 28(C1), there is illustrated the operation for writing "L" level information in the memory cell. For such an operation, a low potential voltage is applied to the gate 361 for writing. As a result, the potential at the channel 306-4 of the fourth layer 362 turns to the "H" level, the potential at the channel 306-3 of the third layer 363 turns to "L" level, the potential at the channel 306-2 of the second layer 364 turns to the "H" level, and the potential at the channel 306-1 of the first layer 365 turns to the "L" level, whereby the MOSFET 366 turns off.

In FIG. 28(C2), the bit line voltage changes to $V_{ss}$, which is the L-data writing voltage. Following this, as shown in FIG. 28(C2), a voltage representing "L" data is held in the holding layer.

In this case, a voltage $V_{BL}$ which represents the potential at the bit line which read the "L" data is held at a potential slightly higher than $\frac{1}{2}(V_{cc}-V_{ss})$.

In FIG. 28(D1), there is illustrated the operation for reading the "L" level information which is held in the memory cell. Since the charge which is held in the holding layer H causes the channel of the first layer to stay at a low potential, the MOSFET 366 turns non-conductive, in response to which the potential at the bit line which read the "L" data, i.e., the potential slightly higher than $\frac{1}{2}(V_{cc}-V_{ss})$, is detected.

In this case, the potential at the element 366 for writing is set at around $\frac{1}{2}(V_{cc}-V_{ss})$.

More particularly, in this embodiment, the two voltages respectively representing the information to be read have an extremely small difference therebetween, for example, a difference of about 0.1V in most cases. However, according to this embodiment, by utilizing a known voltage detection means or a current detection means conventionally employed in an SRAM, etc., it is possible to accurately detect the potential differential between the two voltages.

As to the thin film semiconductor layers 362 to 365 laminated as the first to the fourth layers of the first embodiment described above, it is to be noted that the insulator layers SL are omitted in the drawing for convenience of explanation. In reality, however, as shown in FIGS. 26 and 27 or other relevant drawings, the insulator layers SL each formed by an insulator (dielectric material) made of $SiO_2$ or the like are disposed around and between the thin film semiconductor layers 362 to 365.

It is also to be noted that the first embodiment is an example where the transistor part 366 is realized by forming an n-type diffusion region within a p-type semiconductor layer.

Figure 29A:
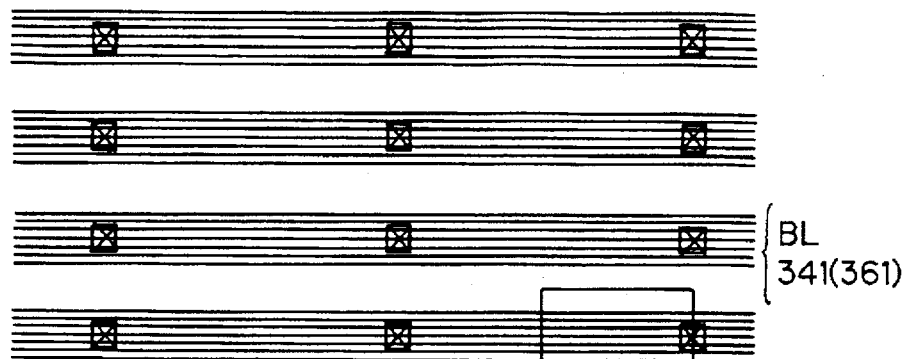
FIGS. 29(A), 29(B) and 29(C) are views showing a construction for realizing the memory operation of the memory cell which is shown in FIGS. 28(A1) to 28(D2)
Figure 29B:
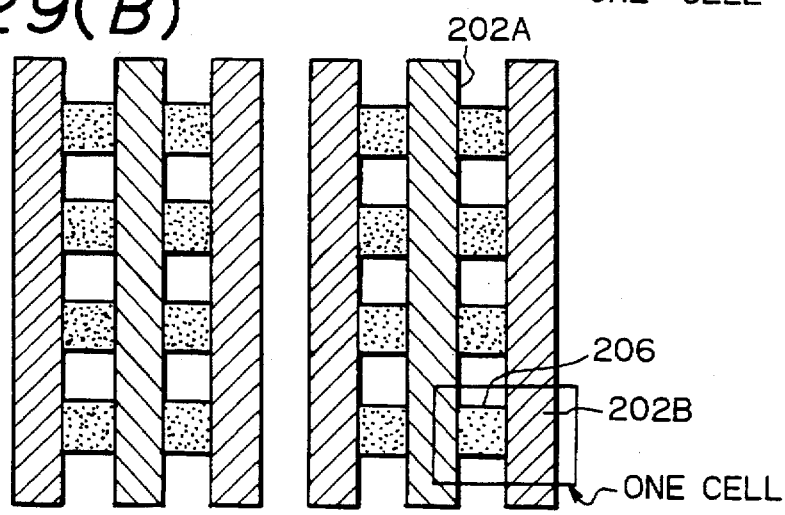
Figure 29C:
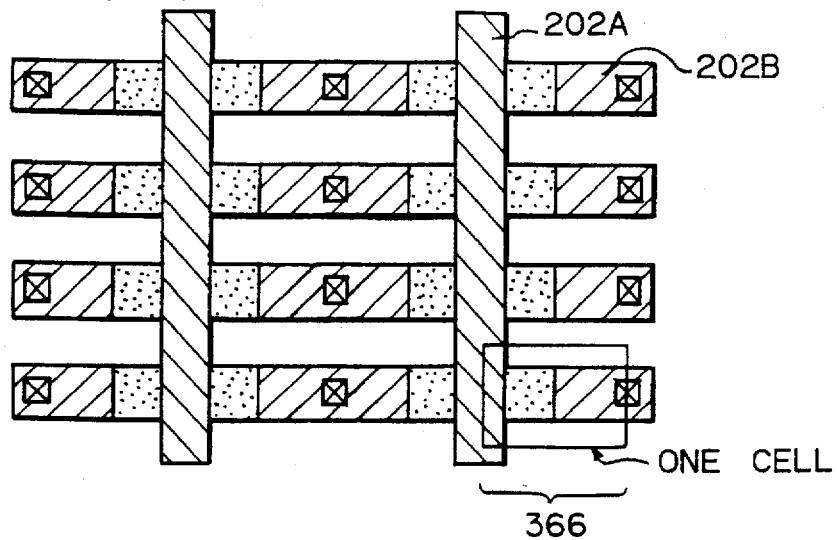

FIGS. 29(A) to 29(C) are plan views each showing a portion of the memory cell of the embodiment above as it is mounted on a predetermined substrate.

More precisely, FIG. 29(A) is a top plan view of the memory cell 360. There are shown conductive layers which are arranged in one direction in an insulator layer 370. 10 Each conductive layer functions both as the gate for writing 341 or 361, and a bit line BL.

FIG. 29(B) is a plan view showing one of the thin film semiconductor layers which form the first to the fourth layers. There is illustrated the semiconductor region 202A of the first conductivity type, e.g., the n-type, the semiconductor region 202B of the second conductivity type, e.g., the p-type, and the channel region 206 which is formed between the semiconductor region 202A and the semiconductor region 202B.

FIG. 29(C) is a plan view showing an arrangement of the element 366 for reading which is mounted on the substrate 201. In the drawing, a number of MOSFETs are formed within the bulk of the substrate 201.

In a memory cell of such a construction, it is possible to extend the bit lines in a horizontal direction, a vertical direction, an upward direction and a downward direction, and therefore, a memory cell array is easily obtained in which such memory cells are arranged in a great number of arrays.

The first layer 365 may be connected to a word line for reading and the fourth layer may be connected a word line for writing.

Next, another construction of the memory cell of the present invention will be described with reference to FIGS. 30(A) to (K).

This example described in the following is identical in structure to the embodiment described above but is different in terms of applied potentials. For the respective thin film semiconductor layers, different voltages are optionally selected and applied to the semiconductor regions 202A of the first conductivity type, e.g., the n-type, and the semiconductor regions 202B of the second conductivity type, e.g., the p-type.

More particularly, as can be clearly seen in FIG. 30(A) to (K), voltages each indicated with an arrow which differs from FIG. 28 to be applied to the semiconductor regions 202A of the first conductivity type, e.g., the n-type, and the semiconductor regions 202B of the second conductivity type, e.g., the p-type, are changed depending on the condition of the operation.

Figure 30:
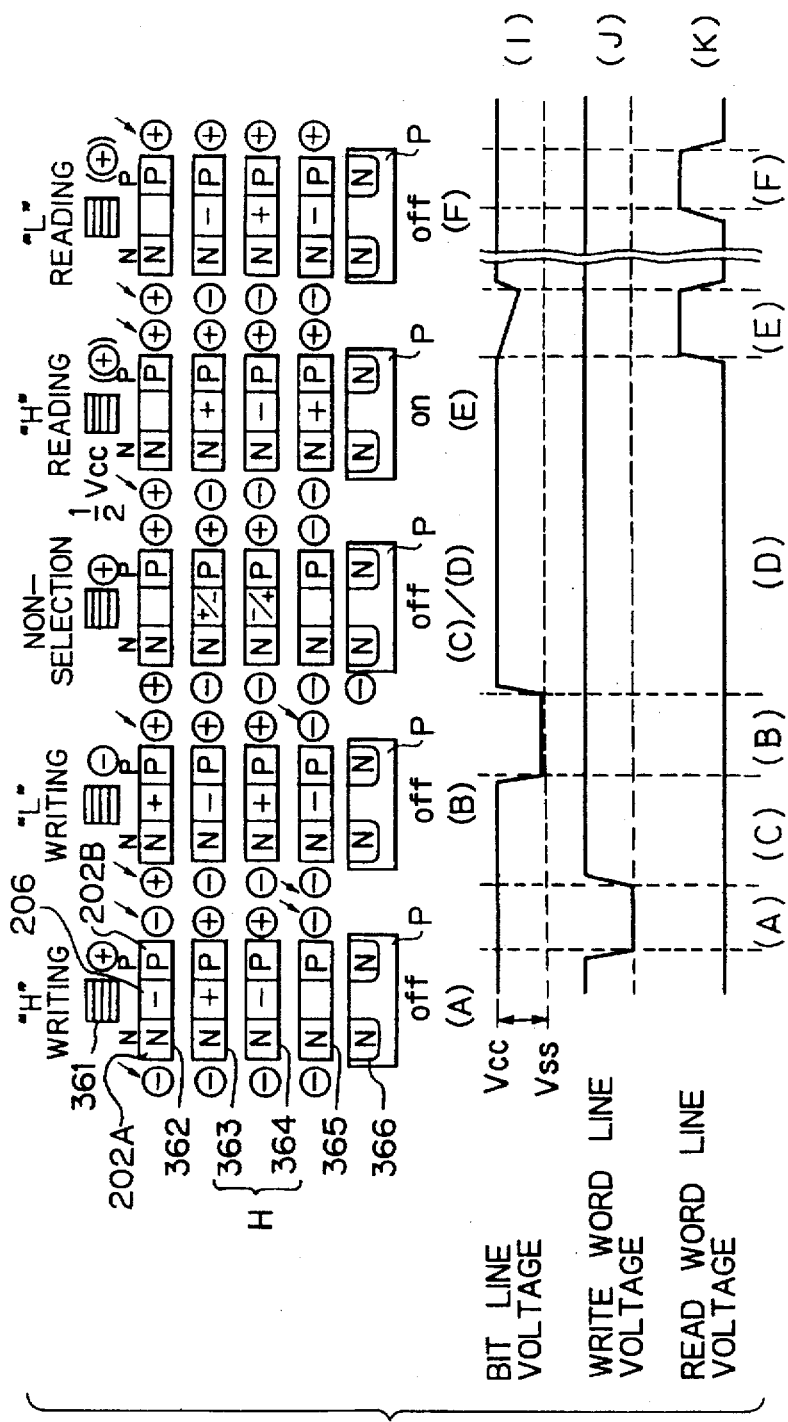
FIGS. 30(A), 30(B), 30(C), 30(D), 30(E), 30(F), 30(G), 30(H), 30(I), 30(J) and 30(K) are views showing a construction for realizing the memory operation of the third aspect memory cell construction shown in FIGS. 29(A) to 29(C)

That is, as shown in FIG. 30(A), writing of "H" data requires the following: the potential at the gate for writing is increased to "H" level; voltages to be applied to the semiconductor region 202A of the first conductivity type, e.g., the n-type, and the semiconductor region 202B of the second conductivity type, e.g., the p-type (same as below), of the fourth thin film semiconductor layer (362) are both set to the "L" level; potentials to be applied to the semiconductor regions 202A of the first conductivity type, e.g., the n-type, of the third and the second thin film semiconductor layers (363 and 364) are set to the "L" level; voltages to be applied to the semiconductor regions 202B of the second conductivity type, e.g., the p-type, of the third and the second thin film semiconductor layers (363 and 364) are set to the "H" level; and voltages to applied to the semiconductor region 202A of the first conductivity type, e.g., the n-type, and the semiconductor region 202B of the second conductivity type, e.g., the p-type (same as below), of the first thin film semiconductor layer (365) are both set to the "L" level.

Accordingly, the potential at the channel region 206 of the fourth layer becomes the "L" level. As a result, the potentials at the channel regions 206 of the third and the second layers are set to the "H" level and the "L" level, respectively.

However, in the first layer, since the voltages applied to the semiconductor region 202A of the first conductivity type and the semiconductor region 202B of the second conductivity type are both set at the "L" level, the channel region 206 of the first layer stays non-active and hence the MOSFET remains turned off. In this manner, the potential of the "H" level, which is the writing voltage, is stored in the holding layer H, particularly, in the channel region 206 which is formed in the third thin film semiconductor layer.

Also in this embodiment as that shown in FIGS. 28(A1) to 28(D2), as to the thin film semiconductor layers 362 to 365 laminated as the first to the fourth layers, it is to be noted that the insulator layers SL are omitted from the drawing for convenience of explanation. In reality, however, as shown in FIGS. 26 and 27 or other relevant drawings, the insulator layers SL each formed by an insulator (dielectric material) made of $SiO_2$ or the like are disposed around and between the thin film semiconductor layers 362 to 365.

It is also to be noted that this embodiment shows an example where the transistor part 366 is realized by forming an n-type diffusion region within a p-type semiconductor layer.

As understood from the waveforms shown in FIGS. 30(I) to 30(K), the writing gate voltage is set at the "H" level, e.g., $V_{cc}$ (waveform I). At the same time, the potentials applied to the semiconductor region 202A of the first conductivity type and the semiconductor region 202B of the second conductivity type of the fourth layer are both set at the "L" level, e.g., $V_{ss}$ (waveform J). The potential applied to the semiconductor region 202B of the second conductivity type of the first layer is set at the "L" level (waveform K).

In short, according to the embodiment above, the writing operation is achieved through the gate for writing. During the writing operation, the first thin film semiconductor layer is not activated to keep the MOSFET turned off. Hence, necessary information is stored in the channel regions 206 of the second and the third layers, i.e., the holding layer H.

Next, as shown in FIG. 30(E), reading of the information of the "H" data which is stored in the memory cell requires: the potential at the gate for writing being increased to the "H" level; voltages to applied to the semiconductor region 202A of the first conductivity type and the semiconductor region 202B of the second conductivity type of the fourth thin film semiconductor layer both being set at the "H" level; potentials to be applied to the semiconductor regions 202A of the first conductivity type, e.g., the n-type, of the third, the second and the first thin film semiconductor layers being set at the "L" level; and voltages to be applied to the semiconductor regions 202B of the second conductivity type, e.g., the p-type, of the third, the second and the first thin film semiconductor layers being set at the "H" level.

As a result, the channel region 206 of the fourth layer turns non-conductive, completely separating the potential at the gate for writing from the memory cell.

However, in the first layer, the channel region 206 becomes activated and changes to the "H" level because of the influence of the potentials at the channel regions of the second and the third layers, whereby the MOSFET turns on or becomes the "L" level and turns off.

That is, under this condition, the channel region 206 of the first layer becomes the "H" level or the "L" level in accordance with the potential at the channel region 206 of the second layer. Hence, in accordance with the potential, namely, information at the channel region 206 of the second layer, the MOSFET turns on and turns off.

By turning on the MOSFET, a potential representing the information which is stored in the holding layer is outputted to an element for reading.

Studying this condition using the waveforms shown in FIGS. 30(I) to 30(K) at the time period as shown as E, it is understood that the writing gate voltage is set to the "H" level, e.g., $V_{cc}$ (waveform I). At the same time, the potentials applied to the semiconductor region 202A of 10 the first conductivity type and the semiconductor region 202B of the second conductivity type of the fourth layer are both set to the "H" level, e.g., $V_{cc}$ (waveform J). The potential applied to the semiconductor region 202B of the second conductivity type, e.g., the p-type, of the first layer, that is, the reading word line are set to the "H" level (waveform K). Hence, the reading word line turns to the "H" level as shown in the waveform K, thereby reducing the level of the bit line a little bit lower than the "H" level as shown in the waveform I.

Thus, in the embodiment of the present invention described above, the reading operation is achieved from the lower portion of the memory cell.

Next, as shown in FIG. 30(B), writing of the "L" data requires: the potential at the gate for writing is set at the "L" level; voltages to applied to the semiconductor region 202A of the first conductivity type and the semiconductor region 202B of the second conductivity type of the fourth thin film semiconductor layer are both set to the "H" level; potentials to be applied to the semiconductor regions 202A of the first conductivity type of the third and the second thin film semiconductor layers are set to the "L" level; potentials to be applied to the semiconductor regions 202B of the second conductivity type of the third and the second thin film semiconductor layers are set to the "H" level; and voltages to applied to the semiconductor region 202A of the first conductivity type, e.g., the n-type, and the semiconductor region 202B of the second conductivity type, e.g., the p-type, of the first thin film semiconductor layer are both set to the "L" level.

As a result, the channel region 206 of the fourth layer becomes activated and turns to the "H" level. Accordingly, the potentials at the channel regions of the third and the second layers are set to the "L" level and the "H" level, respectively.

However, in the first layer, as mentioned earlier, since the voltages applied to the semiconductor region 202A of the first conductivity type and the semiconductor region 202B of the second conductivity type are both set to the "L" level, the channel region 206 of the first layer stays non-active and hence the MOSFET remains turned off. In this manner, the potential of the "L" level, which is the writing voltage, is stored in the holding layer H, particularly, in the channel region 206 which is formed in the third thin film semiconductor layer.

As understood from the waveforms shown in FIGS. 30(I) to 30(K) at the time period as shown as B, when in this condition, the writing gate voltage is set to the "L" level, e.g., $V_{ss}$ (waveform I). At the same time, the potentials applied to the semiconductor region 202A of the first conductivity type and the semiconductor region 202B of the second conductivity type of the fourth layer are both set to the "H" level, e.g., $V_{cc}$ (waveform J). The potential applied to the semiconductor region 202B of the second conductivity type, e.g., the p-type, of the first layer is set to the "L" level (waveform K).

That is, according to the embodiment above, the writing operation above is similar to the writing operation of the "H" data. During the writing operation, the first thin film semiconductor layer is not activated to keep the MOSFET turned off. Hence, necessary information is stored in the channel regions 206 of the second and the third layers, i.e., the holding layer H.

On the other hand, as shown in FIG. 30(F), reading of the information of the "L" data which is stored in the memory cell requires: the potential at the gate for writing being increased to the "H" level; voltages to applied to the semiconductor region 202A of the first conductivity type and the semiconductor region 202B of the second conductivity type of the fourth thin film semiconductor layer both being set at the "H" level; potentials to be applied to the semiconductor regions 202A of the first conductivity type, e.g., the n-type, of the third, the second and the first thin film semiconductor layers being set to the "L" level; and voltages to be applied to the semiconductor regions 202B of the second conductivity type, e.g., the p-type, of the third, the second and the first thin film semiconductor layers being set to the "H" level.

As a result, the channel region 206 of the fourth layer turns non-conductive, completely separating the potential at the gate for writing from the memory cell.

However, in the first layer, the channel region 206 becomes activated and changes to the "L" level because of the influence of the potentials at the channel regions 206 of the second and the third layers, whereby the MOSFET turns off.

In short, under such condition, the channel region 206 of the first layer becomes either the "H" level or the "L" level in accordance with the potential at the channel region 206 of the second layer. Hence, in accordance with the potential, namely, information at the channel region 206 of the second layer, the MOSFET turns on and turns off.

By turning on the MOSFET, a current which represents the information which is stored in the holding layer is outputted to an element for reading.

Observing this condition using the waveforms shown in FIGS. 30(I) to 30(K) at the time period as shown as F, it is understood that the writing gate voltage is set to the "H" level, e.g., $V_{cc}$ (waveform I). At the same time, the potentials applied to the semiconductor region 202A of the first conductivity type and the semiconductor region 202B of the second conductivity type of the fourth layer are both set to the "H" level, e.g., $V_{cc}$ (waveform J). The potential applied to the semiconductor region 202B of the second conductivity type, e.g., the p-type, of the first layer is set to "H" level (waveform K).

It is noted here that FIGS. 30(C) and 30(D) are provided to explain an example of the holding method of the means in a non-selection mode.

To be more precise, the operation in the embodiment above will be described in a case where the memory cell is not accessed, that is, where the memory cell is in the non-selection mode.

During the non-selection mode, the potential applied to the writing gate voltage is $V_{cc}$, for example. The voltages applied to the semiconductor region 202A of the first conductivity type and the semiconductor region 202B of the second conductivity type of the fourth layer are both set to the "H" level. The potentials applied to the semiconductor regions 202A of the first conductivity type of the third and the second layers are set to the "L" level and the voltages applied to the semiconductor regions 202B of the second conductivity type of the third and the second layers are set to the "H" level.

Further, the voltages applied to the semiconductor region 202A of the first conductivity type and the semiconductor region 202B of the second conductivity type of the first thin film semiconductor layer are both set to the "L" level.

As a result, the channel regions 206 of the fourth and the first layers both become non-active, and therefore, the potential at the gate for writing is completely separated from the memory cell and the MOSFET which serves as an element for reading stays turned off.

Figure 31:
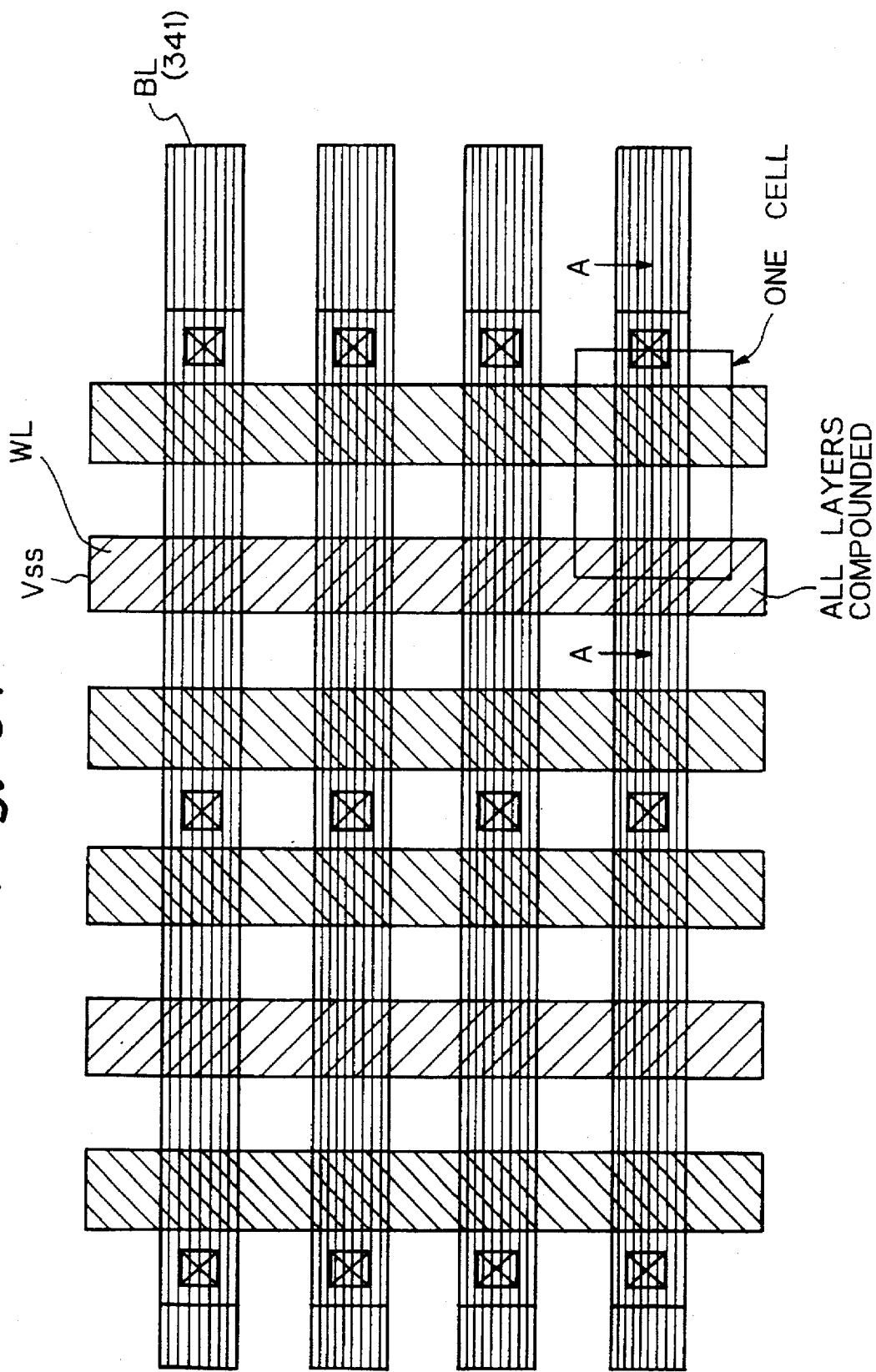
FIG. 31 is a plan view showing a construction for realizing the memory operation of the third aspect memory cell construction shown in FIGS. 29(A) to 29(C)

FIG. 31 is a plan view showing a construction of the memory cell of the first embodiment of the fifth aspect of the present invention. The memory cell, which bit lines fluctuating at an amplitude of ½ $V_{cc}$, is shown as it is viewed from above.

Wirings each functioning as both the gate 341 for writing and a bit line BL and word lines WL, are arranged at appropriate intervals.

Figure 32:
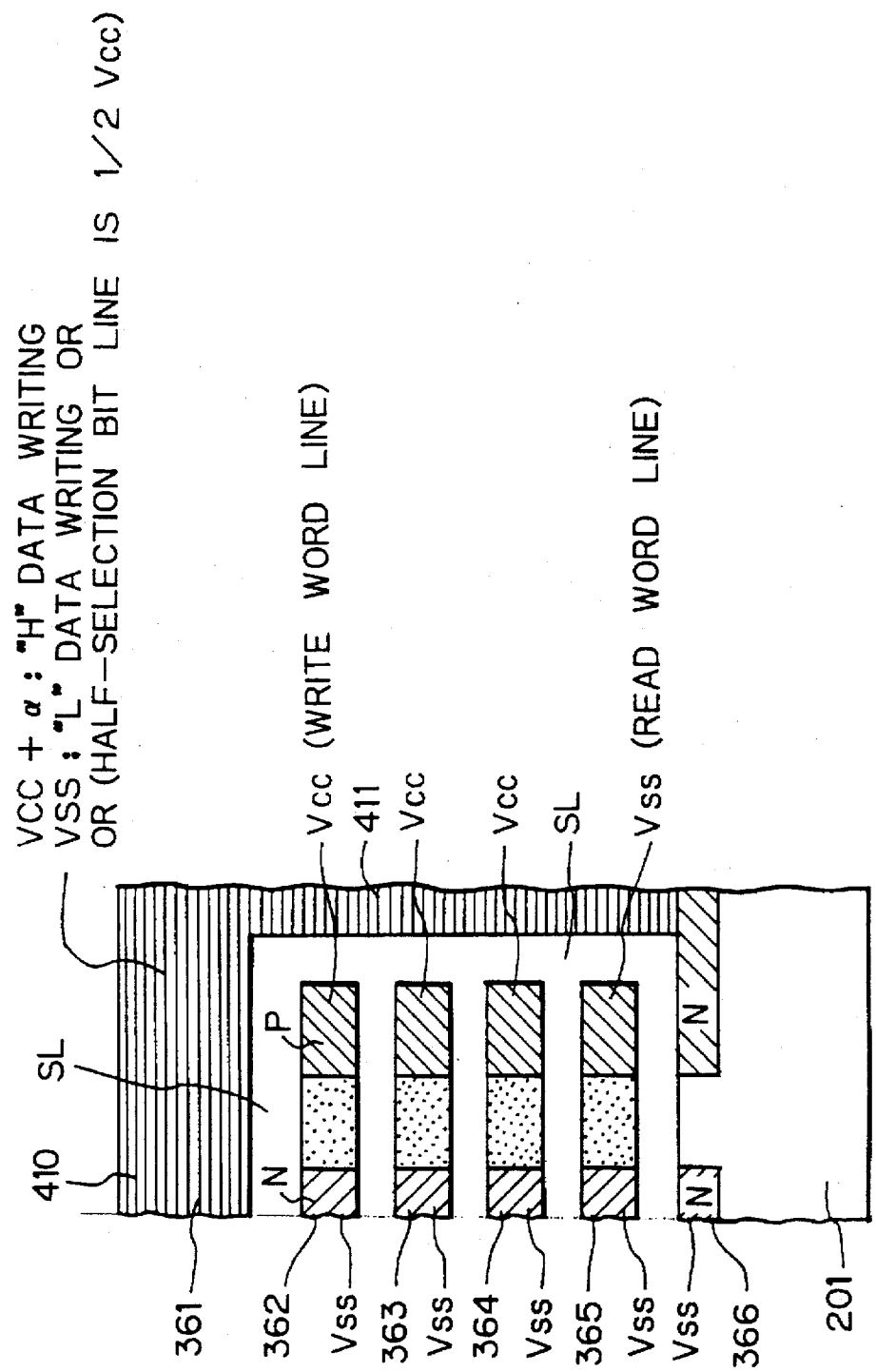
FIG. 32 is a cross-sectional view showing the construction for realizing the memory operation of the third aspect memory cell construction shown in FIGS. 29(A) to 29(C)

FIG. 32 is a cross-sectional view showing an A—A section of one cell of FIG. 31 as viewed from one side. Above the MOSFET 366 which is formed in the substrate 201, the four thin film semiconductor layers 365 to 362 are laminated one atop the other with predetermined spacings therebetween. The second conductivity portion of the first layer 365 may form a word line for reading RWL and the second conductivity portion of the fourth layer 362 may form a word line for writing WWL.

The bit lines BL each have a surface 410 which is parallel to the major surface of the substrate 201 and a connection portion 411 elongated in a perpendicular direction to the substrate 201.

The MOSFET 366 of this embodiment may be realized by forming a heavily doped n-type region (SD region) within a p-type well or the p-type substrate 201 a potential of which is set at $V_{ss}$ and by setting a potential at the heavily doped n-type region at $V_{ss}$.

Indicated as SL in the drawing is a layer formed by an insulator (dielectric material) made of $SiO_2$ or the like which surrounds the thin film semiconductor layers 362 to 365 and which is disposed between the respective thin film semiconductor layers and between said MOSFET 366 and the thin film semiconductor layer 365.

In the memory cell of the present invention, during writing, the potential at the word line for writing which is connected to the fourth layer is set to $V_{cc}$ and the word line for reading which is connected to the first layer is set to $V_{ss}$.

In such a construction, during the reading operation, the word line for writing of the fourth layer is set to $V_{ss}$ while the word line for reading of the first layer is set to $V_{cc}$.

Figure 33:
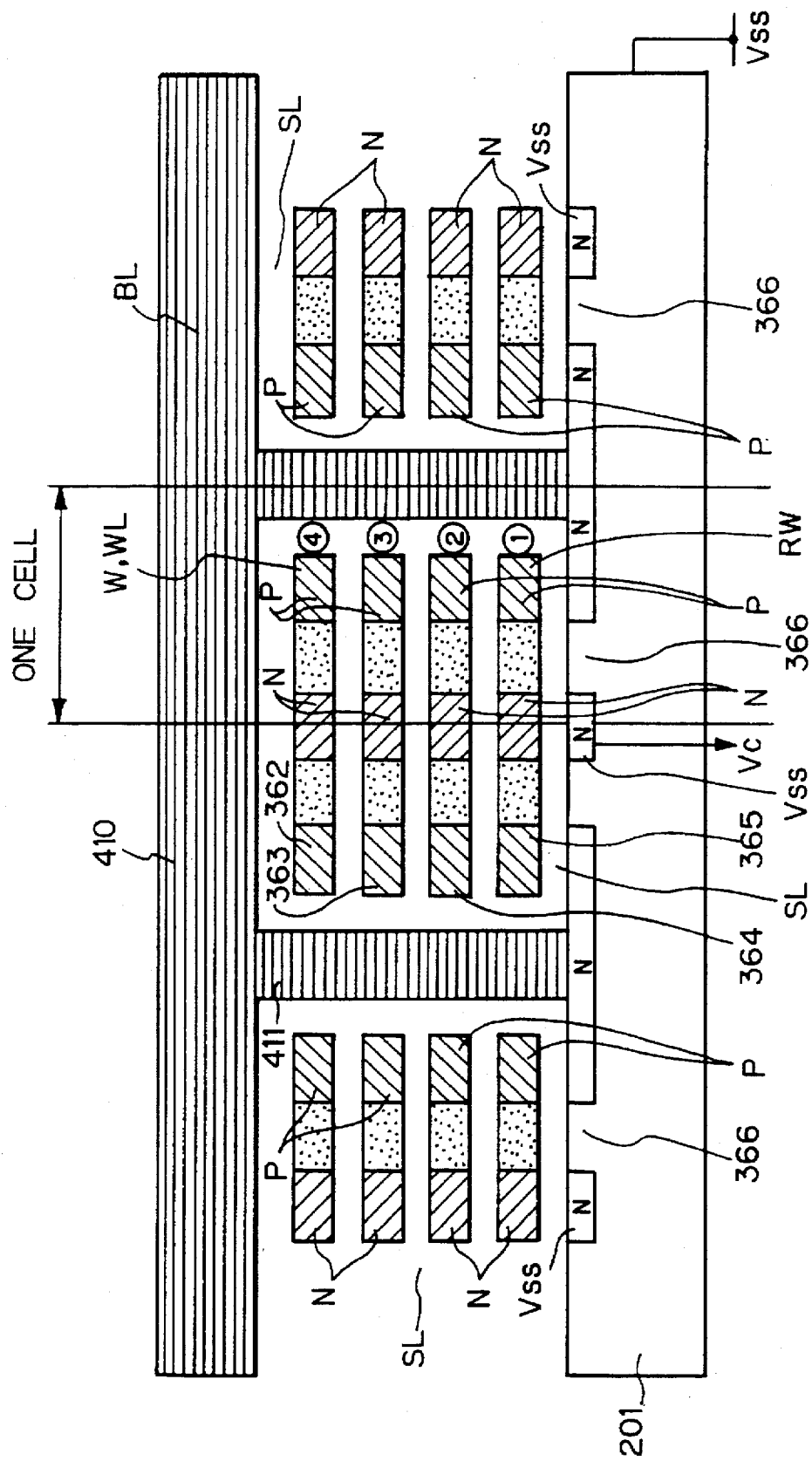
FIG. 33 is a cross-sectional view showing an overall construction for realizing the memory operation of the third aspect memory cell construction shown in FIGS. 29(A) to 29(C)

FIG. 33 is a side view showing the memory cell, which constitutes the semiconductor memory device of the embodiment, mounted on the substrate 201 to form a memory cell array. The structure shown therein is identical to that shown in FIG. 32.

Similar to the construction shown in FIG. 32, the MOSFET 366 of this embodiment may be realized by forming a heavily doped n-type region (SD region) within a p-type well or the p-type substrate 201 a potential of which is set at $V_{ss}$ and setting a potential at the heavily doped n-type region to $V_{ss}$.

Indicated as SL in the drawing is a layer formed by an insulator (dielectric material) made of $SiO_2$ or the like which surrounds the thin film semiconductor layers 362 to 365 and which is disposed between the respective thin film semiconductor layers and between said MOSFET 366 and the thin film semiconductor layer 365.

According to another embodiment, as compared with the aforementioned memory cell, the potential at the channel region of the buffer layer can be set to a predetermined level more accurately, and therefore, the functions and capabilities as a memory cell are dramatically enhanced. However, since it is necessary to form wirings both in a column-direction and in a row-direction for each thin film semiconductor layer, thereby creating a need for a complex control circuit system, it can not be denied that the memory cell is not suitable in some regard for composition of a memory cell array.

Figure 34:
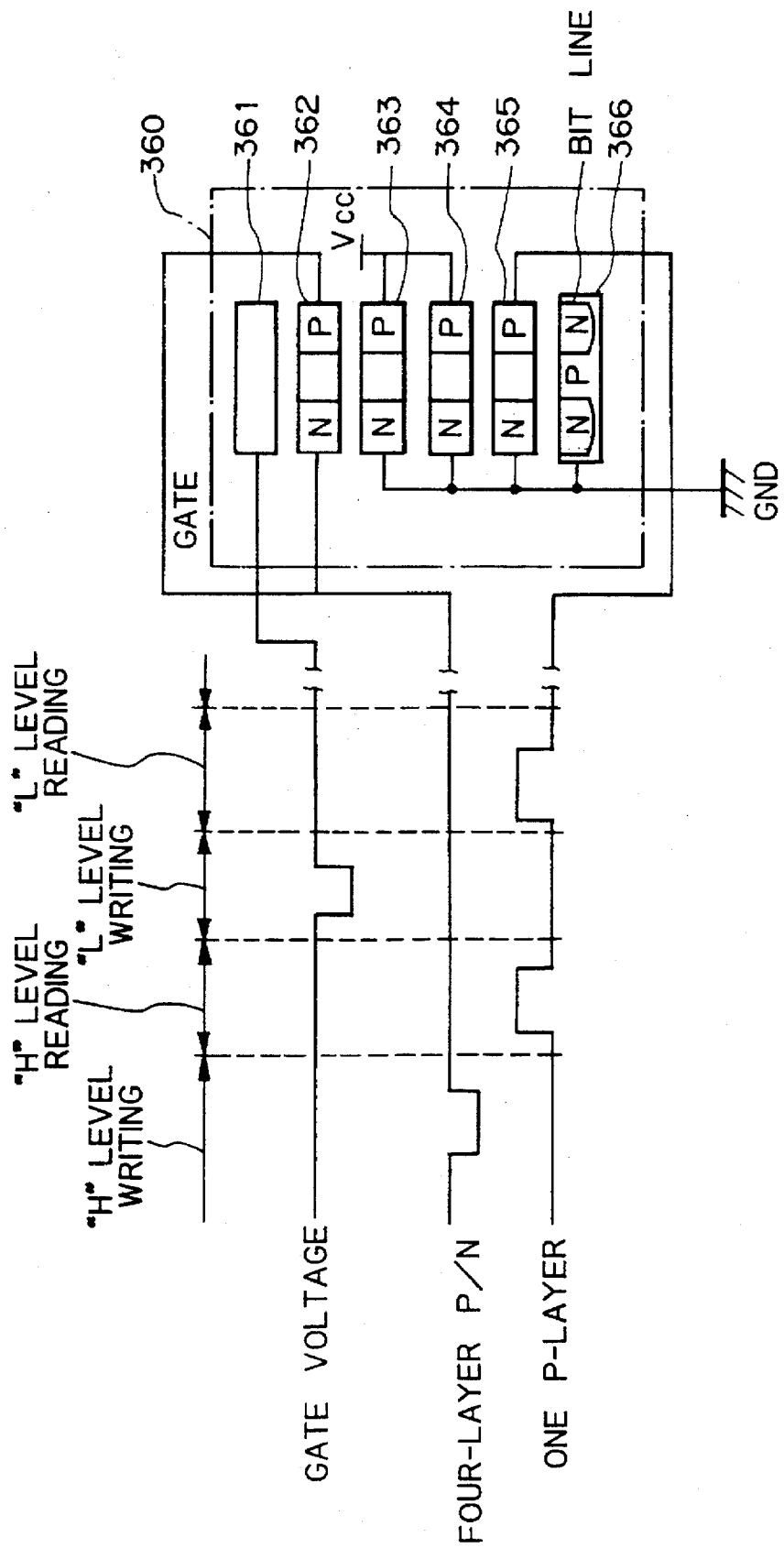
FIG. 34 is a timing chart explaining a method of supplying a voltage to the memory cell shown in FIGS. 29(A) to 29(C)

FIG. 34 is a timing chart showing a selection control means for use with the memory cell above of the second embodiment of the fifth aspect in accordance with the present invention. The selection control means is designed so as to be capable of providing predetermined voltages individually and selectively to the semiconductor regions 202A and 202B of the first and the second conductivity types, respectively, of each thin film semiconductor layer.

More particularly, the wiring construction as shown in FIG. 34 is adopted so that potentials as those shown in FIGS. 30(A) to 30(F) are applied to each one of the gate 361 for writing, the element 366 for reading and the four thin film semiconductor layers 362 to 365 of the memory cell 360 above by use of voltage waveforms which are shown in a left portion of FIG. 34 and which are similar to those shown in FIGS. 30(I), 30(J) and 30(K).

It is to be noted that similarly to the embodiments described above, the transistor 366 of this embodiment may be realized by forming a heavily doped n-type region (SD region) within a p-type well or the p-type substrate 201 a potential of which is set at $V_{ss}$ and setting a potential at the heavily doped n-type region to $V_{ss}$.

Further, although not shown in the drawing, the thin film semiconductor layers 362 to 365 are covered with a layer SL which is formed by an insulator (dielectric material) which is made of $SiO_2$ or the like, and separated from each other by the layer SL.

Figure 35:
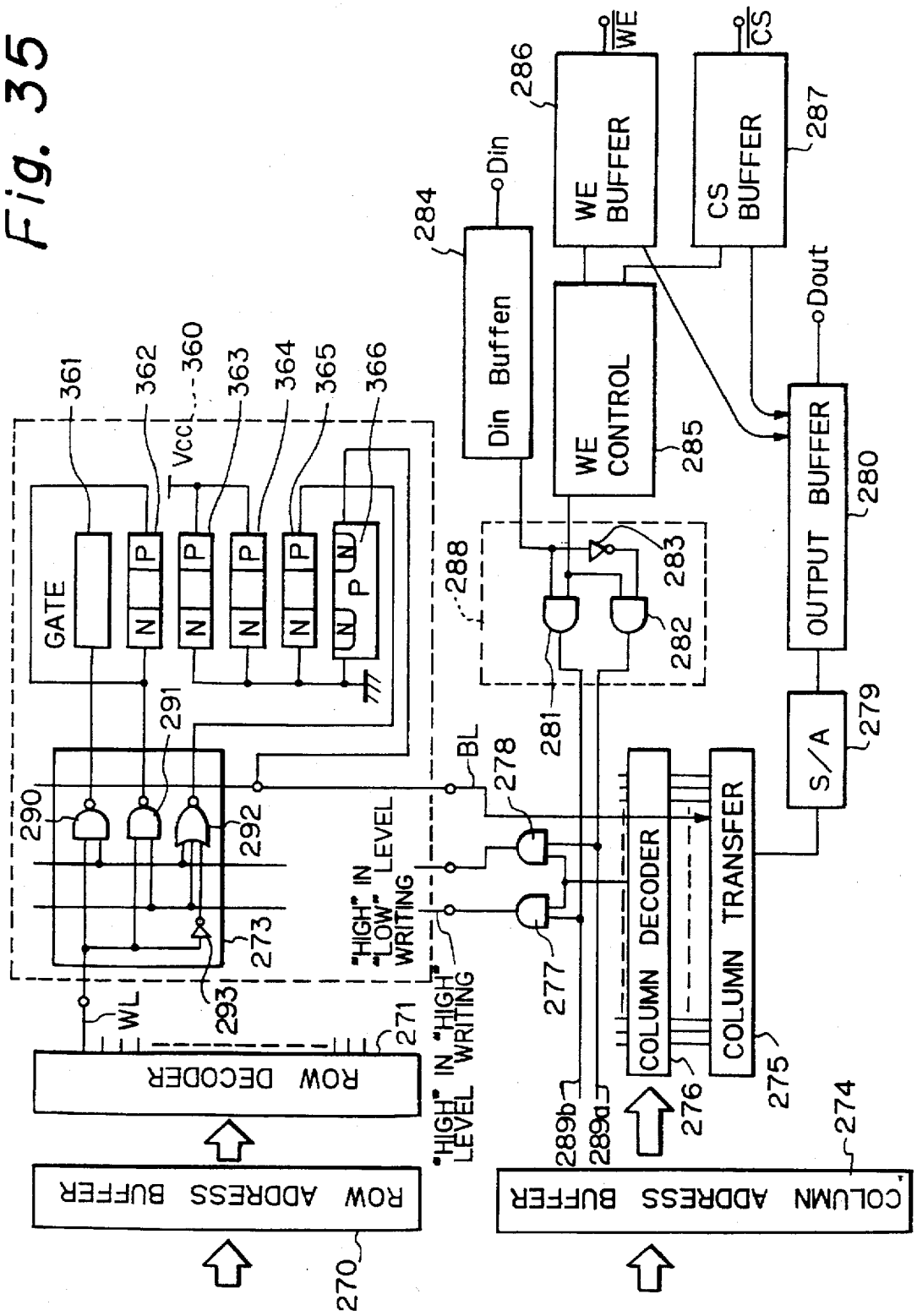
FIG. 35 is a block diagram showing the overall system construction of a semiconductor memory device which employs the memory cell shown in FIGS. 29(A) to 29(C)

FIG. 35 is a block diagram showing a circuit construction of where a memory cell array is formed using the semiconductor memory device 360 of the second embodiment described above.

More precisely, a number of the memory cells 360 each having a construction such as that shown in FIG. 34 are arranged at intersections of a plurality of word lines WL and a plurality of bit lines BL. For convenience of illustration, FIG. 35 shows only one memory cell 360.

In this embodiment, a row decoder 271 selects one of the word lines WL forming the memory cell array in response to an input to a row address buffer 270 while a column decoder 276 selects a desired bit line BL in response to an input to a column address buffer 274.

As a result, the memory 360 of a predetermined selected address is selected.

The memory cell 360 receives information directly at its gate 361 for writing from the selected word line WLW through a proper selection control means 273.

The selection control means 273 in accordance with the present invention is comprised of, for example, two NAND gate circuits 290 and 291 and a NOR gate circuit 292 having three input terminals and one invertor 293. On one bit line side BL, the bit line BL selected by the column decoder is connected to one end of the MOSFET 366 forming an element for reading.

In addition, a selection circuit 288 is disposed which is formed by two AND gate circuits 281 and 282 and one invertor 283 and which receives an output from a write enable signal control circuit 285, to which outputs from a write enable signal input buffer means 286 (WE buffer) and a control signal buffer (CS buffer) 287 are inputted, and an output from an input data buffer (Din buffer) circuit 284.

In response to an output from the selection circuit 288, one of column lines 289b and 289a is selected. The selection result is then delivered to terminals of the respective NAND gate circuits 290 and 291 and the AND gate circuit 292 having the three input terminals of the selection control means 273.

Of the "H" data WRITE signal 289b and the "L" data WRITE signal 289a, one is to drive an AND gate circuit 277 which selectively outputs an "H" level signal during writing of the "H" level, and the other is to drive an AND gate circuit 278 which selectively outputs an "H" level signal during writing of the "L" level.

When one of the AND gate circuits 277 and 278 is selected, an output from the selected AND gate circuit is coupled to the other input terminals of the NAND gate circuits 290 and 291 of the selection control means 273 and further coupled to two input terminals of the NOR gate circuit 292 which has the three input terminals.

Hence, in accordance with a control mode of FIG. 34, potentials applied to the respective gates and the thin film semiconductor layers which form the memory cell can satisfy the relation which is shown in FIGS. 30(A) to 30(F).

Next, a method of manufacturing the semiconductor memory device of the present invention will be described with reference to FIGS. 36(A) to 36(H).

Figure 36A:
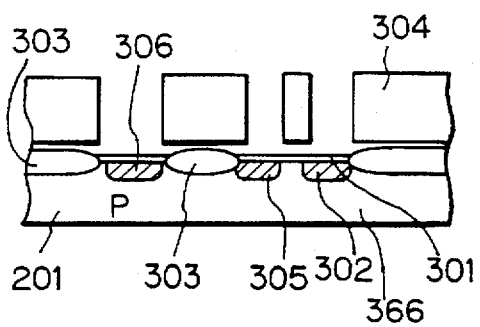
FIGS. 36(A), 36(B), 36(C), 36(D), 36(E), 36(F), 36(G) and 36(H) are views explaining a method of manufacturing the memory cell shown in FIGS. 29(A) to 29(C).

First, as shown in FIG. 36(A), an insulator isolation film 303 is formed into a predetermined pattern in a p-type silicon substrate 201 and a gate oxide film 301 is formed at an opening of the insulator isolation film 303.

Next, on the major surface of the substrate 201, a resist 304 having a predetermined opening is formed. Through the resist 304 as a mask, the p-type substrate 201 is doped with n-type impurities by a known method such as ion implantation, defining an n-type source region 302 and an n-type drain region 305 to thereby form the MOSFET 366. At the same time, a contact region 306 is formed.

This embodiment is merely an example where ion implantation of n-type impurities into the p-type substrate 201 creates the n-type diffusion regions. However, the present invention is not limited to this example. For instance, the MOSFET 366 may be realized by forming a p-type well in an n-type substrate, needless to mention.

Figure 36E:
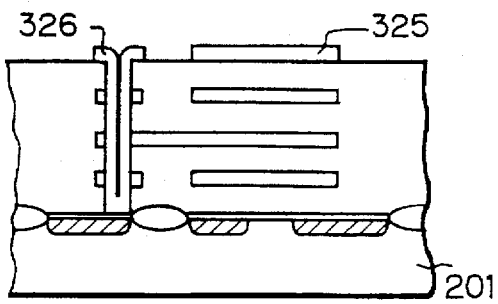
Figure 36B:
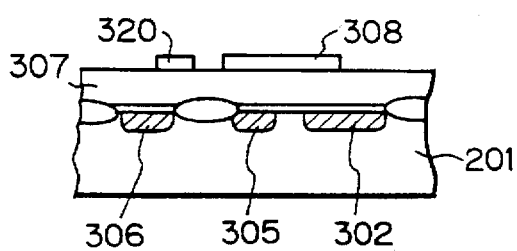

In FIG. 36(B), the aforementioned resist is removed, followed by formation of an inter-layer film 307 on the major surface of the substrate 201, in which the source region 302 and the drain region 305 are formed, from silicon by the CVD method. Non-doped silicon is then patterned into a predetermined configuration on the CVD silicon (SiO$_2$) surface to thereby define the thin film semiconductor layer 308, which forms the first layer, and a contact portion 320.

In the present invention, not only polysilicon (polycrystalline silicon) but also amorphous silicon, recrystallize silicon or the like may be used.

Figure 36F:
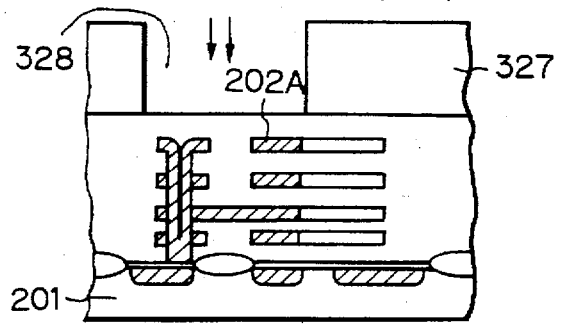
Figure 36C:
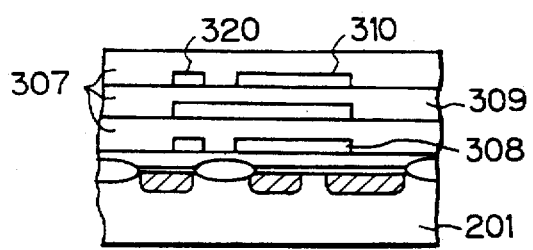

In FIG. 36(C), the step of forming the inter-layer film 307 and the step of patterning the non-doped polysilicon into a predetermined configuration for formation of the thin film semiconductor layer 308 and the contact portion 320 are repeated, during the course of which the first to the third thin film semiconductor layers 308, 309 and 310 are formed in a stacked structure. This makes it possible to fabricate a memory cell which exhibits excellent capabilities of storing and reading information.

Figure 36G:
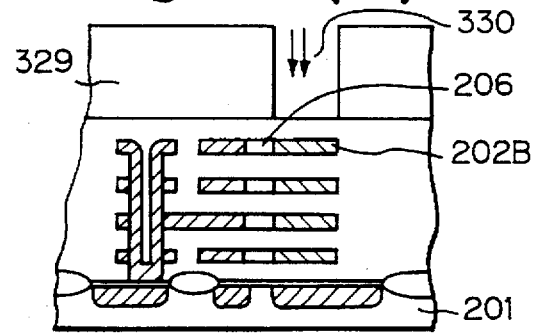
Figure 36D:
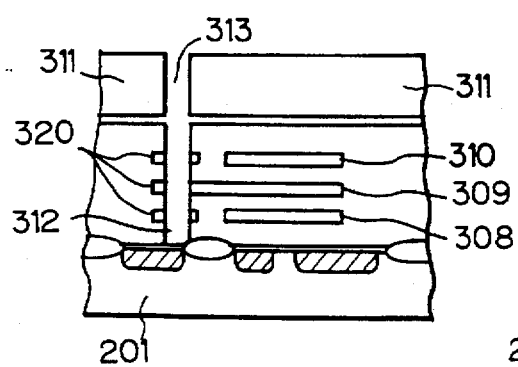

In FIG. 36(D), a resist 311 is formed on a surface of the substrate, concurrently with which an opening 313 is formed in a portion of the resist 311 in a faced relation to the contact portion 320 by a proper means in order to form a hole 312 which penetrates the contact portion.

In FIG. 36(E), non-doped polysilicon is patterned into a predetermined configuration to define the thin film semiconductor layer 325 which forms the fourth layer. At the same time, a conductive layer 326 made of a proper conductive material is formed through the through hole 312 at least on an inner wall of the through hole by the CVD or other proper method.

This establishes a side wall contact, which connects the polysilicon of the first to the fourth layers and the diffusion regions which are formed on the substrate.

The inside of the through hole 312 may be completely filled with the conductive material.

In FIG. 36(F), a resist 327 is grown on the surface of the semiconductor device of FIG. 36(E). The resist portion 327 is partially removed where it corresponds to portions of the thin film semiconductor layers and the contact portion, thereby forming an opening 328.

Next, by doping with n-type impurities through the opening 328, the semiconductor regions 202A of the n-type conductivity are formed in the portions of the thin film semiconductor layers and the contact portion.

In FIG. 36(G), a resist 329 is grown on the surface of the semiconductor device of FIG. 36(E). The resist 329 is then partially removed where it faces portions of the thin film semiconductor layers which are not doped n-type at the step of FIG. 36(F), forming an opening 330.

For formation of the channel regions 206, the opening 330 must be located in the resist at a position which corresponds to the thin film semiconductor layers which are spaced apart from each other.

Following this, by doping with p-type impurities through the opening 330, the semiconductor regions 202B of the p-type conductivity are formed in remaining portions of the thin film semiconductor layers in such a manner that the semiconductor regions 202B of the p-type conductivity are each spaced apart from the semiconductor regions 202A of the n-type conductivity by the channel regions 206.

Figure 36H:
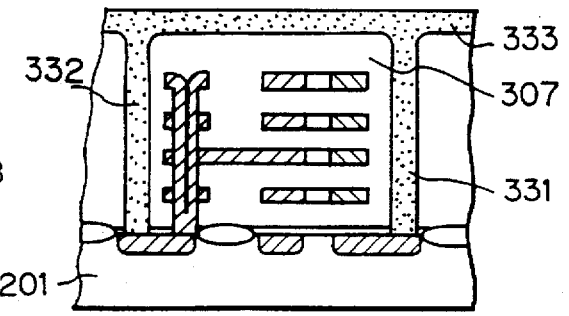

Finally, as shown in FIG. 36(H), an insulator layer 317 made of CVD silicon ($SiO_2$) mentioned above or the like is deposited and subjected to activation annealing. Then, other contact holes 331 and 332 are etched or otherwise suitably formed in the insulator layer so that one memory cell 360 and the contact portion 326 are contained in the insulator layer. Next, the inside of the contact holes 331 and 332 are filled with a conductive material such as aluminum Al while a wiring 333 made of a conductive material such as aluminum Al patterned into a preselected shape is formed on a surface of the insulator layer 307.

Needless to mention, in the respective embodiments above and the respective drawings, as shown in some drawings, a proper insulator layer (SL), for instance, $SiO_2$ is disposed around the lamination of the thin film semiconductor layers or between the thin film semiconductor layers.

In FIGS. 36(A) to 36(H), the portions hatched with right-upward lines are the n-type doped regions while the portions hatched with left-upward lines are the p-type doped regions.

Thus, the semiconductor memory device in accordance with this embodiment is excellent in its low consumption power and accurate writing and storing of information. Hence, a malfunction-free semiconductor memory device is obtained which is reduced in size not at the expense of the device density.

I claim:

1. A semiconductor memory device comprising a memory element comprising:
    a first thin film semiconductor layer having a semiconductor region of a first conductivity type, a semiconductor region of a second conductivity type and a channel region sandwiched between said semiconductor region of the first conductivity type and said semiconductor region of the second conductivity type;
    a second thin film semiconductor layer having a semiconductor region of the first conductivity type, a semiconductor region of the second conductivity type and a channel region sandwiched between said semiconductor region of the first conductivity type and said semiconductor region of the second conductivity type;
    said first and second layers are laminated one atop the other in such a manner that said semiconductor regions having the first conductivity type of said two thin film semiconductor layers are opposed each other and said semiconductor regions having the second conductivity type of said two thin film semiconductor layers are opposed each other;
    a gate for writing which is disposed in a facing relation with said channel region of one of said first and second thin film semiconductor layers; and
    a third thin film semiconductor layer which is disposed between said one of said first and second thin film semiconductor layers and said gate for writing, said third thin film semiconductor layer including a semiconductor region of the first conductivity type and a semiconductor region of the second conductivity type with a channel region sandwiched therebetween.

2. The device according to claim 1, wherein said first thin film semiconductor layer and said second thin film semiconductor layer form a holding layer for holding a charge and said third thin film semiconductor layer forms a buffer layer between said gate for writing and said holding layer.

3. The device according to claim 1, wherein said semiconductor region of the first conductivity type and said semiconductor region of the second conductivity type of said third thin film semiconductor layer are located respectively in a faced relation to said semiconductor region of the first conductivity type and said semiconductor region of said first or said second thin film semiconductor layer forming said holding layer.

4. A semiconductor memory device comprising a memory element comprising:
    a first thin film semiconductor layer having a semiconductor region of a first conductivity type, a semiconductor region of a second conductivity type and a channel region sandwiched between said semiconductor region of the first conductivity type and said semiconductor region of the second conductivity type;
    a second thin film semiconductor layer having a semiconductor region of the first conductivity type, a semiconductor region of the second conductivity type and a channel region sandwiched between said semiconductor region of the first conductivity type and said semiconductor region of the second conductivity type;
    said first and second layers are laminated one atop the other;
    an element for reading which is located in a facing relation to said channel region of one of said first and said second thin film semiconductor layers; and
    a third thin film semiconductor layer which is disposed between said one of said first and second thin film semiconductor layers and said element for reading, said third thin film semiconductor layer including a semiconductor region of the first conductivity type and a semiconductor region of the second conductivity type with a channel region sandwiched therebetween.

5. The device according to claim 4, wherein said first thin film semiconductor layer and said second thin film semiconductor layer form a holding layer for holding a charge and said third thin film semiconductor layer forms a buffer layer between an element for reading and said holding layer.

6. The device according to claim 4, wherein said semiconductor region of the first conductivity type and said semiconductor region of the second conductivity type of said third thin film semiconductor layer are located respectively in a faced relation to said semiconductor region of the first conductivity type and said semiconductor region of said first or said second thin film semiconductor layer forming said holding layer.

7. A semiconductor memory device comprising a memory element comprising:
    a first thin film semiconductor layer having a semiconductor region of a first conductivity type, a semiconductor region of a second conductivity type and a channel region sandwiched between said semiconductor region of the first conductivity type and said semiconductor region of the second conductivity type;
    a second thin film semiconductor layer having a semiconductor region of the first conductivity type, a semiconductor region of the second conductivity type and a channel region sandwiched between said semiconductor region of the first conductivity type and said semiconductor region of the second conductivity type;
    said first and second layers are laminated one atop the other;
    a gate for writing which is located in a facing relation to said channel region of one of said thin film semiconductor layers;
    an element for reading which is located in a faced relation to said channel region of the other one of said thin film semiconductor layers;

a third thin film semiconductor layer between said one of said first and second thin film semiconductor layers and said gate for writing, said third thin film semiconductor layer including a semiconductor region of the first conductivity type and a semiconductor region of the second conductivity type a channel region sandwiched therebetween; and a fourth thin film semiconductor layer which is disposed between the other one of said first and second thin film semiconductor layers and said element for reading, said fourth thin film semiconductor layer including a semiconductor region of the first conductivity type and a semiconductor region of the second conductivity type with a channel region sandwiched therebetween.

8. A semiconductor memory device, comprising:

at least four thin film semiconductor layers, each including a semiconductor region of a first conductivity type and a semiconductor region of the second conductivity type with a channel region sandwiched therebetween, said layers are laminated one atop the other into a lamination with insulator layers interposed therebetween with said semiconductor regions of the same conductivity type facing each other;

a gate for writing disposed in an opposing relation to said channel region of one of said thin film semiconductor layers which forms a first end of said lamination with an insulator layer interposed between said gate for writing and said thin film semiconductor layer forming the first end of said lamination; and an element for reading disposed in an opposing relation to said channel region of one of said thin film semiconductor layers which forms a second end of said lamination with an insulator layer interposed between said element for reading and said thin film semiconductor layer forming the second end of said lamination.

9. The device according to claim 8, further comprising insulator films between said layers and a gate insulator film between said thin film semiconductor layer of the first end and said gate for writing with said gate insulator film being thicker than said insulator films between said respective thin film semiconductor layers.

10. The device according to claim 8, further comprising:

wirings supplying predetermined potentials and connected to said semiconductor regions of the first conductivity type and said semiconductor regions of the second conductivity type constituting said thin film semiconductor layers; and control means for supplying a selected voltage to each one of said semiconductor regions of the first and the second conductivity types which form said thin film semiconductor layers individually, said control means being connected to said wirings, and wherein said element for reading is formed by a field effect transistor (FET) formed within a substrate.

* * * * *